(12) United States Patent
Kamoshida et al.

(10) Patent No.: US 6,393,080 B1
(45) Date of Patent: May 21, 2002

(54) APPARATUS COMPRISING CLOCK CONTROL CIRCUIT AND DEVICE USING INTERNAL CLOCK SIGNAL SYNCHRONIZED TO EXTERNAL CLOCK SIGNAL

(75) Inventors: Masahiro Kamoshida; Haruki Toda, both of Yokohama; Tsuneaki Fuse, Tokyo; Yukihito Oowaki, Yokohama, all of (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/271,329

(22) Filed: Mar. 18, 1999

(30) Foreign Application Priority Data

Mar. 18, 1998 (JP) .......................................... 10-069059

(51) Int. Cl.[7] .................................................. H04L 7/00
(52) U.S. Cl. ......................... 375/354; 365/194; 365/233
(58) Field of Search ................................ 375/354, 377; 365/194, 189.04, 233; 327/276, 292, 176, 270, 278, 286, 290, 293, 297, 141, 161, 172, 261, 263, 269, 277, 284, 291; 713/500, 401

(56) References Cited

U.S. PATENT DOCUMENTS 5,422,835 A * 6/1995 Houle et al.
5,610,548 A * 3/1997 Masleid ...................... 327/374

* cited by examiner

*Primary Examiner*—Jean Corrielus
(74) *Attorney, Agent, or Firm*—Foley & Lardner

(57) ABSTRACT

A state-holding circuit initializing circuit initializes state-holding circuit when propagation of forward pulse to the forward-pulse delay circuits in the last stage is detected. With this operation, synchronization is established in a short time from the resumption of outputting from a receiver. The state-holding circuit control circuit also controls the reset timing of the state-holding circuit. A forward-pulse adjusting circuit controls the pulse width of forward pulse to be supplied to the forward-pulse delay line. With this operation, the stages from the stage where rearward pulse was generated to the first stage are securely turned to the set state, enabling propagation of rearward pulse and synchronization is established. Thus, synchronization is established reliably even when output from a receiver stops or the duty of an external clock signal is heavy.

24 Claims, 34 Drawing Sheets

Tf - Tb : TIME WHEN PROPAGATION OF REARWARD-PULSE IS STOPPED
Tf > Tb → NOT SYNCHRONIZED

INCLEASE IN PULSE WIDTH

INCLEASE IN
PULSE WIDTH

APPARATUS COMPRISING CLOCK CONTROL CIRCUIT AND DEVICE USING INTERNAL CLOCK SIGNAL SYNCHRONIZED TO EXTERNAL CLOCK SIGNAL

BACKGROUND OF THE INVENTION

1. Field of the Invention

The present invention relates to an apparatus comprising a clock control circuit which is suitable for synchronous control using high speed clock signals and a device using an internal clock signal synchronized to an external clock signal.

2. Related Art Statement

Recently, a computer system sometimes adopts a clock synchronous type memory, such as a synchronous DRAM, in order to fulfill the requirements for faster processing. A synchronous type memory is designed to use a clock, which is synchronized to a clock signal controlling a memory circuit, also within the memory.

When a delay occurs between a clock signal used within the memory (hereinafter referred to as an internal clock signal) and an external clock signal, such as a clock signal to control the memory circuit, and particularly when the operating speed is high, malfunction is apt to occur in a circuit even when the delay time is small.

Accordingly, a clock control circuit is provided in a semiconductor integrated circuit to synchronize an internal clock signal to an external clock signal.

FIG. 1 is a circuit diagram showing a related art on such a clock control circuit. FIG. 2 is a waveform diagram illustrating the theory. The circuit in FIG. 1 adopts an STBD (Synchronous Traced Backwards Delay) as a clock control circuit.

In FIG. 1, an external clock signal CK, shown in FIG. 2, is inputted to an input terminal 1. The period of the external clock signal CK is supposed to be $\tau$. This external clock signal CK is taken in through a receiver 2. The receiver 2 outputs an amplified clock signal CLK after waveform shaping of the external clock signal. When a delay time at the receiver 2 is D1, the clock signal CLK outputted from the receiver 2 becomes as shown in FIG. 2. A clock control circuit 20 is designed to generate a signal delayed by two periods of the external clock signal thereto.

In order to delay the clock signal CLK by $(2\tau-D1)$, the clock control circuit 20, first, generates a pulse FCL, which rises after the time A from the rising timing of the clock signal CLK outputted from the receiver 2 as shown in FIG. 2. The time from the rising of this pulse FCL to the next rising of the clock signal CLK is, as shown in FIG. 2, the time $\Delta (=\tau-A)$. The clock control circuit 20 measures a time $(\tau-A)$, and generates a next pulse RCL after the time $2(\tau-A)$ from the rising of the pulse FCL (see the pulse RCL in FIG. 2).

As shown in FIG. 2, the time from the rising of the pulse RCL to the rising of the next clock signal CLK is $\tau-\Delta=\tau-(\tau-A)=A$. Now, the time from the rising of the pulse RCL to the rising of the external dock signal CK to be inputted next is supposed to be D2. When D2 is a time as shown in FIG. 2, an internal clock CK' (FIG. 2) is generated synchronizing to the external clock CK by being delayed by 2 periods to it.

As shown in FIG. 2, D2 is satisfactory so long as it is a value between D1 and A and has arelation of $(D2+D1)=A$. That is, when the time D2 is a delay time in an outputting stage, it means that an internal clock signal synchronized to the external clock signal can be generated by providing a delay circuit, which operates with the delay time A, the sum of the delay time D1 due to the receiver 2 and the delay time D2 in the outputting stage, and providing another delay circuit having a delay time of the time $2(\tau-A)$.

Next, the operation of a circuit according to a related art will be described with reference to a block diagram shown in FIG. 1, waveform diagrams in FIGS. 3 and 4, and explanatory views shown in FIGS. 5 to 8. Particularly, the operation characteristics of an STBD to store the propagation condition of forward pulse and to control the propagation of rearward pulse corresponding to the stored data is described in detail.

The external clock signal CK having a period $\tau$ as shown in FIG. 3 is inputted to a receiver 2 via an input terminal 1, and CLK shown in FIG. 3 is outputted from the receiver 2. When a delay of the receiver 2 is D1, CLK is delayed by D1 to CK. When no clock control circuit is used, this delay D1 becomes, as it is, skew of the external clock signal and the internal clock signal. The more the external clock signal becomes high frequency and $\tau$ becomes smaller, the more the effect of this skew becomes great. The output signal CLK of the receiver 2 is inputted to an inverter 10, a control pulse generating circuit 9 and a delay monitor 3. At the control pulse generating circuit 9, the control pulse P as shown in FIG. 3 is generated. In a clock control circuit using an STBD, it is required to initialize all forward-pulse delay circuits before forward pulse is inputted to the first delay unit. By reason of this, a control pulse having a width narrower than the delay time A of a delay monitor 3 is generated, and control is carried out using this control pulse. The output signal FCL of the delay monitor 3 is delayed by A to CLK and inputted to a first forward-pulse delay circuit 5-1 of a forward-pulse delay line 5.

The N-th forward-pulse delay circuit forming a forward-pulse delay line outputs a logical value, which is similar to the output of the (N−1)th forward-pulse delay circuit, to the (N+1)th forward-pulse delay circuit when the control pulse P is "L" and outputs "L" to initialize a forward-pulse delay line 5 when P is "H".

Output signals of forward-pulse delay circuits are also inputted to state-holding circuits. One of output signals of rearward-pulse delay circuits is also inputted to state-holding circuits. State-holding circuits have two states to take corresponding to signals inputted. The state-holding circuit takes the set state when P is "L" and forward pulse is propagated by the corresponding forward-pulse delay circuit. When P is "H" and rearward pulse is propagated by the corresponding rearward-pulse delay circuit, the state-holding circuit takes the reset state.

An output signal of the state-holding circuit is inputted to a rearward-pulse delay circuit. When the state-holding circuit to which the rearward-pulse delay circuit is connected is in the set state, the N-th rearward-pulse delay circuit inputs a logical value, which is similar to the output of the (N+1)th rearward-pulse delay circuit, to the (N−1)th rearward-pulse delay circuit. When the state-holding circuit connected to the rearward-pulse delay circuit is in the reset state, it outputs a logical value similar to the output of the receiver.

Next, the operation from the input of the forward pulse FCL to a forward-pulse delay line to the output of the output signal RCL from a rearward-pulse delay line is described in detail with reference to FIGS. 4 and 5 to 8. Each of FIGS. 5 to 8 shows the state of t0 to t3 in FIG. 4. Suppose that the delay time of a delay circuit is $\Delta du$, clock period is $10\Delta du$, the pulse width is 5Δdu, the width A' of the control pulse P is 2Δdu, the delay time A of the delay monitor is 3Δdu. The set state is expressed with S and the reset state is expressed with R. The numerals marked on delay lines express the output of a delay circuit; "1" (="H") and "0" (="L") (Δdu expresses a delay time per stage of delay circuits).

Now, suppose that, in the initial state at time t0, all state-holding circuits are in the reset state R. At this time, as an external clock signal has not been inputted, the output state of all forward-pulse delay circuits and rearward-pulse delay circuits is at "L"(FIG. 5).

When the forward pulse FCL is inputted to forward-pulse delay circuits, the forward pulse is then propagated by the forward-pulse delay line until the control pulse becomes "H". As shown in FIG. 6, at time t1, when the forward pulse F1 has been propagated up to the 7th stage and the propagation is stopped due to P'S becoming "H" and then, the state-holding circuits in the first stage up to the 7th stage turn to the set state S, and the state-holding circuits in the 8th stage up to the last stage remain in the reset state R. At this time, CLK (="H") is inputted to the rearward-pulse delay circuit in the 7th stage to the last state, and the rising of rearward pulse is formed. On the other hand, as P is "H" the output of forward-pulse delay circuits becomes "L" and then the forward pulse F1 disappears after that.

At time t2, as P remains at "H" the rising of rearward pulse R1 is propagated to the preceding stage, changing state-holding circuits to the double-stage (=A'/Δdu) reset state R (FIG. 7). This is for the purpose of generating rearward pulse from the stage where forward pulse is stopped even when forward pulse is not propagated up to the 7th stage because the period τ is shortened due to jitter.

Finally, when the input signal CLK for rearward-pulse delay lines becomes "L" at time t3, in the stages of state-holding circuits in the reset state, namely, in and after the 6th stage, the output of rearward-pulse delay circuits changes to "L" and the falling of rearward pulse is formed (FIG. 8).

Attention is required to a fact that the pulse width of rearward pulse becomes narrow by the number of stages of state-holding circuits which have been reset as an anti-jitter measure. After this, by repeating the operation in FIGS. 5 to 8, a signal RCL being delayed by τ−A=7Δdu from the rising of the output signal CLK of a receiver can be outputted.

The output signal RCL of rearward-pulse delay lines is inputted to an output buffer 8 and outputted, as an internal clock signal CK' after being delayed by D2 to the rearward pulse RCL.

The delay time Δ total of the internal clock signal CK' to the external clock signal CK is:

$$\Delta total = D1 + A + 2(\tau - A) + D2$$

When the delay time of the receiver 2 and the output buffer 8 is known and A=D1+D2, the following equation holds good:

$$\Delta total = D1 + A + 2(\tau - A) + D2 = D1 + (D1 + D2) + 2(\tau - (D1 + D2)) + D2 = 2(D1 + D2) + 2\tau - 2(D1 + D2) = 2\tau$$

As Δ total becomes 2τ, consequently, the external clock signal and the internal clock signal are synchronized.

However, in the example of a related art in FIG. 1, two problems arise: one problem is that, when forward pulse is propagated to the last stage of the forward-pulse delay line 5, a time when an internal clock signal is not generated satisfactorily lasts long; and the other is that it becomes impossible to synchronize the external clock signal to the internal clock signal when the duty cycle of the external clock signal is large.

FIGS. 9A and 9B are explanatory views illustrating problems which arise when forward pulse is propagated up to the last stage. FIG. 9A shows a state where the operation to generate clock signals is broken off, and FIG. 9B shows a state where the operation to generate clock signals is resumed.

Application of an STBD to a synchronous DRAM is considered. In this case, an internal clock signal is a clock signal used in a memory circuit, and an external clock signal is a clock signal to control the memory circuit. In such a synchronous DRAM, when a fast external clock signal is always taken in, the electric power consumption extremely increases. To cope with this, a mode not to take in an external clock signal when necessary (hereinafter referred to as power save mode) is sometimes adopted by suspending the generation of external clock signal temporarily or turning off the receiver 2.

As a result of adoption of such a power save mode, the output of the receiver 2 may be broken off in the middle while the forward pulse FCL is being propagated by the forward-pulse delay line 5. In an STBD, as described above, the forward pulse FCL, which was inputted to the forward-pulse delay line 5 immediately before the power save mode's being turned on, keeps being propagated by the forward-pulse delay line 5 until the control pulse P becomes "H".

However, when supply of clock signals to synchronous circuits is stopped, as generation of the control signal P to stop propagation of forward pulse ceases. As shown in FIG. 9A, forward pulse corresponding to the clock signal immediately before the supply of clock signal is stopped is propagated up to the last stage of delay line. Thus, all state-holding circuits turn to the set state. Besides, as CLK is inputted to the rearward-pulse delay circuit in the last stage, when the supply of clock signals resumed, as shown in FIG. 9B, rearward pulse is not generated from the 7th stage where the propagation of forward pulse was stopped.

FIG. 10 is an explanatory view illustrating the second problem.

As shown in FIG. 10, the duty cycle of an external clock signal exceeds 50%. FIG. 10 shows a state where a first rearward pulse R1 is propagated by rearward pulse delay lines, the propagation of a second forward pulse F2 is stopped, and the rising of a second rearward pulse R2 is formed.

In this state, similarly to FIG. 6. the control pulse P is "H" and at this time, the state-holding circuits in the first stage up to 5th stage where rearward pulse R1 is propagated are changed to the reset state R as an anti-jitter measure. When rearward pulse R2 is propagated to the 5th stage, as forward pulse F3 has not reached there, state-holding circuits remain in the reset state R, and the propagation of R2 is stopped. That is, when the time Tb required by rearward pulse to reach the 5th stage from its generation is larger than the time Tf required by forward pulse F3 to reach the 5th stage from the generation of rearward pulse, propagation is stopped for the time Tf−Tb.

As this stopped time is added to the time to generate an internal clock signal, synchronization to an external clock signal can not be established.

In FIG. 10, the pulse width d of the rearward pulse R1 is supposed to be the same as the pulse width of CLK. As shown in FIG. 7, the pulse width of rearward pulse is changed by x and y. The problem shown in FIG. 10 also arises when a pulse width is changed in such a manner.

In order to have rearward pulse propagated by the rearward-pulse delay line 7, as state-holding circuits have to be kept in the set state, the forward pulse F2 have to be propagated to the N-th stage before the rearward pulse R1 is propagated to the N-th stage. Namely, as obvious in FIG. 10, the condition for the rearward pulse R1 to be propagated in a preceding stage of the N-th stage is expressed with the following equation:

$$d<(\tau-A)-(d-A)=\tau-d$$

Accordingly, $d<\tau/2$ is the necessary condition.

In this condition, too, the widths of the pulse width of CLK and that of rearward pulse are considered the same.

Thus, in a related art on a clock control circuit described above, a problem that a time when an internal clock signal is not generated lasts long arises when forward pulse is propagated up to the last stage of forward-pulse delay lines. Besides, there is another problem that, when the duty cycle of an external clock signal is large synchronization between the external clock signal and an internal clock signal can not be established.

OBJECTS AND SUMMARY OF THE INVENTION

An object of the present invention is to provide an apparatus comprising a clock control circuit which is able to prevent delays from arising during the generation of a next internal clock signal even when the output of a receiver to take in an external clock signal is temporarily stopped and a device using an internal clock signal synchronized to an external clock signal.

Another object of the pre sent invention is to provide an apparatus comprising a clock control circuit which is able to establish synchronization between an external clock signal and an internal clock signal even when the duty of the external clock signal is heavy and a device using an internal clock signal synchronized to an external clock signal.

A clock control circuit according to the present invention comprises a forward-pulse delay line which is configured by cascading a plurality of stages of forward-pulse delay circuits to propagate inputted signals with a predetermined delay time so as to delay said inputted signals, and delays forward pulse corresponding to a second clock signal obtained by delaying a first clock signal, which is obtained by delaying an external clock signal by a first delay time, by a second delay time corresponding to the difference between the period of said first clock signal and said first delay time, a rearward-pulse delay line which is configured by cascading a plurality of stages of rearward-pulse delay circuits to propagate inputted signals with a predetermined delay time so as to delay said inputted signals, and, by being set to the reset state of a stage corresponding to the stage of the forward-pulse delay line where said forward pulse is propagated after said second delay time from the start of propagation of said forward pulse by said forward-pulse delay line and also by being set to the set state of stages corresponding to the first stage up to the stage of the forward-pulse delay line where said forward pulse is propagated, propagates rearward pulse, which is generated in said stage in the reset state by taking in said first clock signal selectively, by said stages in the set state and outputs said rearward pulse from the first stage, a state-holding device which is configured with a number of stages corresponding to the number of stages of said forward-pulse delay line and rearward-pulse delay line, and, by turning stages corresponding to the stages of the forward-pulse delay line where said forward pulse is propagated during the one polarity pulse duration of said first clock signal to the set state and also by turning a stage corresponding to the stage where said rearward pulse is propagated only for a predetermined time from the edge of said first clock signal to the reset state, controls propagation of said rearward pulse by said rearward-pulse delay line, and a state-holding circuit initializing device which initializes said state-holding device to the reset state when said state-holding circuit initializing device detects that said first clock signal is not generated.

A clock control circuit according to the present invention comprises a forward-pulse delay line which is configured by cascading a plurality of stages of forward-pulse delay circuits to propagate inputted signals with a predetermined delay time so as to delay said inputted signals, and delays forward pulse corresponding to a second clock signal obtained by delaying a first clock signal, which is obtained by delaying an external clock signal by a first delay time, by a second delay time during the one polarity pulse duration of said first clock signal, a rearward-pulse delay line which is configured by cascading a plurality of stages of rearward-pulse delay circuits to propagate inputted signals with a predetermined delay time so as to delay said inputted signals, and, by being set to the reset state of a stage corresponding to the stage where said forward pulse is propagated after said second delay time and also by being set to the set state of stages corresponding to the first stage up to the stage where said forward pulse is propagated, propagates rearward pulse, which is generated in said stage in the reset state by taking in said first clock signal selectively, by said stage in the set state and outputs said rearward pulse from the first stage, a state-holding device which is configured with a number of stages corresponding to the number of stages of said forward-pulse delay line and rearward-pulse delay line, and, by turning stages corresponding to the stages where said forward pulse is propagated during the one polarity pulse duration of said first clock signal to the set state and also by turning stages corresponding to the stages where said rearward pulse is propagated only for a first time from the edge of said first clock signal to the reset state, controls propagation of said rearward pulse by said rearward-pulse delay line, and a state-holding circuit control device which generates control signals to set said first time corresponding to the rearward pulse outputted from said rearward-pulse delay line.

A clock control circuit according to the present invention comprises a forward-pulse delay line which is configured by cascading a plurality of stages of forward-pulse delay circuits to propagate inputted signals with a predetermined delay time so as to delay said inputted signals, and delays forward pulse corresponding to a second clock signal obtained by delaying a first clock signal, which is obtained by delaying an external clock signal by a first delay time, by a second delay time during the one polarity pulse duration of said first clock signal, a rearward-pulse delay line which is configured by cascading a plurality of stages of rearward-pulse delay circuits to propagate inputted signals with a predetermined delay time so as to delay said inputted signals, and, by being set to the reset state of stages corresponding to the stages where said forward pulse is propagated after said second delay time and also by being set to the set state of stages corresponding to the first stage up to the stage where said forward pulse is propagated, propagates rearward pulse, which is generated in said stage in the reset state by taking in said first clock signal selectively, by said stage in the set state and outputs said rearward pulse from the first stage, a state-holding device which is configured with a number of stages corresponding to the number of stages of said forward-pulse delay line and rearward-pulse delay line, and by turning stages corresponding to the stages where said forward pulse is propagated during the one polarity pulse duration of said first clock signal to the set state and also by turning stages corresponding to the stages where said rearward pulse is propagated only for a first time from the edge of said first clock signal to the reset state, controls propagation of said rearward pulse by said rearward-pulse delay line, a state-holding circuit control device which generates control signals to set said first time according to the rearward pulse outputted from said rearward-pulse delay line, and a forward-pulse adjusting device to adjust the pulse width of said forward pulse corresponding to the rearward pulse outputted from said rearward-pulse delay line and said forward pulse.

An apparatus according to the present invention comprises a first device which operates corresponding to an external clock signal, a transmission line to transmit data, a clock control circuit having a forward-pulse delay line which is configured by cascading a plurality of stages of forward-pulse delay circuit to propagate inputted signals with a predetermined delay time so as to delay said inputted signals, and delays forward pulse corresponding to a second clock signal obtained by delaying by a first delay time a first clock signal, which is obtained by delaying said external clock signal, by a second delay time during the one polarity pulse duration of said first clock signal, a rearward-pulse delay line configured by cascading a plurality of stages of rearward-pulse delay circuit to propagate inputted signals with a predetermined delay time so as to delay said inputted signals, and, by being set to the reset state of stages corresponding to the stages where said forward pulse is propagated after said second delay time and also by being set to the set state of stages corresponding to the first stage up to the stage where said forward pulse is propagated, propagates rearward pulse, which is generated in said stage in the reset state by taking in said first clock signal selectively, by said stage in the set state and outputs said rearward pulse from the first stage, a state-holding device which is configured with a number of stages corresponding to the number of stages of said forward-pulse delay line and rearward-pulse delay line, and, by turning stages corresponding to the stages where said forward pulse is propagated during the one polarity pulse duration of said first clock signal to the set state and also by turning stages corresponding to the stages where said rearward pulse is propagated only for a first time from the edge of said first clock signal to the reset state, controls propagation of said rearward pulse by said rearward-pulse delay line, a state-holding circuit control device to generate control signals to set said first time corresponding to rearward pulse outputted from said rearward-pulse delay line, and an output device to output an internal clock signal obtained by delaying said rearward pulse by a third delay time, and a device which uses an internal clock signal synchronized to an external clock signal comprising a second device to perform predetermined processes using said internal clock signal and to transmit the processed result to said transmission line.

Other features and advantages of the present invention will become apparent enough from the following description.

DETAILED DESCRIPTION OF THE PREFERRED EMBODIMENTS

Figure 1:
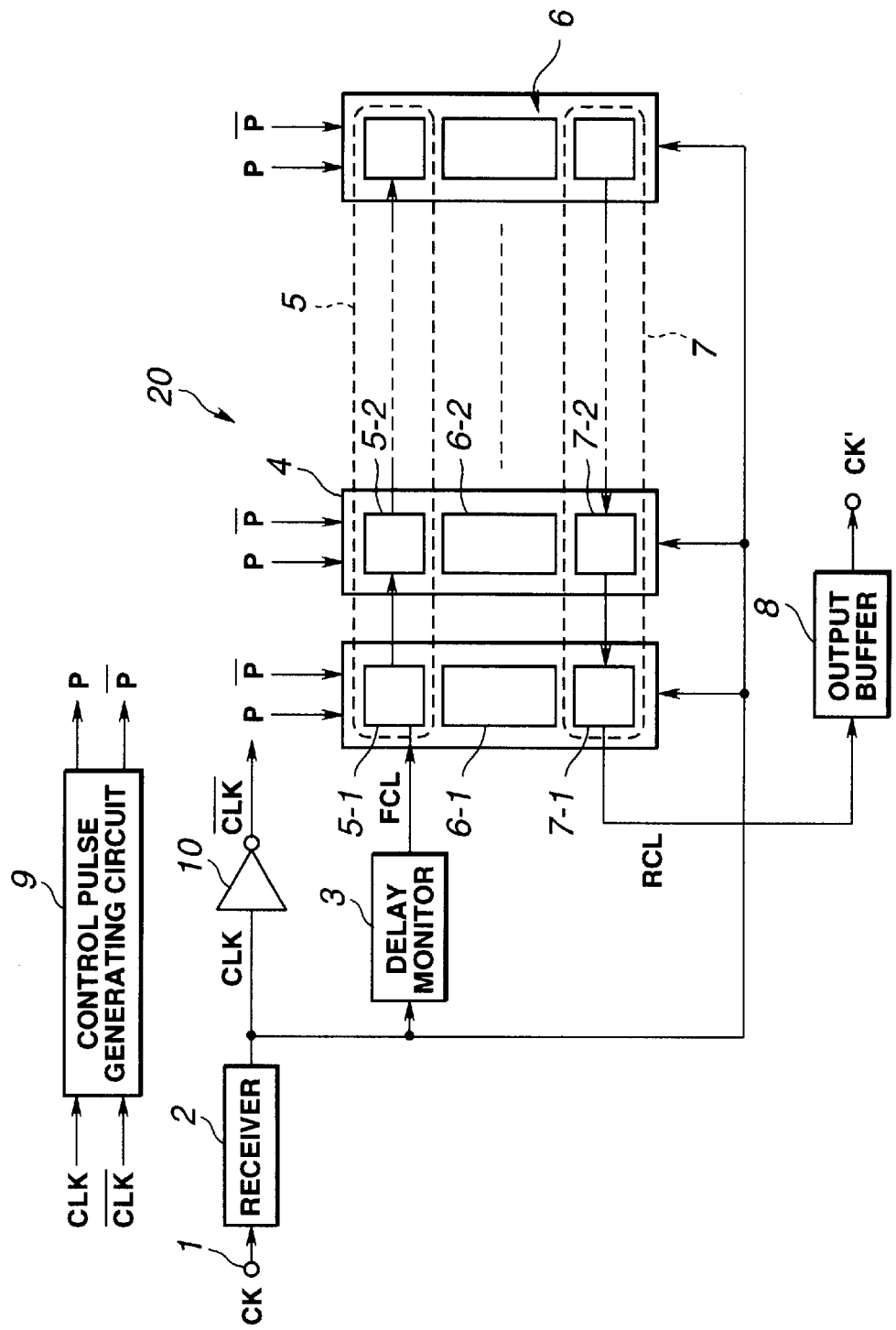
FIG. 1 is a circuit diagram showing a related art on a clock control circuit.
Figure 2:
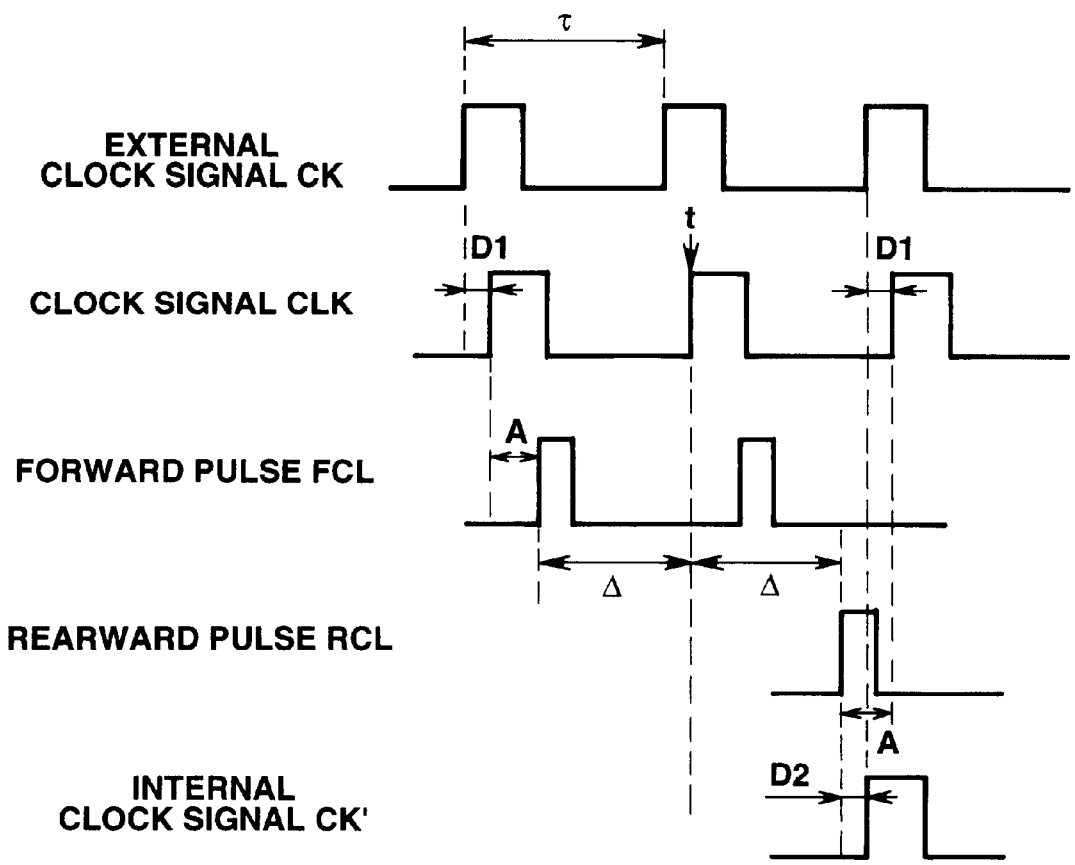
FIG. 2 is a waveform diagram illustrating a theory of an STBD.
Figure 11:
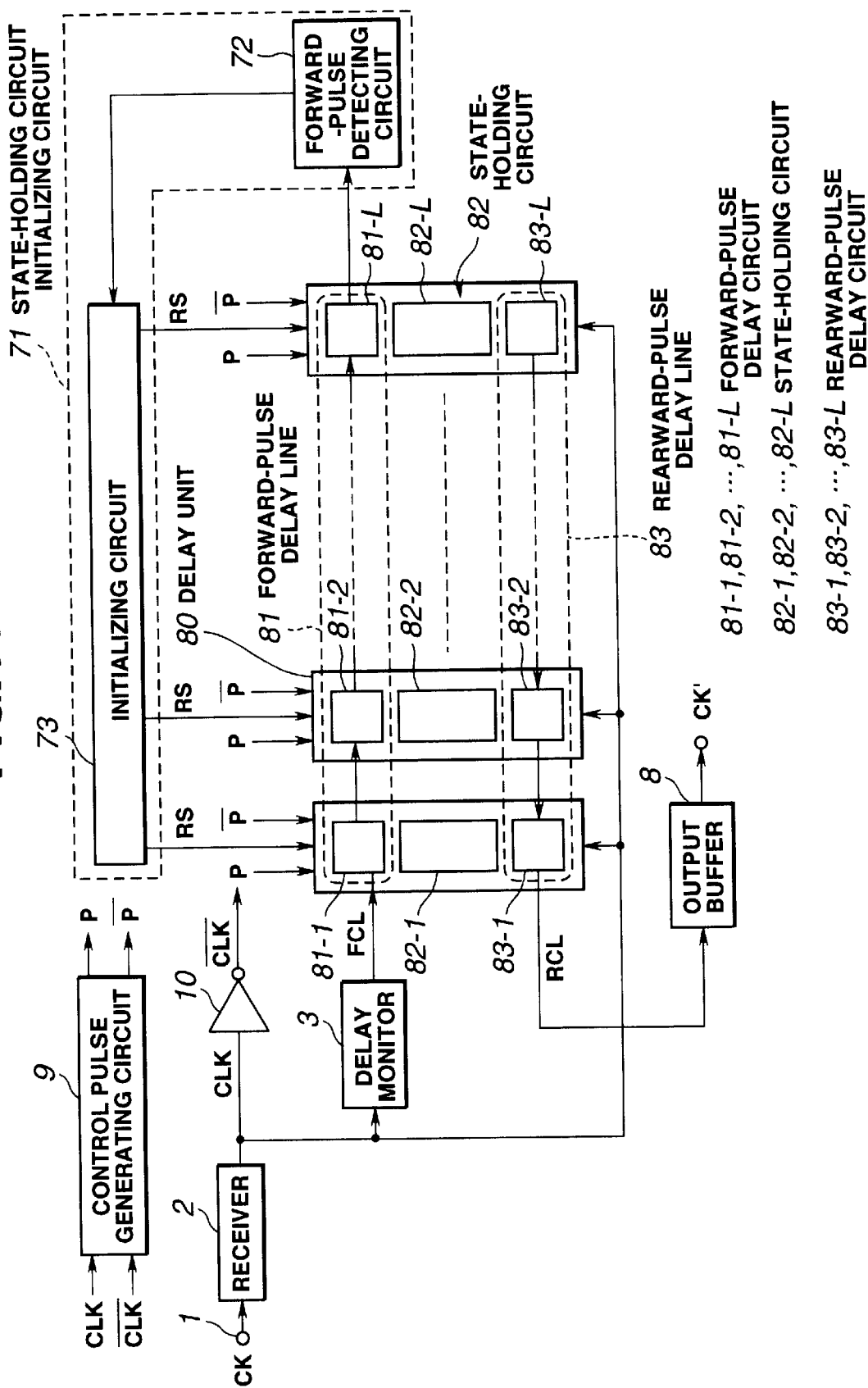
FIG. 11 is a circuit diagram showing a clock control circuit according to an embodiment of the present invention.
Figure 12:
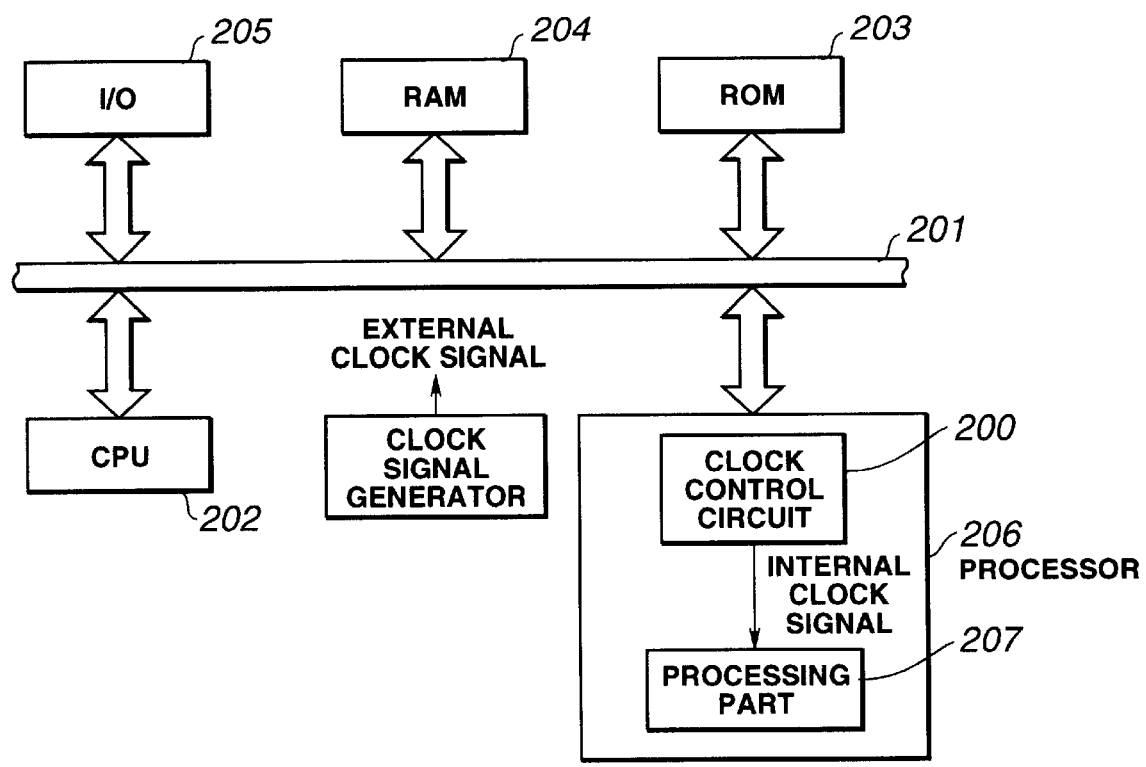
FIG. 12 is a block diagram showing a computer system wherein the clock control circuit shown of FIG. 11 is applied.

The embodiments of the present invention will now be described in detail hereinafter with reference to the accompanying drawings. FIG. 11 is a circuit diagram showing an embodiment of a clock control circuit according to the present invention. In FIG. 11, the same elements as those in FIG. 1 are given the same reference numerals. FIG. 12 is a block diagram showing a computer system wherein a clock control circuit in FIG. 11 is applied.

FIG. 12 shows an ordinary computer system. That is, a CPU202 connected to a bus 201 operates and executes instructions according to the program. A ROM203 stores mainly programs and a RAM204 stores data. An I/O205 sends and receives data to and from the exterior.

An apparatus 206 wherein an internal clock signal synchronized to an external clock signal is used (hereinafter referred to as processor) is provided with a processing part 207 to carry out predetermined processing of data and a clock control circuit 200 in accordance with the embodiment. A clock generator 208 generates clock signals (external clock signal) to be used in the computer system. The clock control circuit 200 is designed to generate an internal clock signal synchronized to the external clock signal and to supply it to the processing part 207.

This embodiment is applicable not only to the computer system shown in FIG. 12 but also to all the apparatus wherein an internal clock signal synchronized to an external clock signal is used.

The embodiment of FIG. 11 differs from the example of a related art in FIG. 1 in points that the state-holding circuit initializing circuit 71 is added. As a delay unit 80, a device having the same configuration as that of the delay unit 4 in the example of a related art may also be adopted, or one having different configuration may be adopted so long as they have equal functions. The state-holding circuit initializing circuit 71 is used so as to prevent delays from arising in generation of the next internal clock signal when outputting from the receiver to take in an external clock signal is temporarily stopped.

First, the configuration of the embodiment of FIG. 11 will be described.

To the input terminal 1, the external clock signal CK is inputted. Suppose that the period of the external clock signal is τ. This external clock signal CK is supplied to the receiver 2. The receiver 2 performs waveform shaping on the external clock signal and outputs an amplified clock signal CLK. The delay time at the receiver 2 is supposed to be D1. The clock signal CLK from the receiver 2 is supplied to the inverter 10, the delay monitor 3 and a plurality of delay units 80.

The inverter 10 inverts the clock signal CLK and outputs a clock signal /CLK. The delay monitor 3 is designed to delay the clock signal CLK by the time A and to generate forward pulse FCL. The output of the delay monitor 3 is supplied to the first delay unit 80.

The clock signals CLK and /CLK are also supplied to the control pulse generating circuit 9. The control pulse generating circuit 9 rises at the rising of the clock signal CLK, generates the control pulse P having a pulse width of A and its inverted signal /P, and supply them to delay units 80. The value of A' is set so as to satisfy A>A'.

The delay unit 80 comprises forward-pulse delay circuits, state-holding circuits and rearward-pulse delay circuits. By using a plurality of stages of delay units 80, forward-pulse delay circuits in the first stage up to the last stage are cascaded, and rearward-pulse delay circuits in the first stage up to the last stage are also cascaded to configure a forward-pulse delay line 81 and a rearward-pulse delay line 83 respectively.

Figure 13A:
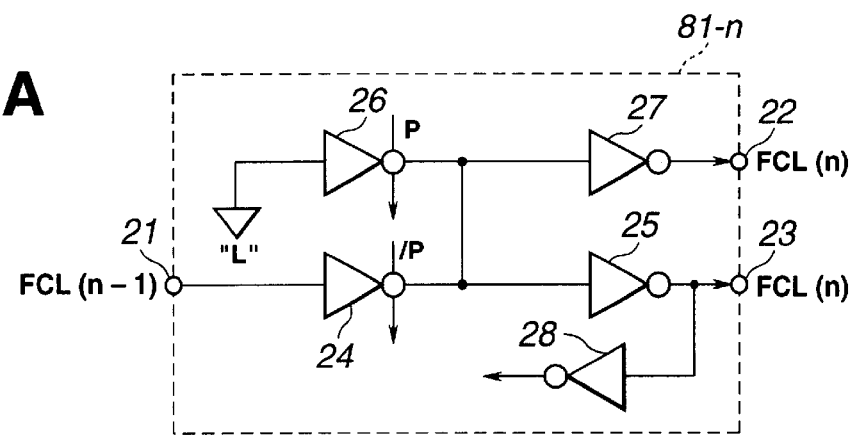
FIG. 13A is a circuit diagram showing a forward-pulse delay circuit shown in FIG. 1.
Figure 13B:
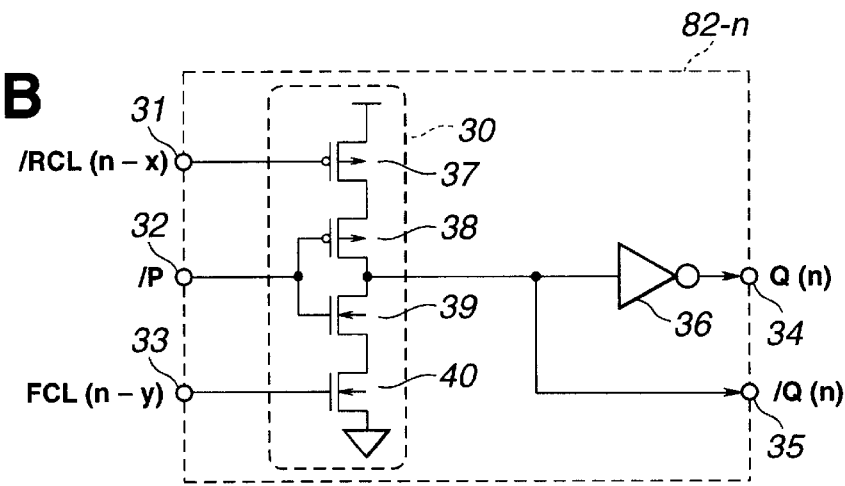
FIG. 13B is a circuit diagram showing a state-holding circuit shown in FIG. 1.
Figure 13C:
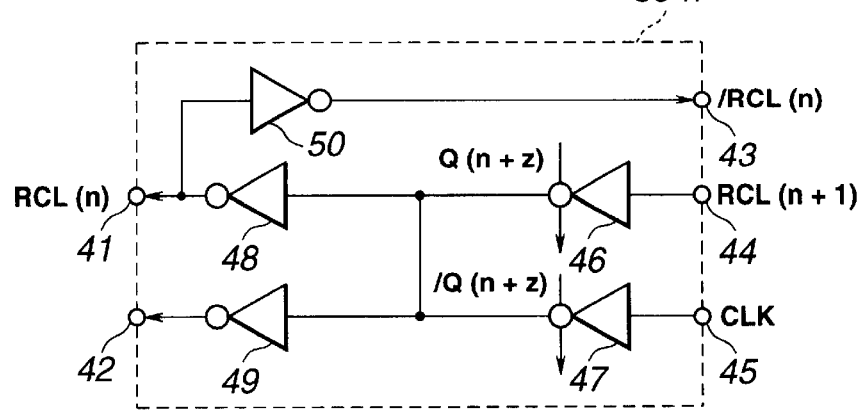
FIG. 13C is a circuit diagram showing a rearward-pulse delay circuit shown in FIG. 1.

As stated above, for the delay unit 80, the delay unit 4, whose forward-pulse delay circuits, state-holding circuits and rearward-pulse delay circuits are shown in FIGS. 13A to 13C, may be used, or a unit having other configuration may be used so long as they have equal functions.

The forward-pulse delay circuits 81-1, 81-2, ..., 81-L of each delay unit 80 are designed to output the output at "L" while the control pulse P is "H" so as to initialize the forward-pulse delay line 81. While the control pulse P is "L" they are designed to propagate the output of forward-pulse delay circuits in the preceding stage to forward-pulse delay circuits in the succeeding stage.

State-holding circuits 82-1, 82-2, ..., 82-L of each delay unit 80 are designed, in a stage where forward pulse is propagated while the control pulse P was "L" to turn the state signal Q to "H" so as to turn the stage to the set state, and to turn the state signal Q to "L" in the stage where rearward pulse is propagated while the control pulse P was "H" so as to turn the stage to the reset state. The state-holding circuits 82-1, 82-2, ..., 82-L are designed to determine corresponding to the control pulse /P to output either the state signal Q corresponding to forward pulse or the state signal Q corresponding to rearward pulse.

The rearward-pulse delay circuits 83-1, 83-2, ..., 83-L of each of the delay units 80 are designed, in a stage where the state signal Q at "L" (the reset state) has been inputted, to output the clock signal CLK, and in a stage where the state signal at "H"(the set state) has been inputted, to propagate the output of rearward-pulse delay circuits in the succeeding stage by rearward-pulse delay circuits in the preceding stage. To the rearward-pulse delay circuit 83-L in the last stage, the clock signal CLK is supplied even in the set state.

In this embodiment, it is designed so that the forward-pulse delay line 81 delays inputted forward pulse by the time (τ−A), and the rearward-pulse delay line 83 propagates rearward pulse for the time (τ−A) from the stop of propagation of forward pulse and outputs it from the first rearward-pulse delay circuit 83-1. The rearward pulse RCL from the rearward-pulse delay line 83 is supplied to the output buffer 8. The output buffer 8 is designed to delay the inputted rearward pulse RCL by the delay time D2 and to output it as an internal clock signal CK'.

In this embodiment, output terminals of the last forward-pulse delay circuit 81-L or output terminals of the last state-holding circuit 82-L are designed to be connected to the state-holding circuit initializing circuit 71.

FIGS. 13A–13C show examples of the forward-pulse delay circuit 81, the state-holding circuit 82 and the rearward-pulse delay circuit 83.

FIG. 13A shows an example of the n-th forward-pulse delay circuit 81-n. To a terminal 21, the forward pulse FCL(n−1), which is the output of the (n−1)th forward-pulse delay circuit 81-(n−1), is inputted. The forward pulse FCL (n−1) is supplied to a clocked inverter 24, and the clocked inverter 24 is activated to conduct by the control pulse /P at "L" The symbol /P means an inverted signal of pulse P. The output of the clocked inverter 24 is outputted from a terminal 23 via an inverter 25 and also outputted from a terminal 22 via an inverter 27. The output of the terminal 23 is supplied as forward pulse FCL(n) to the input terminal 21 of the forward-pulse delay circuit 81-(n+1) in the next stage. The terminal 22 is connected to a terminal 33 of a state-holding circuit to be described later.

To a clocked inverter 26, electric potential at "L" is supplied. The clocked inverter 26 is designed to conduct at "H" of the control pulse P, and to output its output to the terminal 23 via the inverter 25 and also to the terminal 22 via the inverter 27. To an output terminal of the inverter 25, an inverter 28 for load adjusting is also connected.

FIG. 13B shows the n-th state-holding circuit 82-n. The state-holding circuit 82-n comprises a clocked inverter 30 and an inverter 36. The clocked inverter 30 comprises two pMOS transistors 37 and 38 and two nMOS transistors 39 and 40, and is controlled by a signal inputted via terminals 31 to 33. To the terminal 32, the control pulse /P is inputted, and to the terminal 33, the (n−y)th forward pulse FCL(n−y) in the (n−y)th stage is inputted. To the terminal 31, a signal /RCL(n−x), which is an inverted signal of rearward pulse in the (n−x)th stage, is inputted from the rearward-pulse delay line 7. The pMOS transistor 37 and the nMOS transistor 40 may be controlled by /P and the pMOS transistor 38 may be controlled by /RCL, and the nMOS transistor 39 may be controlled by FCL(n−y).

The clocked inverter 30 outputs a level corresponding to a rearward pulse in the (n−x)th stage by the control pulse /P'S becoming "L" and outputs a level corresponding to a forward pulse in the (n−y)th stage by the control pulse /P'S becoming "H" The output of the clocked inverter 30 is supplied to a terminal 34 via the inverter 36 and also to a terminal 35 as it is. The output of the terminals 34 and 35 is supplied to the rearward-pulse delay line 7 as a state signal Q and its inverted signal /Q respectively.

The state-holding circuit 82 records a state using the value of electric charge stored in the gate capacity of the inverter 36.

FIG. 13C shows the n-th rearward-pulse delay circuit 83-n. To a terminal 44, a rearward pulse RCL(n+1) from the rearward-pulse delay circuit 83-(n+1) in the succeeding stage is inputted, and to a terminal 45, the clock signal CLK from the receiver 2 is inputted. Signals inputted to the terminals 44 and 45 are supplied to clocked inverters 46 and 47 respectively.

The clocked inverter 46 conducts by becoming "H" of the state signal Q(n+z) at the (n+z)th state-holding circuit 82-(n+z) becomes "H" and the clocked inverter 47 conducts by becoming "H" of /Q(n+z), the inverted signal of the state signal, from the (n+z)th state-holding circuit 82-(n+z). An output terminal of the clocked inverter 46 is connected to a terminal 41 via an inverter 48 and also to a terminal 42 via an inverter 49. An output terminal of the clocked inverter 47 is connected to a terminal 42 via the inverter 49 and also to the terminal 41 via the inverter 48. An output terminal of the inverter 48 is connected to a terminal 43 via the inverter 50. The terminal 41 is connected to the terminal 44 of the rearward-pulse delay circuit 83-(n−1) in the preceding stage. The inverter 49 is for load adjusting. To the input terminals 44 and 45 of the rearward-pulse delay circuits in the last stage, the clock signal CLK from the receiver 2 is supplied.

In FIGS. 13A–13C, x is an anti-jitter measure, and y, z are to subtract a delay time which arises between the timing when the time (τ−A) elapsed since the start of propagation of forward pulse and the time when the propagation of forward pulse stops and propagation of rearward pulse starts. Note that n is an integer larger than 0 and x, y, z are integers.

Figure 13D:
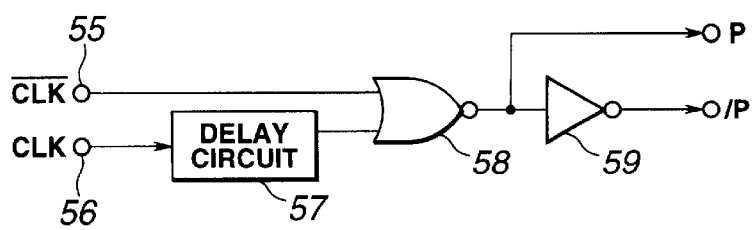
FIG. 13D is a circuit diagram showing a control pulse generating circuit 9 shown in FIG. 1.

Control pulses P and /P to be supplied to the delay unit 4 are generated by the control pulse generating circuit 9 shown in FIG. 13D. The control pulse generating circuit 9 has input terminals 56 and 55 to which the clock signal CLK and its inverted signal /CLK are inputted respectively (not shown in the figure).

The clock signal CLK is supplied to a delay circuit 57. The delay circuit 57 delays the clock signal CLK by a delay time A', which is shorter than the delay time A of the delay monitor 3, and gives it to an NOR circuit 58. To the NOR circuit 58, the clock signal /CLK has also been given from the terminal 55, and the NOR circuit 58 outputs a control pulse P which becomes "H" only when both of two-input are at "L" The control pulse P is inverted by an inverter 59 to give a control pulse /P.

Figure 17:
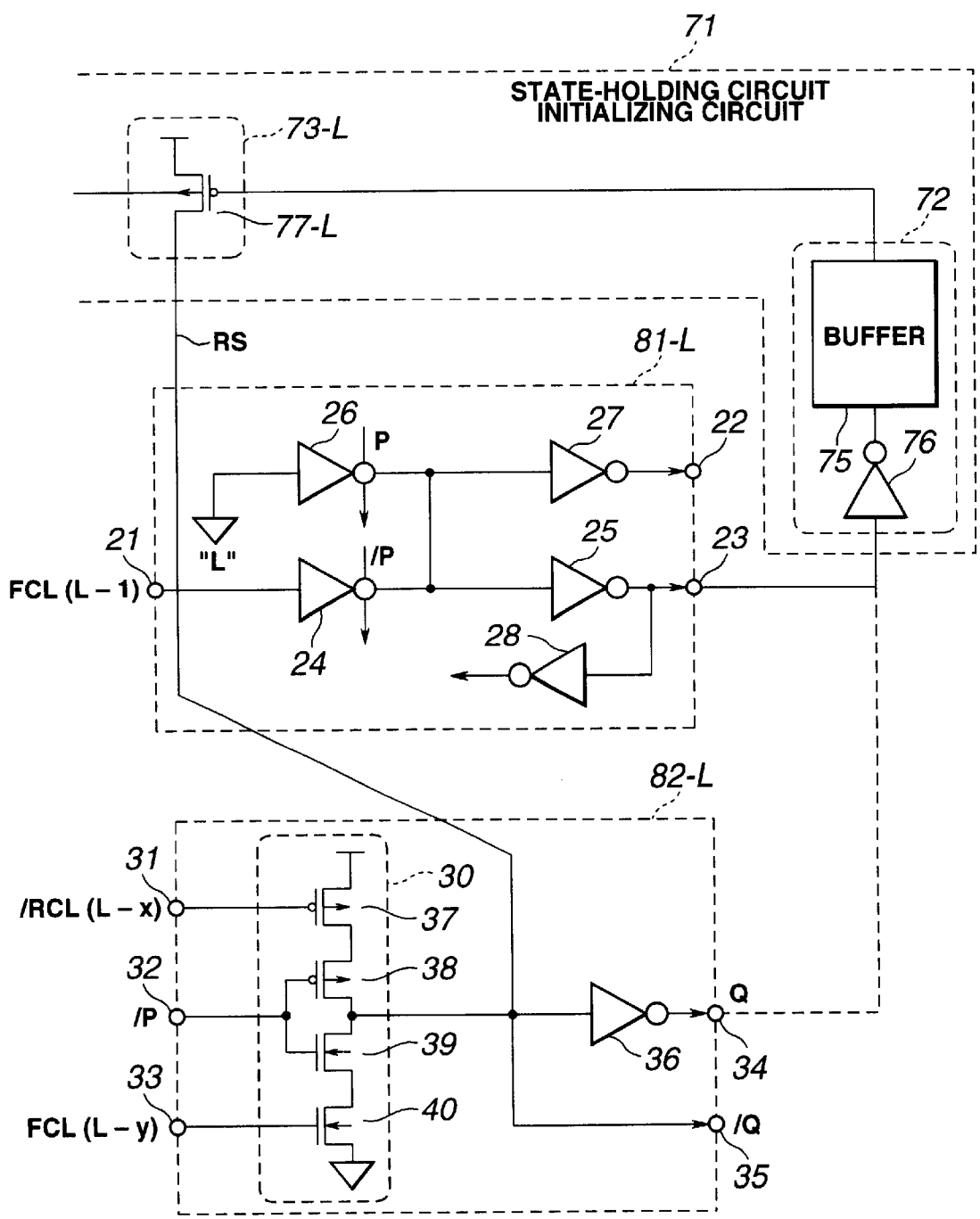
FIG. 17 is a circuit diagram showing a specific configuration of the state-holding circuit initializing circuit 71, the forward-pulse delay circuit 81-L and the state-holding circuit 82-L in the last stage shown in FIG. 11.

FIG. 17 is a circuit diagram showing a specific configuration of the state-holding circuit initializing circuit 71, the last forward-pulse delay circuit 81-L and the last state-holding circuit 82-L shown in FIG. 11.

In the example shown in FIG. 17, as the forward-pulse delay circuit 81-L and the state-holding circuit 82-L, circuits having the same configuration as that of those shown in FIGS. 13A and 13B are adopted.

In this embodiment, forward pulse from the terminal 23 is supplied to the state-holding circuit initializing circuit 71. The state-holding circuit initializing circuit 71 comprises a forward-pulse detecting circuit 72 and an initializing circuit 73. The forward-pulse detecting circuit 72 is designed to detect that forward pulse was inputted and to supply a detection signal to the initializing circuit 73. Namely, the forward-pulse detecting circuit 72 comprises a buffer 75 and an inverter 76. Forward pulse outputted from the last forward-pulse delay line is inverted by the inverter 76 and inputted to the buffer 75. The buffer 75 is supposed to have enough driving force to drive all initializing circuits and to be able to generate signals having a pulse width wide enough to reset the state-holding circuit. The number of the initializing circuits 73 is the same as that of state-holding circuits, and one initializing circuit is connected to each of all state-holding circuits.

A pMOS transistor 77 is designed to be turned on by input of a detection signal at "L" to supply a signal at "H" to all of output terminals of the clocked inverter 30 of the state-holding circuits 82-1 to 82-L, and to force the state signal Q to be changed to "L" showing the reset state.

Now, the operation of the embodiment configured in such a manner is described.

Figure 3:
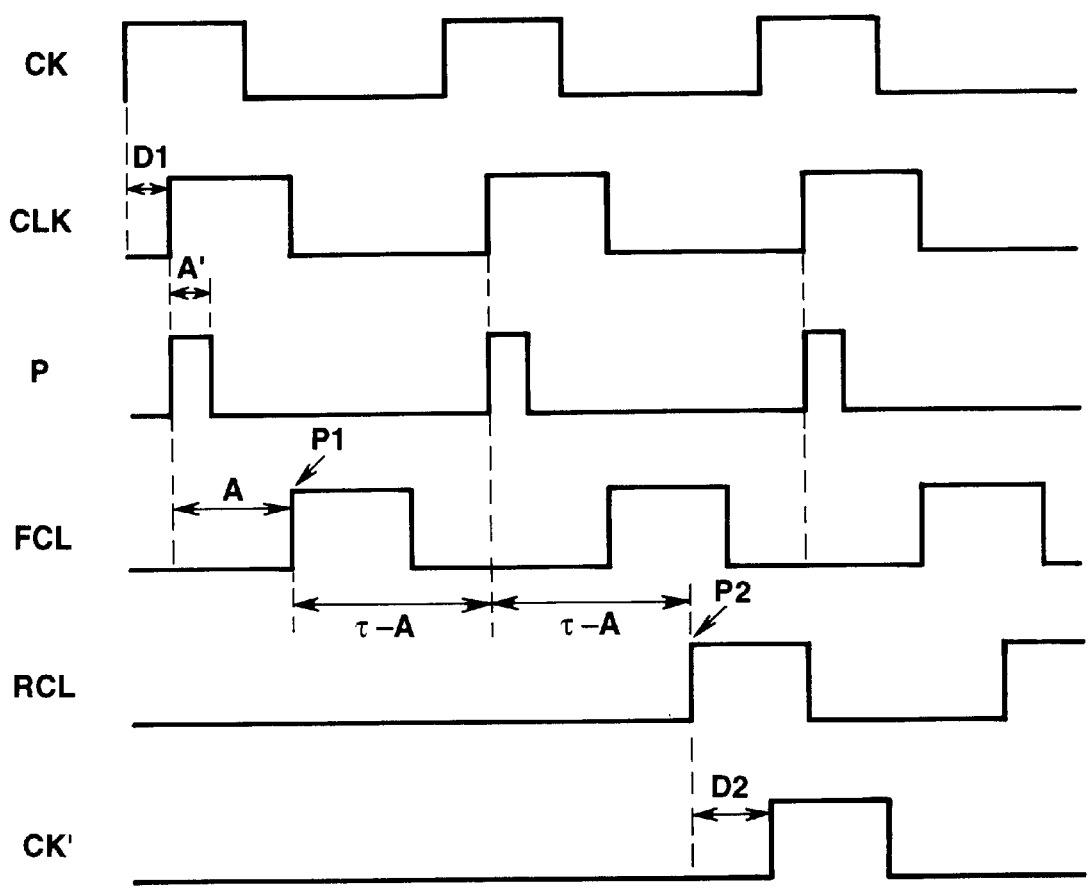
FIG. 3 is an explanatory view illustrating the operation according to a related art.
Figure 4:
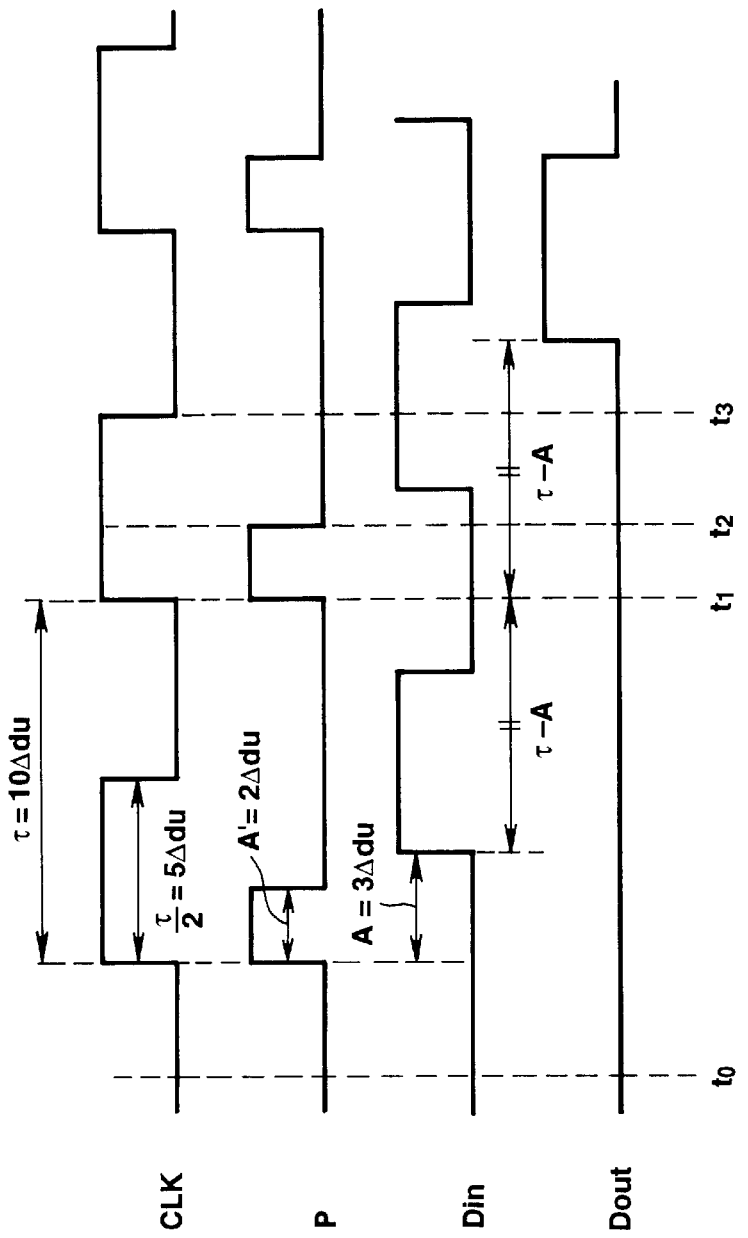
FIG. 4 is an explanatory view illustrating the operation according to a related art.
Figure 5:
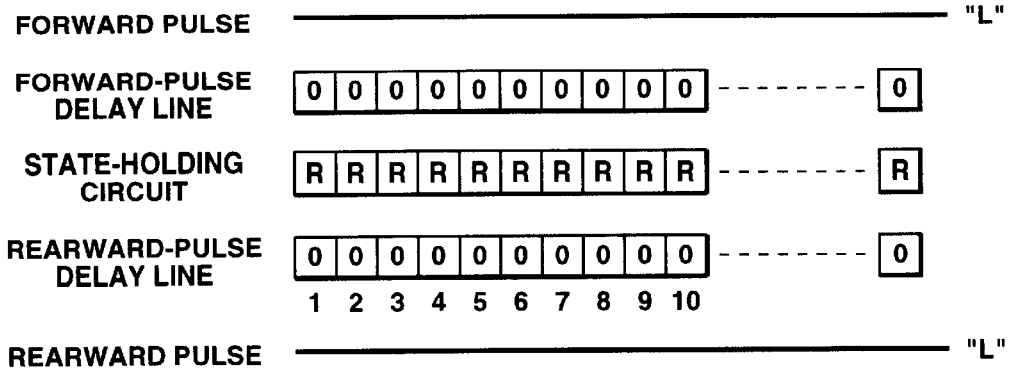
FIGS. 5–7 are explanatory views illustrating the operation according to a related art.
Figure 6:
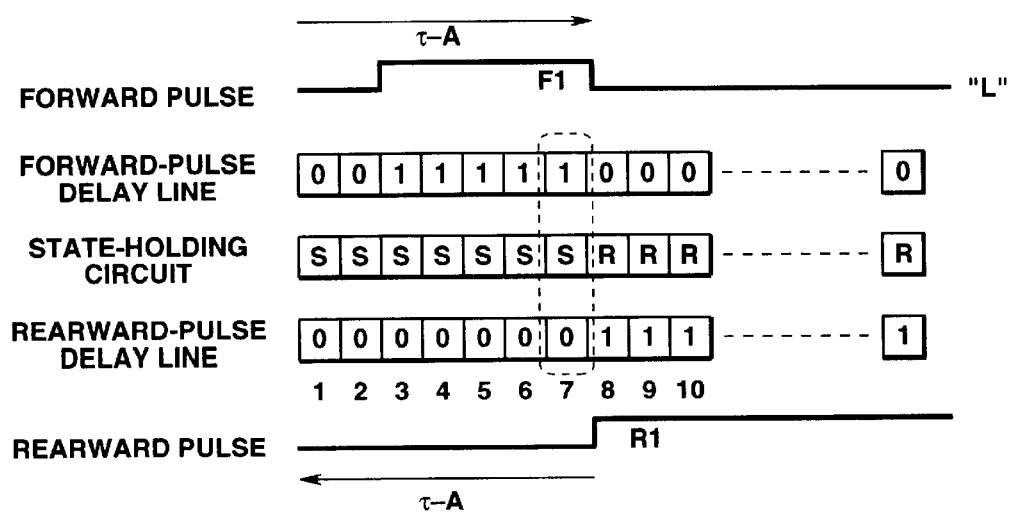
Figure 7:
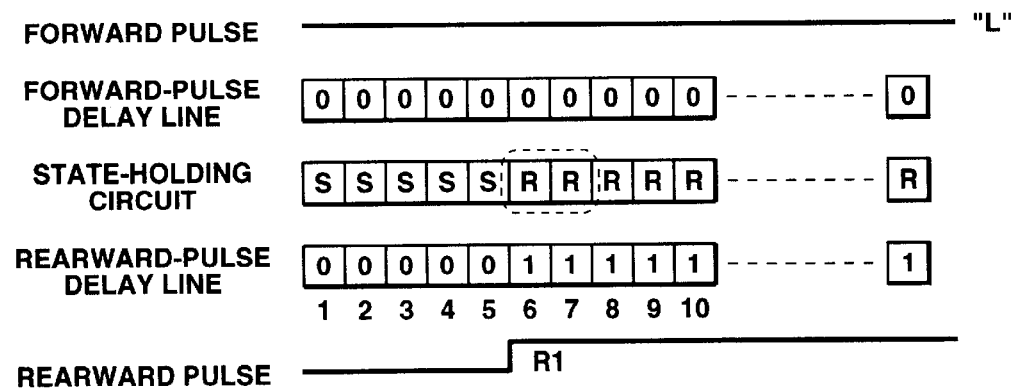

The delay times of the receiver 2, the delay monitor 3 and the output buffer 8 are D1, A and D2 respectively. The operation before the temporary stoppage of the output of the receiver 2 is similar to the operation according to a related art shown by the operating waveform diagram in FIG. 3. That is, to the input terminal 1, the external clock signal CK shown in FIG. 3 is inputted. This external clock signal CK is taken in by the receiver 2, and, as shown in FIG. 3, supplied to the delay monitor 3 and the inverter 10 as the clock signal CLK after the delay time D1.

The inverter 10 outputs the clock signal /CLK which is the inverted clock signal CLK. These clock signals CLK and /CLK are supplied to the control pulse generating circuit 9, and the control pulse P, which is synchronized to the clock signal CLK and has a pulse width A', is generated.

Meanwhile, the delay monitor 3 delays the clock signal CLK by the time A and supplies the forward pulse FCL shown in FIG. 3 to the first forward-pulse delay circuit 81-1.

Now, suppose that the delay unit 80 is in the initial state and all the delay units 80 have been initialized. That is, the forward-pulse delay circuits 81-1, 81-2, . . . and the rearward-pulse delay circuits 83-1, 83-2, . . . are outputting the output at "L" and the state-holding circuits 82-1, 82-2, . . . are outputting the state signal Q at "L" showing the reset state.

In this state, when the control pulse P becomes "L" the forward-pulse delay line 81 begins to propagate forward pulse FCL. By the forward pulse FCL's being propagated, a state-holding circuit in a stage where the pulse is propagated turns to the set state. When the time (τ–A) elapses since the input of the forward pulse FCL to the forward-pulse delay line 81, the control pulse P becomes "H", and propagation of the forward pulse FCL is stopped.

If the forward pulse FCL has been propagated up to the m-th stage, the first state-holding circuits in the first stage up to the m-th stage turn to the set state, and state-holding circuits in and after the (m+1)th stages turn to the reset state. As the clock signal CLK is "H" at this timing, rearward-pulse delay circuits in and after the (m+1)th stages output rearward pulse at "H". This rearward pulse is supplied to the m-th rearward-pulse delay circuit 83-m. As rearward-pulse delay circuits in stages before the m-th stage are in the set state, after this, rearward pulse is propagated by the rearward-pulse delay line 83 sequentially to the preceding stage side. State-holding circuits in a number of stage corresponding to the time A' from the generation of rearward pulse are turned back to the reset state by the propagation of rearward pulse.

In such a manner, the first rearward-pulse delay circuit 83-1 outputs the rearward pulse RCL after the time (τ–A) since the generation of rearward pulse. The rearward pulse RCL is delayed by the time D2 by the output buffer 8 and outputted as the internal clock signal CK'.

By setting the delay time A of the delay monitor 3 so as to be A=D1+D2, an internal clock signal CK', which is delayed by 2τ and synchronized to the external clock signal CK, is generated.

Figure 14:
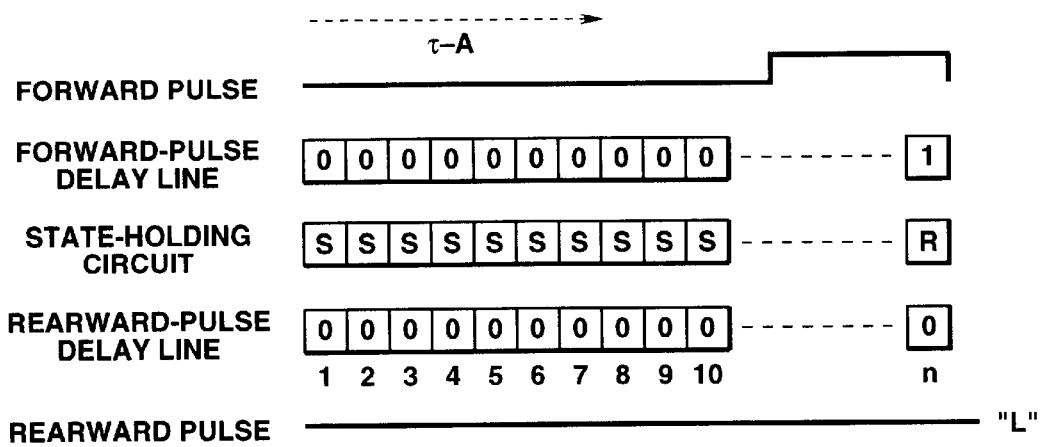
FIGS. 14–16 are explanatory views illustrating the embodiment of FIG. 11.

Now, suppose that the output of the receiver 2 is temporarily stopped. As a result, the control pulse P is not generated, and the forward pulse, which is being propagated by the forward-pulse delay line 81, is propagated up to the last forward-pulse delay line 81-L (FIG. 14).

Figure 15:
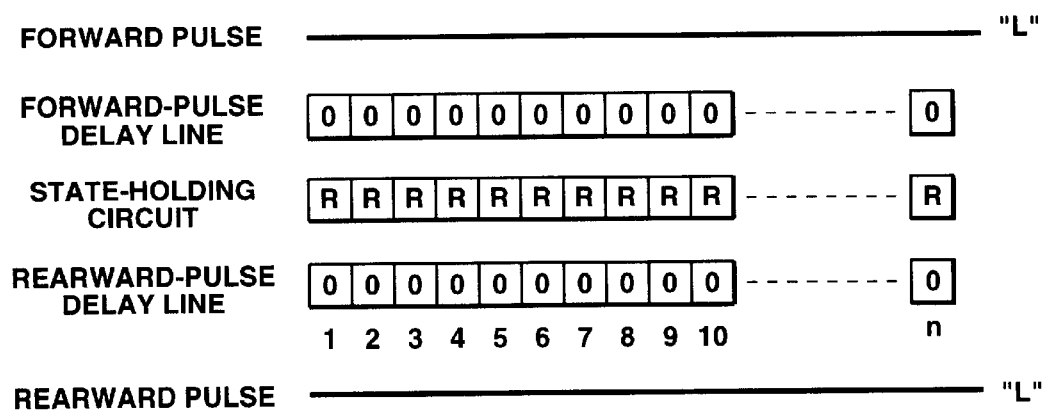

The forward pulse, which was propagated up to the last forward-pulse delay line 81-L, is supplied to the inverter 76 of the forward-pulse detecting circuit 72 from the terminal 23. The inverter 76 inverts the forward pulse and inputs it to the buffer 75. Output signals of the buffer 75 are inputted to the gate of all the pMOS transistors 77-1 to 77-L. With this operation, the state signal Q becomes "L" and state-holding circuits are forced to turn to the reset state (FIG. 15).

Next, suppose that the output of the receiver 2 is resumed. The clock signal CLK outputted from the receiver 2 is delayed by the time A by the delay monitor 3 and supplied to the forward-pulse delay line 81. The forward pulse FCL is propagated by the forward-pulse delay line 81 while the control pulse P is "L" and the propagation is stopped after the time (τ–A) after the input of the forward pulse FCL. The stages, where the forward pulse FCL was propagated, are changed from the reset state to the set state.

Figure 16:
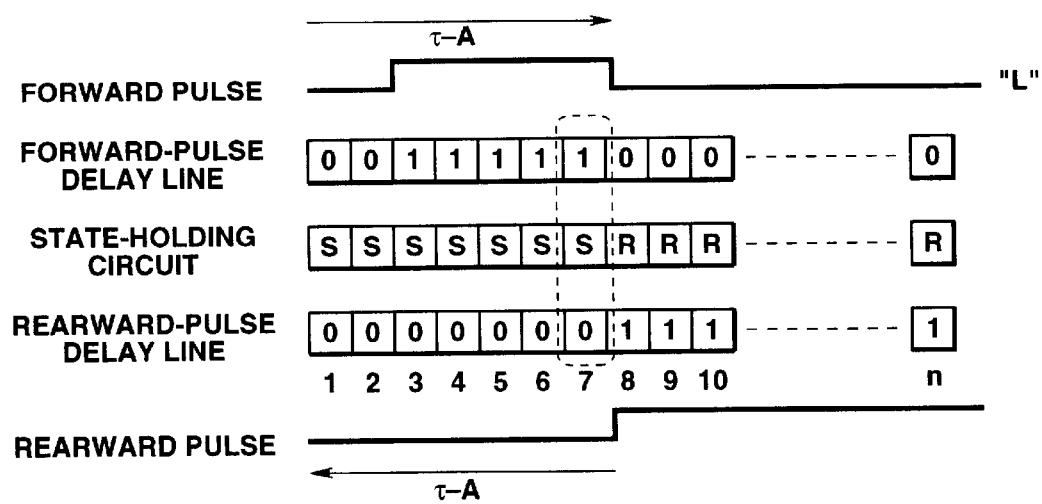

Meanwhile, the clock signal CLK at "H" is outputted as rearward pulse from rearward-pulse delay circuits in the reset state. That is, state-holding circuits in all stages have been turned to the reset state by the state-holding circuit initializing circuit 71. They are in the set state in stages up to the stage where the forward pulse FCL is propagated, and in and after the stages next to the stage where forward pulse is propagated and succeeding ones, they are in the reset state (FIG. 16). Accordingly, the internal clock signal CK' is generated without delay after the output of the receiver 2 is resumed.

Thus, in this embodiment, it is designed so that, when propagation of forward pulse is detected up to the last stage, the state-holding circuit initializing circuit 71 initializes all state-holding circuits, and the internal clock signal CK' is generated without delay even when the output of the receiver 2 is resumed.

As described above, as delay units, in addition to the units shown in FIGS. 13A to 13C, various devices can be adopted so long as they have equal functions. Similarly, although a pMOS transistor is adopted as the initializing circuit 73 in the state-holding circuit initializing circuit 71 in FIG. 17, other circuit configuration is also possible. For example, the initializing circuit 73 may be configured with nMOS transistors with the inverter 76 omitted, or configured with transmission gates. Or, as shown with dotted lines in FIG. 17, instead of the output of a forward-pulse delay line, the output QL of the state-holding circuit may be connected to the state-holding circuit initializing circuit so as to determine whether forward pulse is propagated or not up to the last stage of the delay line using the changes in QL.

The problem which the embodiment in FIG. 11 tries to solve arises when the length of delay lines is long. Consequently, when the length of delay lines is short and the rearward pulse, which is propagated from the last stage, is propagated faster than forward pulse is propagated by (τ–A), the state-holding circuit initializing circuit is unnecessary. However, in many cases, long delay lines are required so as to enlarge the operating frequency band of an STBD and the state-holding circuit initializing circuit 71 is needed quite often.

Figure 18:
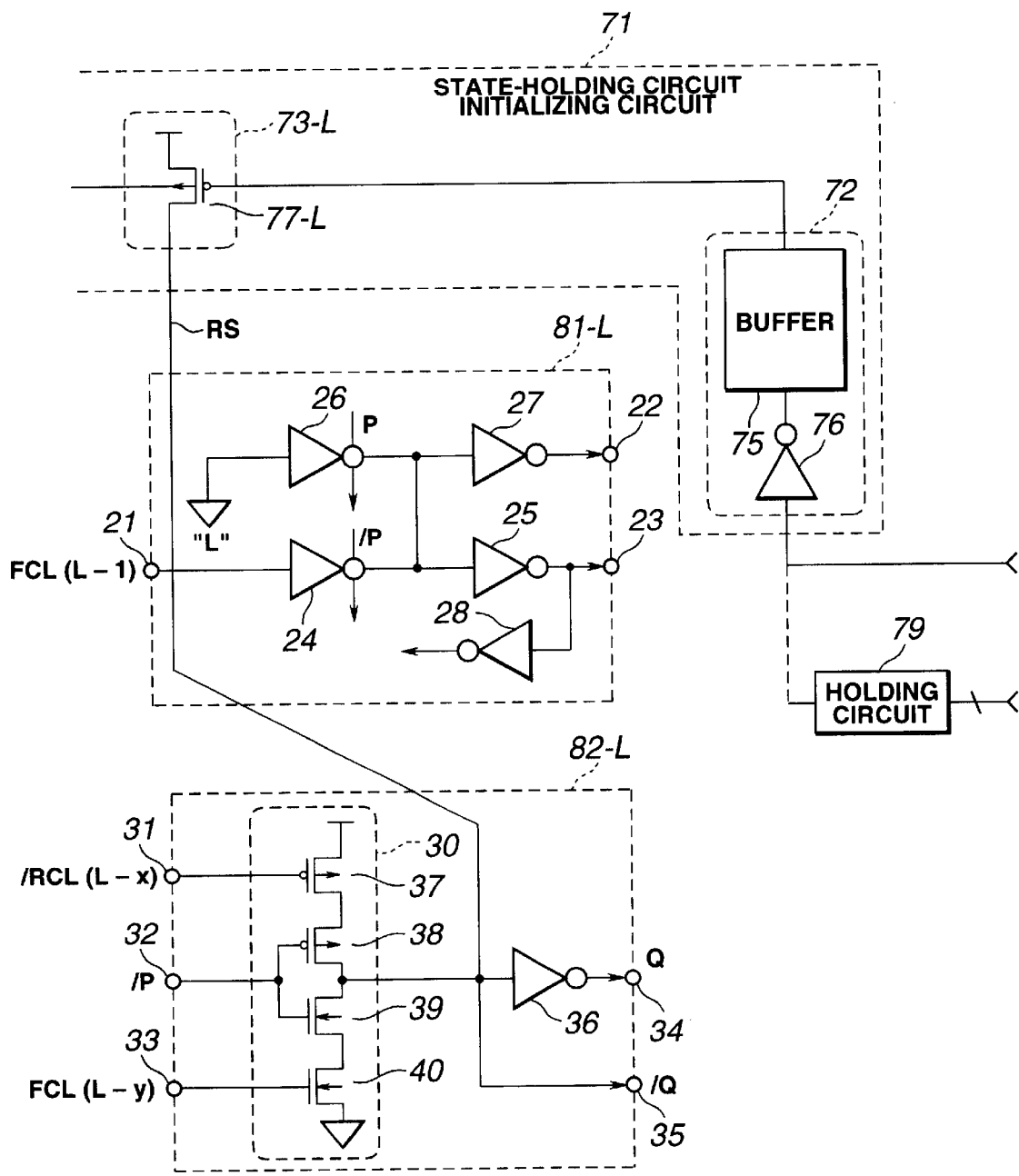
FIG. 18 is a block diagram showing a modified example of the embodiment in FIG. 11.

In the embodiment in FIG. 11, the state-holding circuit initializing circuit is designed to be controlled by propagation of forward pulse up to the last forward-pulse delay line 81-L. Various methods are possible for detecting cases where the state-holding circuit initializing circuit 71 must be turned to the initial state. FIG. 18 is a block diagram showing an example wherein the state-holding circuit initializing circuit 71 is designed to be controlled by signals to instruct to stop the supply of the external clock signal CK or to stop the output of the receiver 2. In FIG. 18, the same elements as those in FIG. 17 are given the same reference numerals and description about them is omitted.

FIG. 18 differs from FIG. 17 in points that the state-holding circuit initializing circuit 71 is controlled by signals to instruct output stoppage from the exterior. A signal to instruct output stoppage is one which becomes "H" when initialization of the state-holding circuit is required. It may designed so that, when the "H" time of a signal to instruct output stoppage is short, "H" is held by a holding circuit 79 for the time required and supplied to the state-holding circuit initializing circuit 71.

Other configuration and operation are similar to those in FIG. 17.

Figure 19A:
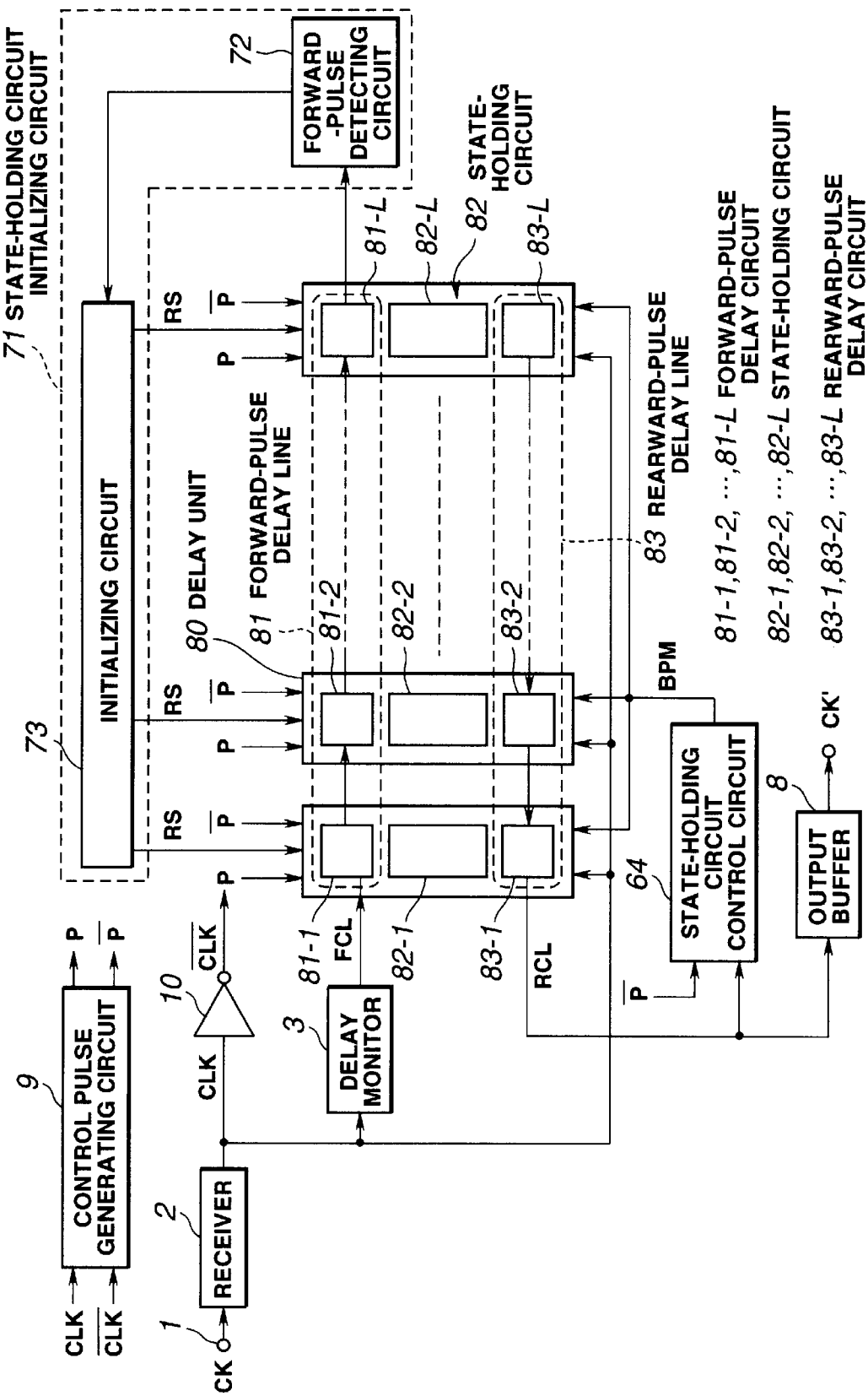
FIG. 19A is a circuit diagram showing another embodiment of the present invention.

FIG. 19A is a circuit diagram showing another embodiment of the present invention. In FIG. 19A, the same elements as those in FIG. 11 are given the same reference numerals and description about them is omitted.

This embodiment differs from that in FIG. 11 in points that a state-holding circuit control circuit 64 is added. For the delay unit 80, units having the same configuration as that of the delay unit 4 in the example of a related art may be adopted, or, one with other configuration may be adopted if it has equal functions. The state-holding circuit control circuit 64 is used so as to establish synchronization between an external clock signal and an internal clock signal even when the duty of the external clock signal is heavy. As the state-holding circuit initializing circuit 71 does not have effect on the operation of the state-holding circuit control circuit 64, when delay lines are relatively short, or when resetting by an external signal is not required, it is unnecessary, as described above.

Figure 10:
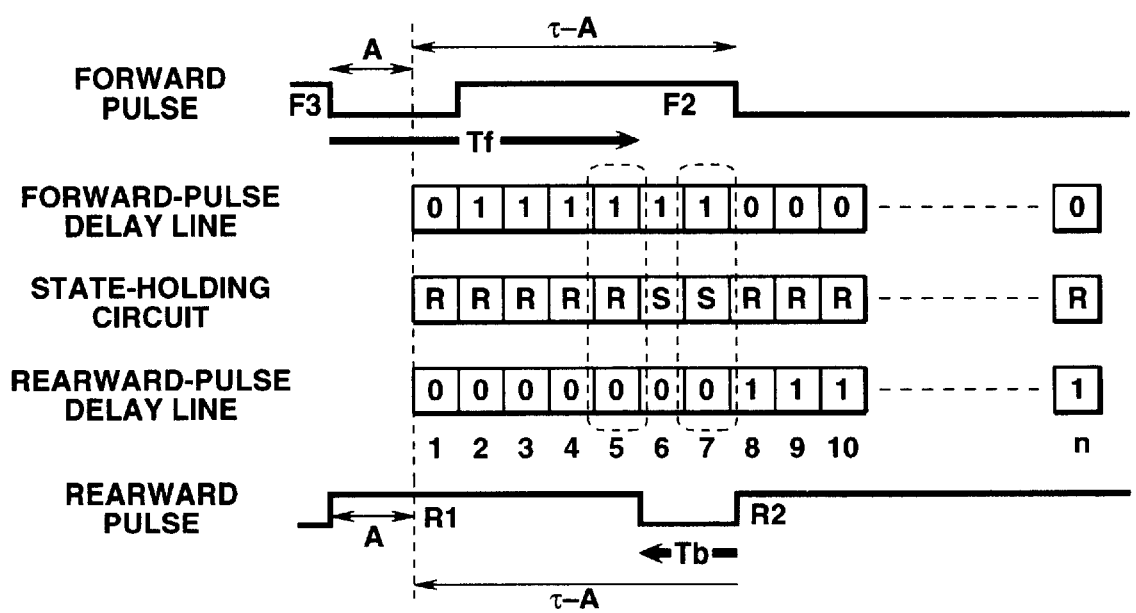
FIG. 10 is an explanatory view illustrating a problem which arises when the duty cycle of an external clock signal is large.
Figure 9A:
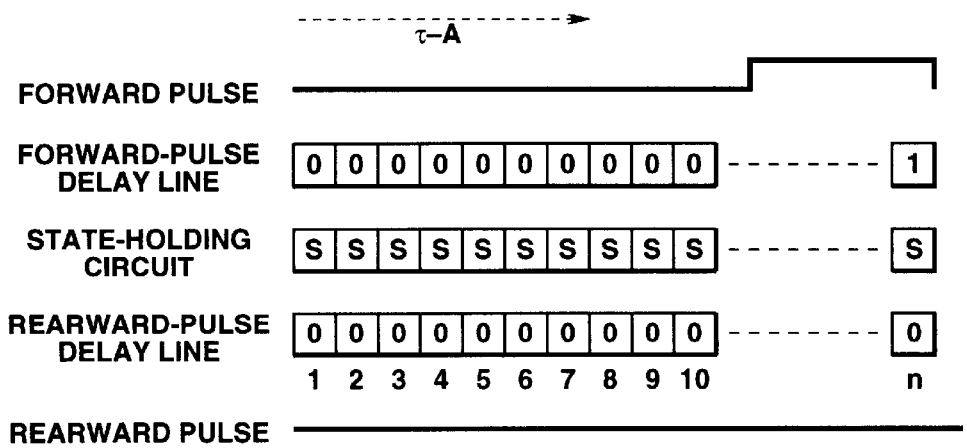
FIGS. 9A and 9B are explanatory views illustrating problems which arise when forward pulse is propagated up to the last stage.
Figure 9B:
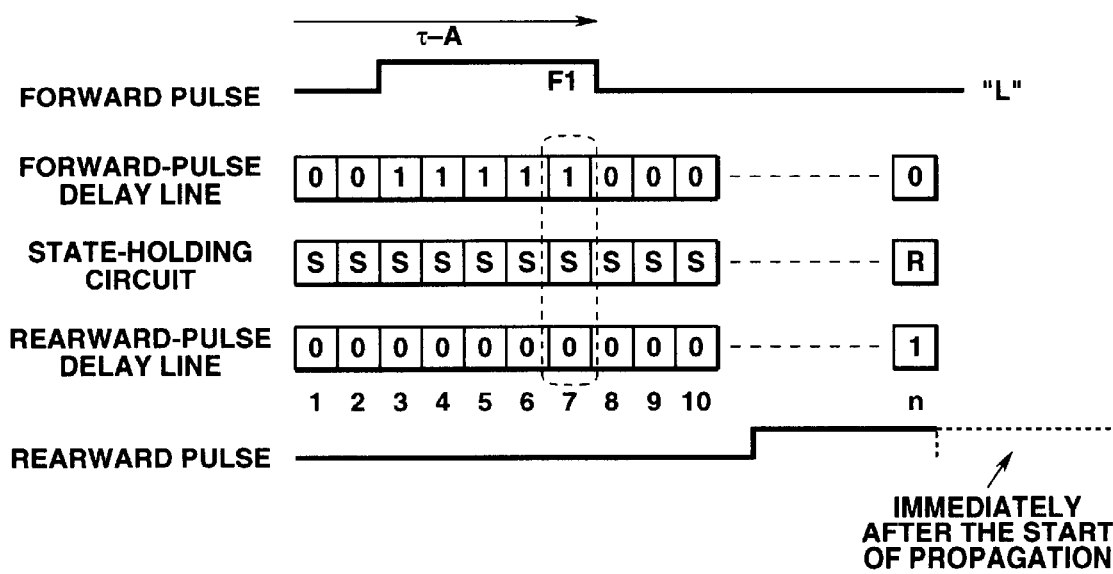

In this embodiment, it is designed so that, when rearward pulse is newly generated on the rearward-pulse delay line 83 while another rearward pulse is being propagated, and the duty of forward pulse and rearward pulse is heavy, the state shown in FIG. 10 is prevented from arising by shifting the timing of reset action of the state-holding circuit caused by the rearward pulse under propagation.

That is, in the state-holding circuit 82 in the embodiment in FIG. 11, the reset action is performed by the control pulse /P which becomes "L" only for the time A' from the time when rearward pulse was generated. In this embodiment, by adding the state-holding circuit control circuit 64, when the control pulse /P is generated while rearward pulse is being outputted from the rearward-pulse delay line 83, as shown in FIG. 19B, after outputting of the rearward pulse RCL if finished (namely, after R1 is outputted), the control pulse BPM at "L" is generated, and the reset operation is carried out.

Figure 19B:
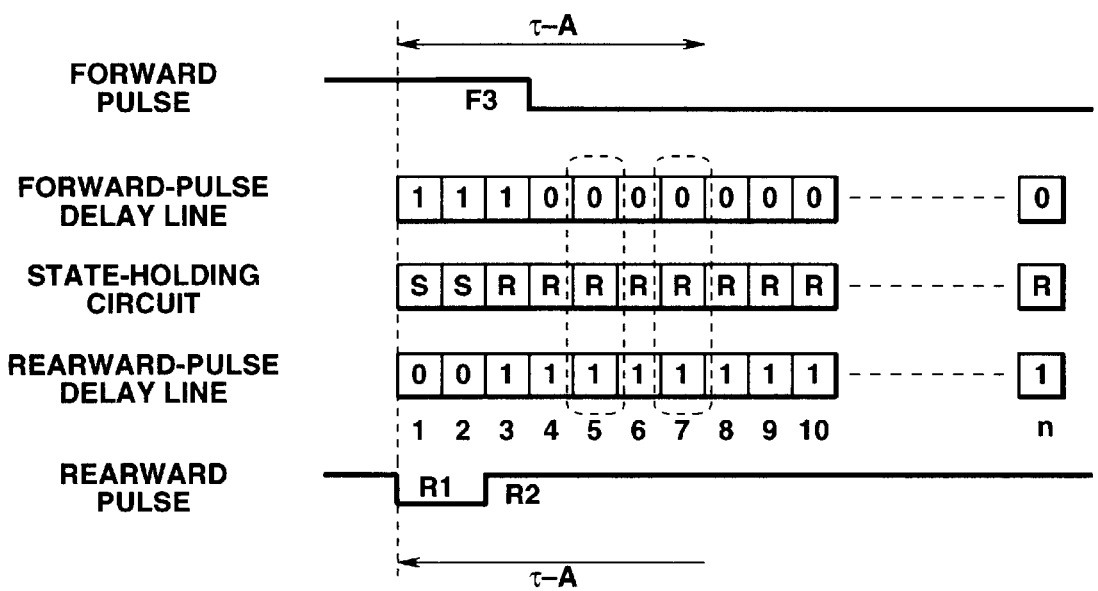
FIG. 19B is an explanatory view illustrating the embodiment of FIG. 19A.

In FIG. 19B, although forward pulse is propagated in the 3rd stage, the 3rd state-holding circuit is not in the set state. This is because rearward pulse is being propagated also in the 3rd stage at the resetting timing after the output of R1. Even in such a state, as the time to be reset is soon over, the circuit is brought back to the set state by forward pulse.

The state-holding circuit control circuit 64 is designed when the control pulse /P turns to "L" after rearward pulse was outputted from the rearward-pulse delay line 83, to output the control pulse BPM which becomes "L" synchronizing to this control pulse /P. With this operation, the state-holding circuit control circuit 64 is designed to prevent the state-holding circuit 82 from turning to the reset state R while rearward pulse RCL is being outputted.

Figure 20:
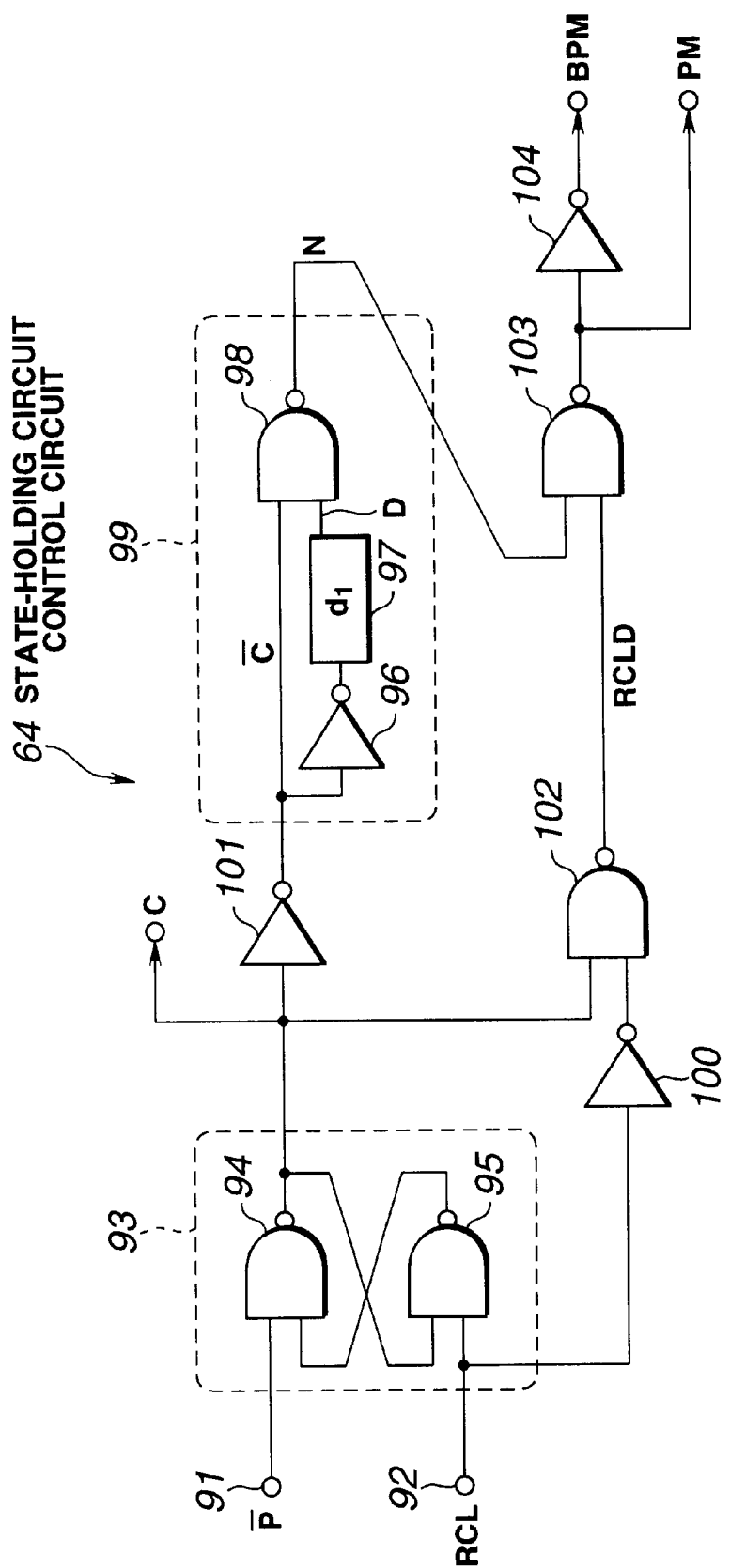
FIG. 20 is a circuit diagram showing a specific configuration of the state-holding circuit control circuit 64 shown in FIG. 19A.

FIG. 20 shows an example of configuration of the state-holding circuit control circuit 64 in FIG. 19A.

The state-holding circuit initializing circuit 64 comprises a flip flop 93, inverters 100, 101, 104, NAND circuits 102, 108 and a pulse generating circuit 99. To the input terminal 91, /P is inputted, and to the input terminal 92, RCL is inputted. Both /P and RCL are inputted to the flip flop 93, and RCL is inputted to the inverter 100. The output of the flip flop 93 is inputted to the inverter 101 and the NAND circuit 102. The output of the inverter 100 is inputted to the NAND circuit 102. The output of the inverter 101 is inputted to the pulse generating circuit 99. The output of the pulse generating circuit 99 and the NAND 102 is inputted to the NAND 103. The output of the NAND 103 is inputted to the inverter 104, and the output of the inverter 104 is outputted as the control signal BPM.

The flip flop 93 turns to "H" when the control pulse /P is "L" and the rearward pulse RCL is "H" it turns to "L" when the control pulse /P is "H" and the rearward pulse RCL is "L" and it outputs an output pulse C, which does not change, when both the control pulse /P and the rearward pulse RCL are "H". Also, the pulse generating circuit 99 comprises an inverter 96, a delay circuit 97 and a NAND circuit 98. For the pulse generating circuit 99, other circuits may be used so long as they can generate a negative pulse which falls synchronizing to the rising of input signals.

In this embodiment, however, the state-holding circuits 82-1, 82-2, . . . , 82-L of each delay unit 80 are controlled by, instead of the control pulse /P, a control pulse BPM from the state-holding circuit control circuit 64.

Namely, the state-holding circuits 82-1 to 82-L are designed to set the state signal Q so as to correspond to forward pulse when the control pulse BPM is "H" and when the control pulse BPM is "L" to set the state signal Q so as to correspond to rearward pulse. Accordingly, while the control pulse BPM is "H" the state signal Q is turned to "H" to the set state in a stage where forward pulse is propagated, and while the control pulse BPM is "L" the state signal Q is turned to "L" to the reset state in a stage where rearward pulse is propagated.

In this embodiment, units having the same configuration as that of the delay unit 4 shown in FIGS. 13A to 13C may be adopted as the delay unit 80. In this case, the clocked inverter 30, when the pMOS transistor 39 is turned on by the control pulse BPM's becoming "H" outputs a level corresponding to forward pulse to be supplied to the gate of the transistor 40, and when the transistor 38 is turned on by the control pulse BPM's becoming "L" outputs a level corresponding to rearward pulse to be supplied to the gate of the transistor 37. The inverter 36 inverts the output of the clocked inverter 30 and outputs it as the state signal Q to the terminal 34. The output of the clocked inverter 30 is outputted as the state signal /Q from the terminal 35.

Figure 21:
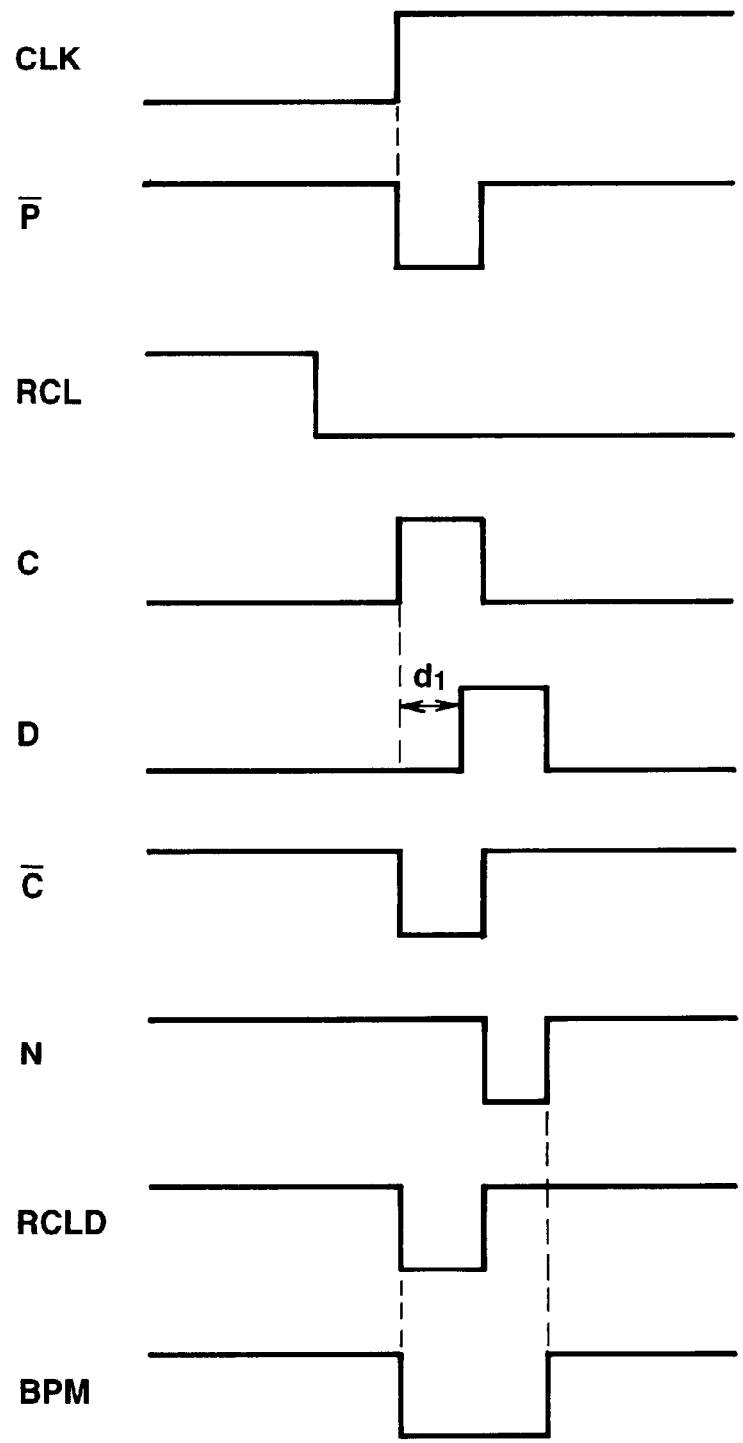
FIG. 21 is a waveform diagram illustrating the operation of the embodiment in FIG. 19A.
Figure 22:
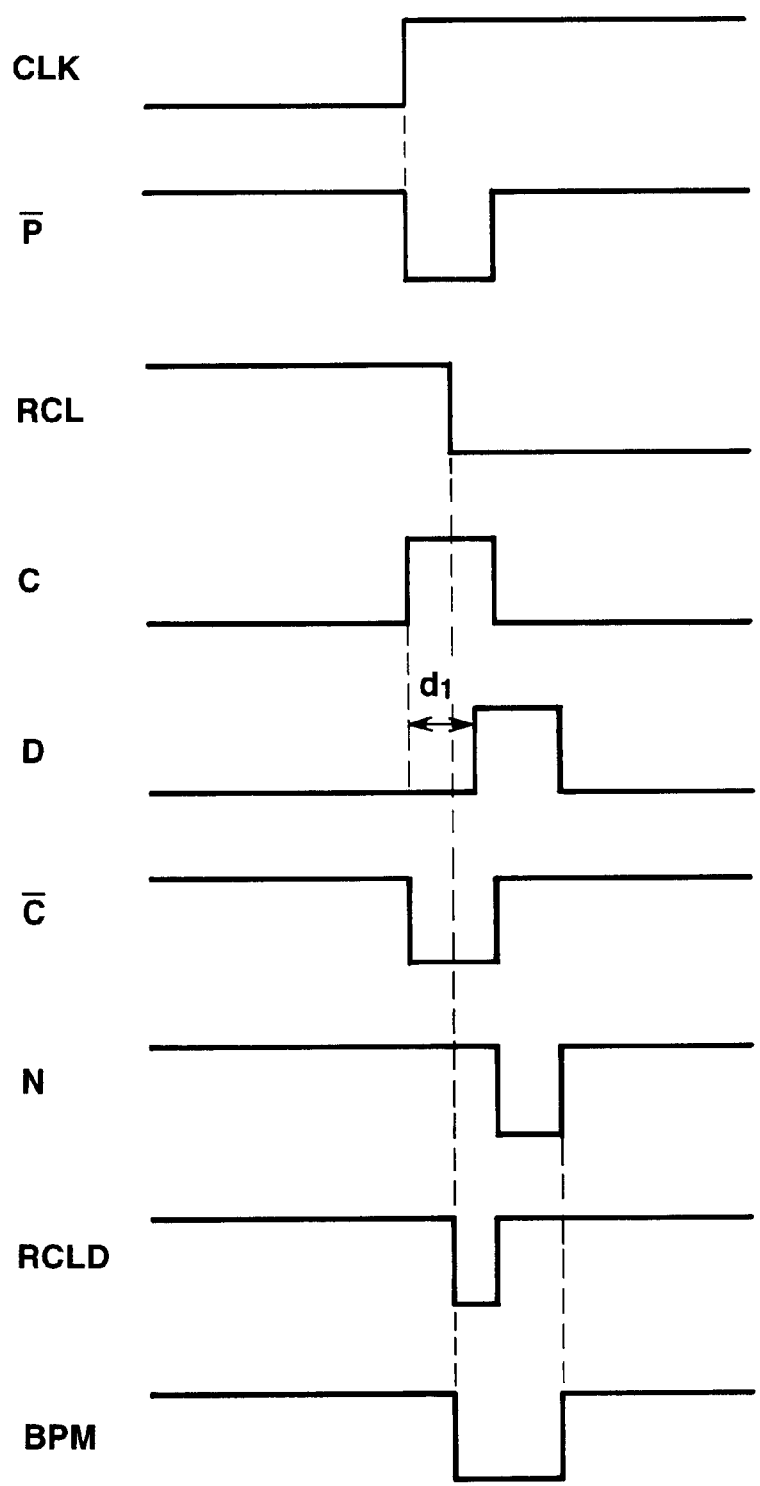
FIG. 22 is a waveform diagram illustrating the operation of the embodiment in FIG. 19A.
Figure 23:
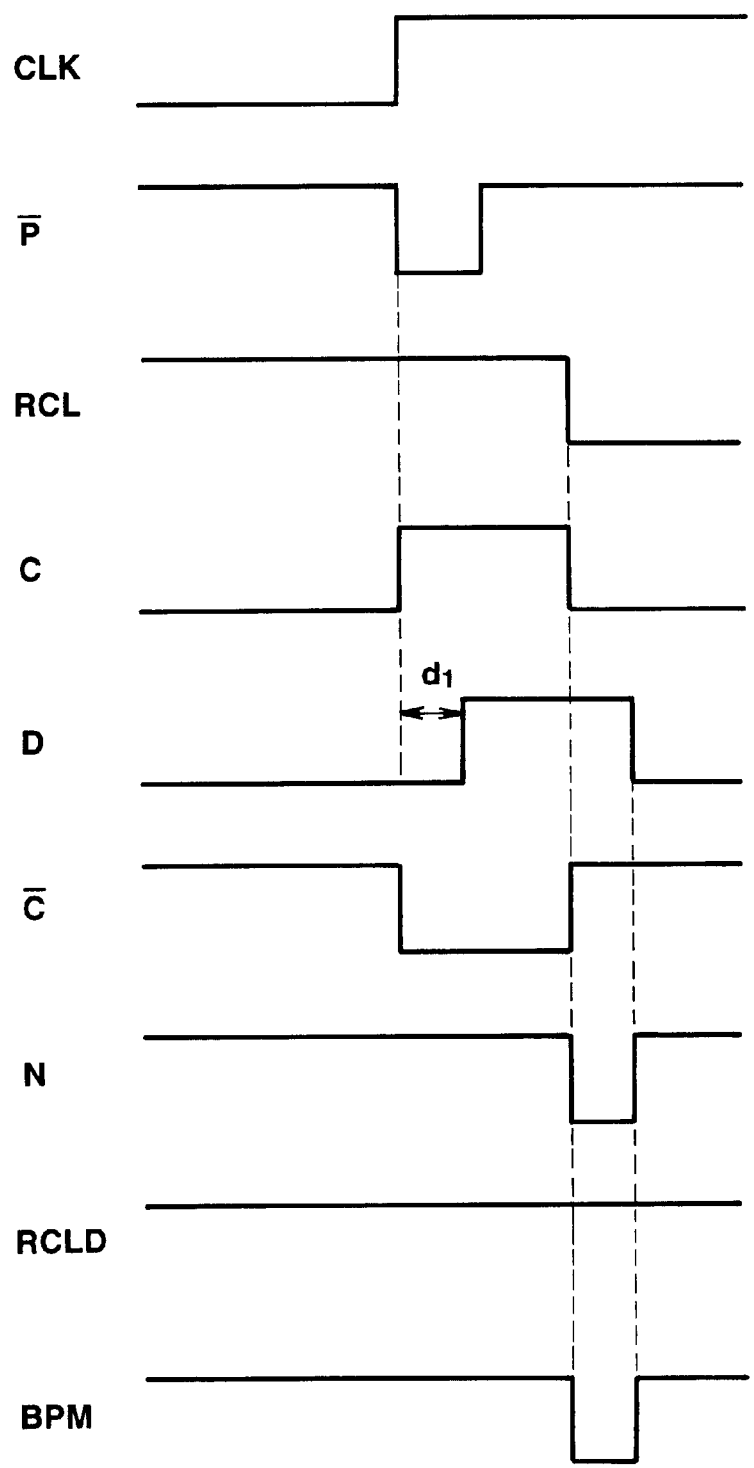
FIG. 23 is a waveform diagram illustrating the operation of the embodiment in FIG. 19A.

Next, the operation of an embodiment configured in such a manner will be described with reference to the waveform diagrams in FIGS. 21 to 23. FIGS. 21 to 23 show a clock signal CLK, a control pulse /P, a rearward pulse RCL, a pulse C, a pulse D, a pulse /C, a pulse N, a pulse RCLD and a control pulse BPM.

In this embodiment, propagation of forward pulse FCL by the forward-pulse delay line 81 is similar to that in the embodiment in FIG. 11. The operation that generation and propagation of rearward pulse is controlled by the state of a state-holding circuit is also similar to that of the embodiment in FIG. 11. The different point in this embodiment is that the method of setting the reset state corresponding to rearward pulse in the state-holding circuit.

That is, in this embodiment, as shown in FIG. 10, the state-holding circuit is controlled by the control pulse BPM from the state-holding circuit control circuit 64 so that the reset operation of the state-holding circuit due to rearward pulse under propagation is shifted when rearward pulse is newly generated on the rearward-pulse delay line 83 while rearward pulse is being propagated and the duty cycle of forward pulse and rearward pulse is large.

As for the generation timing of the control pulse /P and the falling timing of the rearward pulse RCL from the rearward-pulse delay line 83, there are three possible cases shown in FIGS. 21 to 23.

(I) A Case where the Rearward Pulse RCL Falls Before the Control Pulse /P is Generated (/P="L")

FIG. 21 shows an example of this case. In this case, as the output of rearward pulse from the rearward-pulse delay line has finished when the control pulse /P becomes "L" the state-holding circuit control circuit 64 generates the control pulse BPM which falls synchronizing to the falling of the control pulse /P.

That is, as the control pulse /P becomes "L" when the rearward pulse RCL is "L" the output pulse C of the flip flop 93 becomes as shown in FIG. 21. The inverter 101 generates the pulse /C shown in FIG. 21. The pulse C, as shown in FIG. 21, becomes the pulse D delayed by the time d1 from the pulse C by the inverters 101 and 96, and the delay circuit 97. Through NAND operation on the pulse D and the pulse /C, the pulse N shown in FIG. 21 is outputted from the NAND circuit 98.

As the NAND circuit 102 propagates rearward pulse RCL when the pulse C is "H" and when the pulse C is "L" outputs "H" the pulse RCLD, which falls synchronizing to the control pulse /P, is outputted from the NAND circuit 102 (see FIG. 21). The NAND circuit 103 performs NAND operation on the pulse RCLD and the pulse N, and the inverter 104 inverts the output of the NAND circuit 103 so as to obtain the control pulse BPM shown in FIG. 21. As a result, output of rearward pulse from the rearward-pulse delay line has been finished before the control pulse /P becomes "L" the control pulse BPM, which falls synchronizing to /P, is obtained.

(II) A Case where the Rearward Pulse RCL Falls During the Time when the Control Pulse /P is Generated (/P="L")

FIG. 22 shows an example of this case. In this case, as the output of rearward pulse finishes while the control pulse /P is "L" the state-holding circuit control circuit 64 generates the control pulse BPM which falls synchronizing to the falling of the rearward pulse RCL.

That is, as shown in FIG. 22, when the rearward pulse RCL falls while the control pulse /P is "L" the pulse C outputted from the flip flop 93 becomes as shown in FIG. 22. The pulse generating circuit 99 generates the pulse N which falls synchronizing to the falling of the pulse C and has a pulse width of d1. The NAND circuit 102 propagates the rearward pulse RCL when the pulse C is "H" and outputs "H" when the pulse C is "L" Consequently, a pulse RCLD, which falls synchronizing to the rearward pulse RCL, is outputted from the NAND circuit 102, as shown in FIG. 22. The NAND circuit 103 performs NAND operation on the pulse RCLD and the pulse N. The inverter 104 inverts the output of the NAND circuit 103 and generates the control pulse BPM shown in FIG. 22. In this case, different from the aforesaid case (I), the control pulse BPM has fallen synchronizing to the falling of the rearward pulse RCL. As a result, when output of rearward pulse finishes while the control pulse /P is "L" the control pulse BPM, which falls at the same time as output of rearward pulse finishes, is obtained.

(III) A Case where the Rearward Pulse RCL Falls After the Time when the Control Pulse /P is Generated (/P="L")

FIG. 23 shows an example of this case. In this case, as the control pulse /P becomes "L" while rearward pulse is being outputted from the rearward-pulse delay line 83, the state-holding circuit control circuit 64 generates the control pulse BPM which falls synchronizing to the falling of the rearward pulse RCL.

As shown in FIG. 23, as the control pulse /P falls when the rearward pulse RCL is "H" the flip flop 93 outputs the pulse C which becomes "H" during the time from the falling of the control pulse /P to the rising of the rearward pulse RCL. The pulse generating circuit 99 generates the pulse N which falls at the falling of the pulse C and has a pulse width of d1. As the NAND circuit 102 propagates the rearward pulse RCL when the pulse C is "H" and outputs "H" when the pulse C is "L" from the NAND circuit 102, the pulse RCLD, which is fixed at "H" is outputted as shown in FIG. 23. This pulse RCLD and the pulse N and a control pulse (see FIG. 23) which is the inverted result of NAND operation, are outputted from the inverter 104. That is, the control pulse BPM falls synchronizing to the falling of the rearward pulse RCL. As a result, when a control pulse becomes "L" while rearward pulse is being outputted from a rearward-pulse delay line, the control pulse BPM, which falls at the same time as output of rearward pulse ends, is obtained.

As shown in FIGS. 21 to 23 corresponding to said cases (I) to (III), the control pulse BPM becomes "L" after the rearward pulse RCL from the rearward-pulse delay line 83 became "L" in any of the cases. When the control pulse BPM is "L" each state-holding circuit of the state-holding circuit 82 shows the reset state in a stage where rearward pulse is propagated. This means that they are not set to the reset state while rearward pulse is being propagated.

For example, as shown in FIG. 10, when the clock signal CLK from the receiver 2 is inputted to the rearward-pulse delay line 83 while rearward pulse R1 is being outputted from the rearward-pulse delay line 83, the control pulse BPM, which turns the state-holding circuit 82 to the reset state R, is generated, as shown in FIG. 19B, after the rearward pulse R1 was outputted as shown in FIG. 19B. Consequently, even when two rearward pulses never exist on the rearward-pulse delay line 83, the state-holding circuit 82 is not turned to the reset state R, and even when the pulse widths of forward pulse and rearward pulse are larger than τ/2, the newly generated rearward pulse is securely propagated up to the first stage.

Thus, in this embodiment, as the state-holding circuit 82 is controlled by the control pulse BPM generated after rearward pulse was outputted from the rearward-pulse delay line 83, rearward pulse is securely propagated to the first stage and the internal clock signal CK' synchronizing to the external clock signal CK can be generated even when two rearward pulses exist on the rearward-pulse delay line 83 and the pulse widths of forward pulse and rearward pulse are larger than τ/2.

Figure 24:
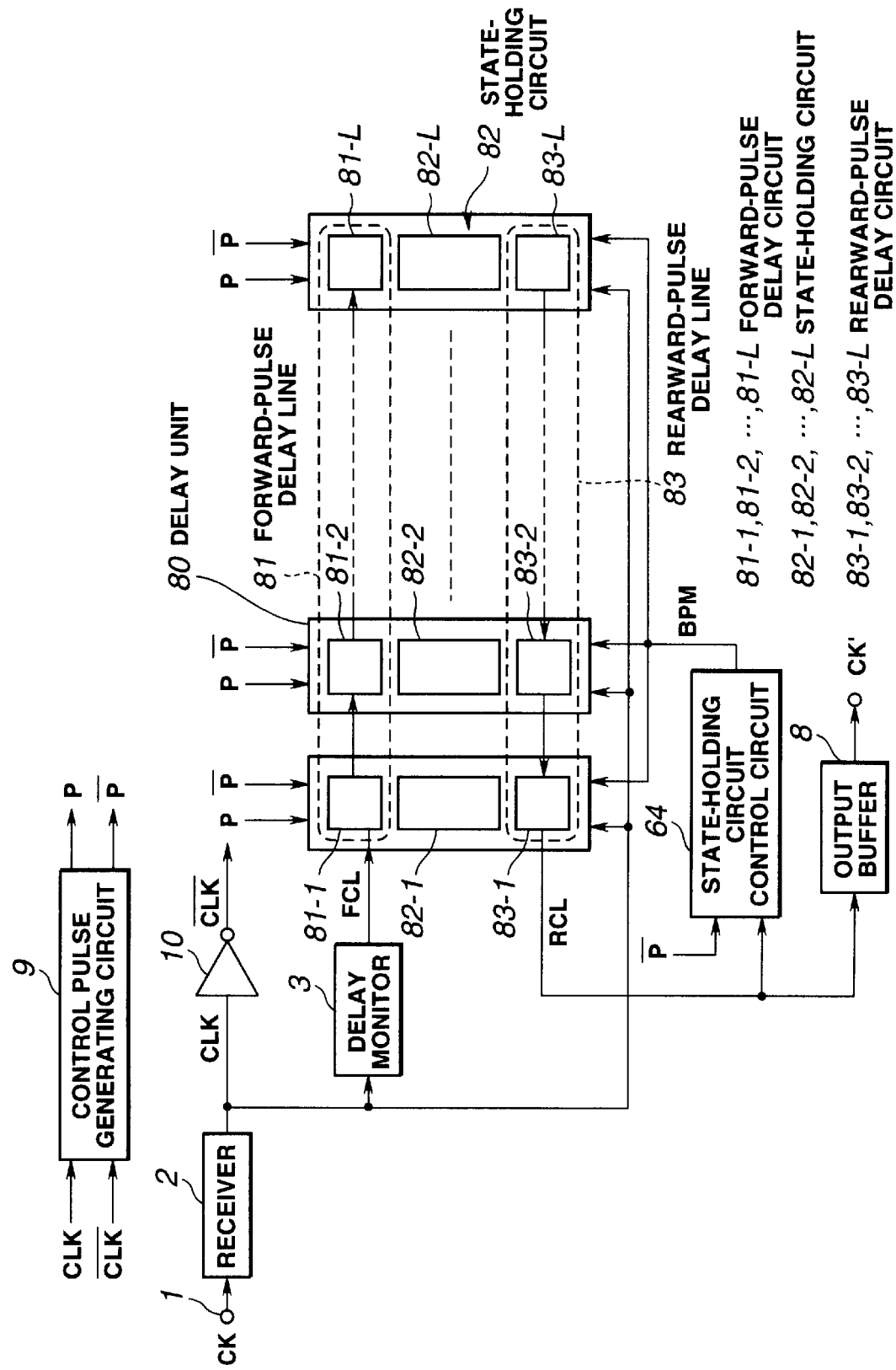
FIG. 24 is a block diagram showing another embodiment of the present invention.

FIG. 24 is a block diagram showing another embodiment of the present invention. As described above, the state-holding circuit initializing circuit 71 has no effect on the operation of the state-holding circuit control circuit 64. Accordingly, even when the state-holding circuit initializing circuit 71 is eliminated from FIG. 19A, problems, which arise when the pulse widths of forward and rearward pulses are larger than τ/2, are solved. FIG. 24 shows an example of this case. FIG. 24 differs from the embodiment in FIG. 19A in points that the state-holding circuit initializing circuit 71 is eliminated.

Other configuration and operation are similar to those of the embodiment in FIG. 19A.

Figure 25:
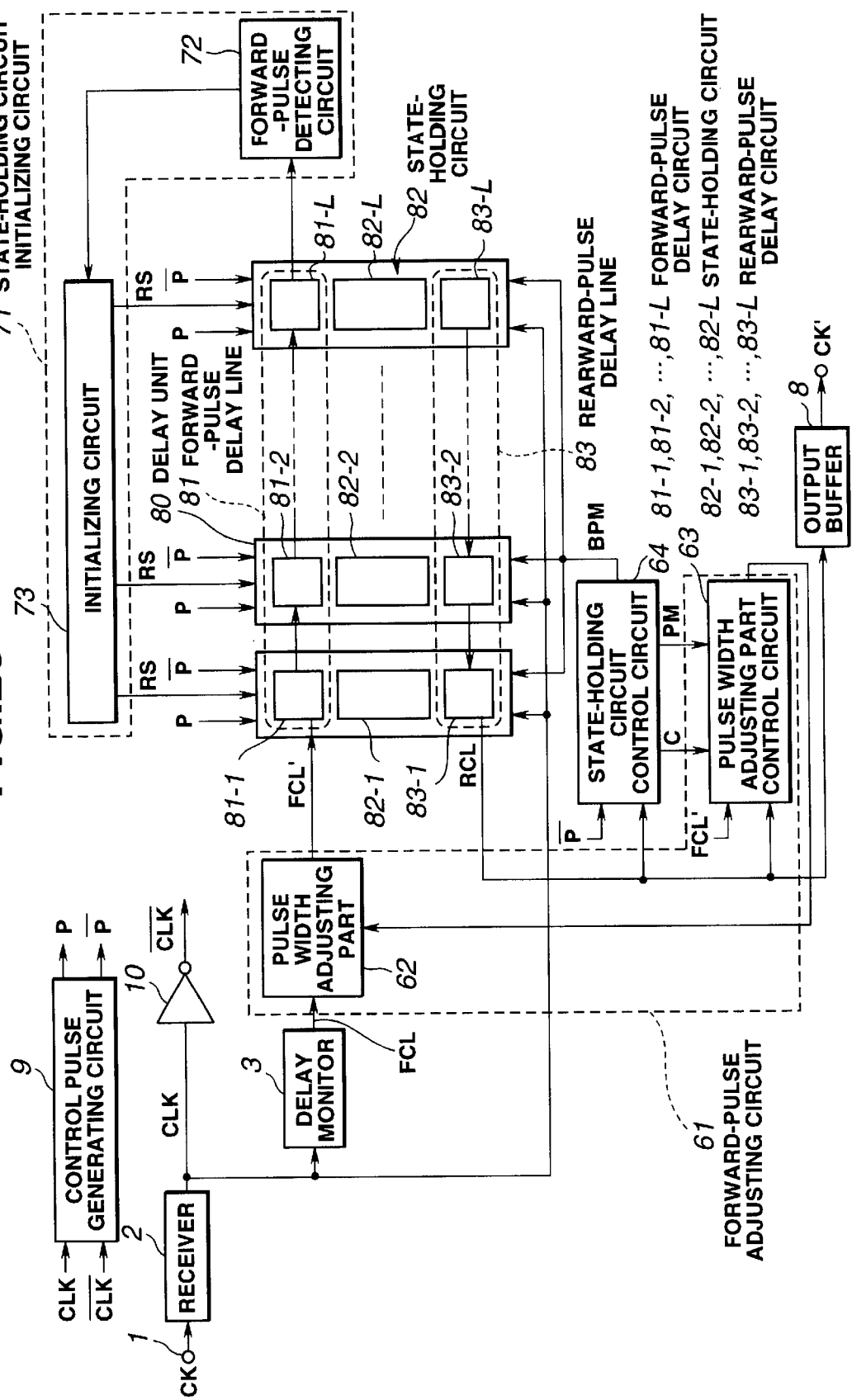
FIG. 25 is a circuit diagram showing another embodiment of the present invention.
Figure 26A:
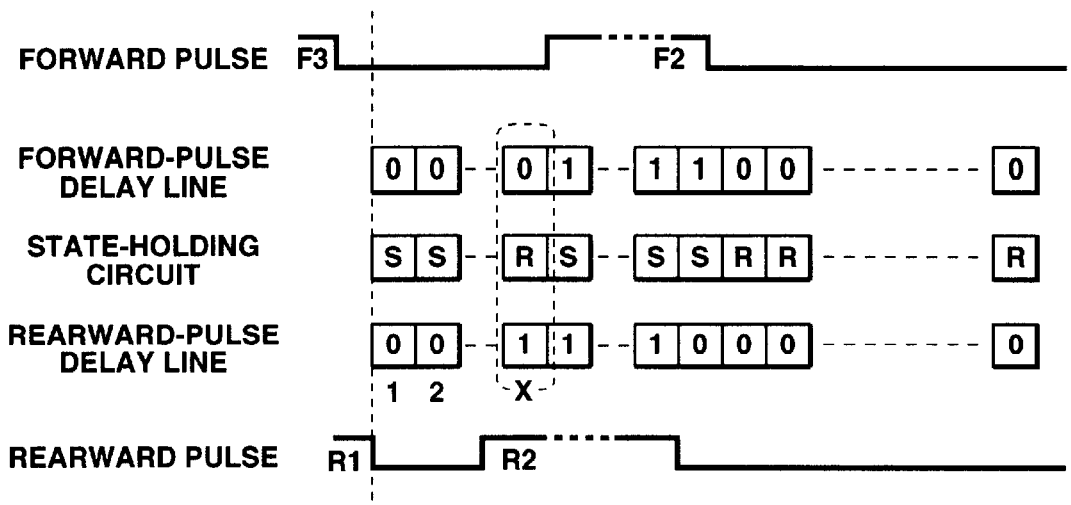
FIGS. 26A and 26B is an explanatory view illustrating the operation of the embodiment in FIG. 25.
Figure 26B:
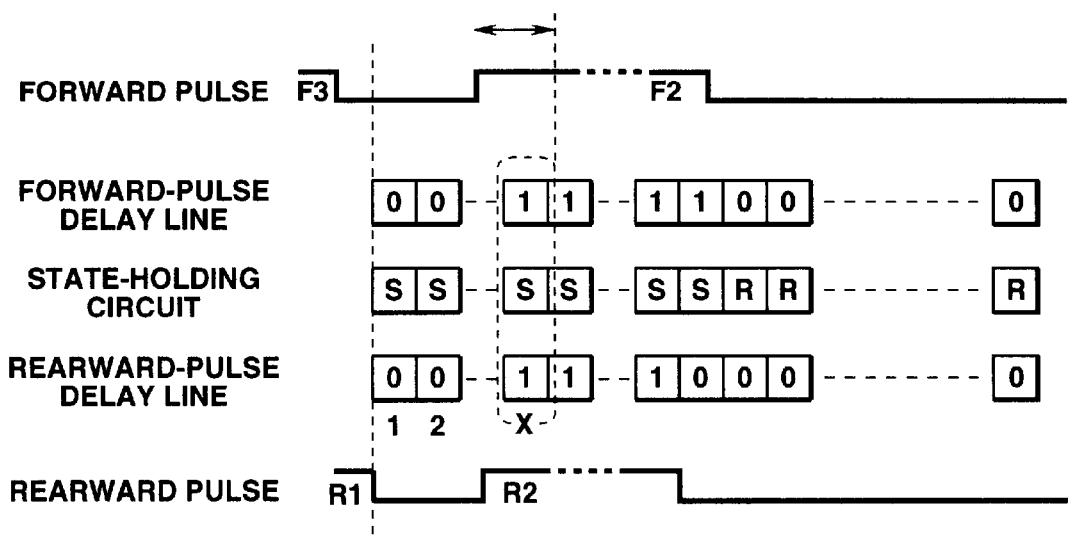

FIG. 25 is a circuit diagram showing another embodiment of the present invention. In FIG. 25, the same elements as those in FIG. 19A are given the same reference numerals and description about them is omitted. FIGS. 26A and 26B are explanatory views illustrating the embodiment in FIG. 25.

This embodiment differs from that in FIG. 19A in points that the forward-pulse adjusting circuit 61 is added. For the delay unit 80, a unit having the same configuration as that of the delay unit 4 in the example of a related art may be adopted, or one with other configuration also may be adopted so long as it has equal functions. The forward-pulse adjusting circuit 61 is used in order to establish, operating together with the state-holding circuit control circuit 64, synchronization between an external clock signal and an internal clock signal even when the duty of the external clock signal is heavy. As described above, since the state-holding circuit initializing circuit 71 has no effect on the operation of the forward-pulse adjusting circuit 61 and the state-holding circuit control circuit 64, it is unnecessary when delay lines are relatively short or when resetting by an external signal is not required.

In the embodiment in FIG. 19A, adoption of the state-holding circuit control circuit 64 prevents a case like the example shown in FIG. 10, for example, where propagation of rearward pulse inputted from the 7th stage is stopped in the 5th stage due to the state-holding circuit 82's being reset by rearward pulse under propagation.

However, here arises a new case where propagation of rearward pulse is stopped by a function of the state-holding circuit control circuit 64. FIG. 26A illustrates this case. In order to simplify the drawing, FIG. 26A does not show exact positions of forward pulse and rearward pulse.

In an STBD, the generated rearward pulse is propagated up to the first stage by forward pulse's being propagated by the forward-pulse delay line 81 in the first stage up to a stage corresponding to the time (τ−A) and turning the state-holding circuit to the set state. However, the state-holding circuit control circuit 64 generates the control pulse BPM after rearward pulse was outputted from the rearward-pulse delay circuit 83, and the state-holding circuit is set to the reset state by the rearward pulse being propagated. Regardless of whether forward pulse has been propagated up to a predetermined stage or not, the control pulse BPM is sometimes generated when there are delay units for rearward pulse to be propagated by after forward pulse has passed.

For example as shown in the x-th stage in FIG. 26A, it sometimes occurs that, after forward pulse to turn the x-th stage to the set state passed the x-th stage, the x-th stage is reset by rearward pulse. A state-holding circuit like the 3rd state-holding circuit as shown in FIG. 19B, where rearward pulse is propagated while forward pulse is propagated, is brought back to the set state from the reset state even when BPM's "L" time is over (the time to reset the state-holding circuit) because forward pulse is propagated.

However, in the x-th stage as shown in FIG. 26A, since forward pulse has already passed the stage, the circuit cannot get back to the set state even when the time to be reset is over. If this happens, in a stage turned to the reset state, a clock signal is inputted from the rearward-pulse delay circuit 83-x and propagated from a different stage from the stage corresponding to (τ−A) as rearward pulse, making synchronization impossible to be established.

This embodiment enables to solve the problem in this case.

That is, when conditions are ready for bringing a state as in FIG. 26A, a state where the x-th stage becomes unable to return back to the set state is prevented by elongating the width of forward pulse as shown in FIG. 26B.

In this embodiment, forward pulse FCL from the delay monitor 3 is supplied to the forward-pulse delay circuit 81-1 via the forward pulse adjusting circuit 61. The forward pulse adjusting circuit 61 changes the pulse width of forward pulse FCL and supplies the corrected forward pulse FCL' to the forward-pulse delay line 81.

The forward pulse adjusting circuit 61 is designed to keep the input signal of the forward-pulse delay line 81 (forward pulse FCL') at "H" until the control pulse BPM becomes "H" when the control pulse BPM at "L" is generated while rearward pulse RCL is being outputted or after output of rearward pulse RCL finished, and when forward pulse is inputted to the forward-pulse delay line 81 while this control pulse BPM is being generated. The forward-pulse adjusting circuit 61 is designed to supply the output of the delay monitor 3 as it is as the forward pulse FCL' to the forward-pulse delay line 81 when the forward pulse FCL is turned to "H" and outputted from the delay monitor 3 after the output of rearward pulse is finished.

With this operation, an input signal to the forward-pulse delay line 81 can be kept at "H" while rearward pulse is being outputted. Thus, delay units, where rearward pulse is propagated after forward pulse passed as in the x-th state of FIG. 26 and which are turned to the reset state, can be eliminated.

Figure 27:
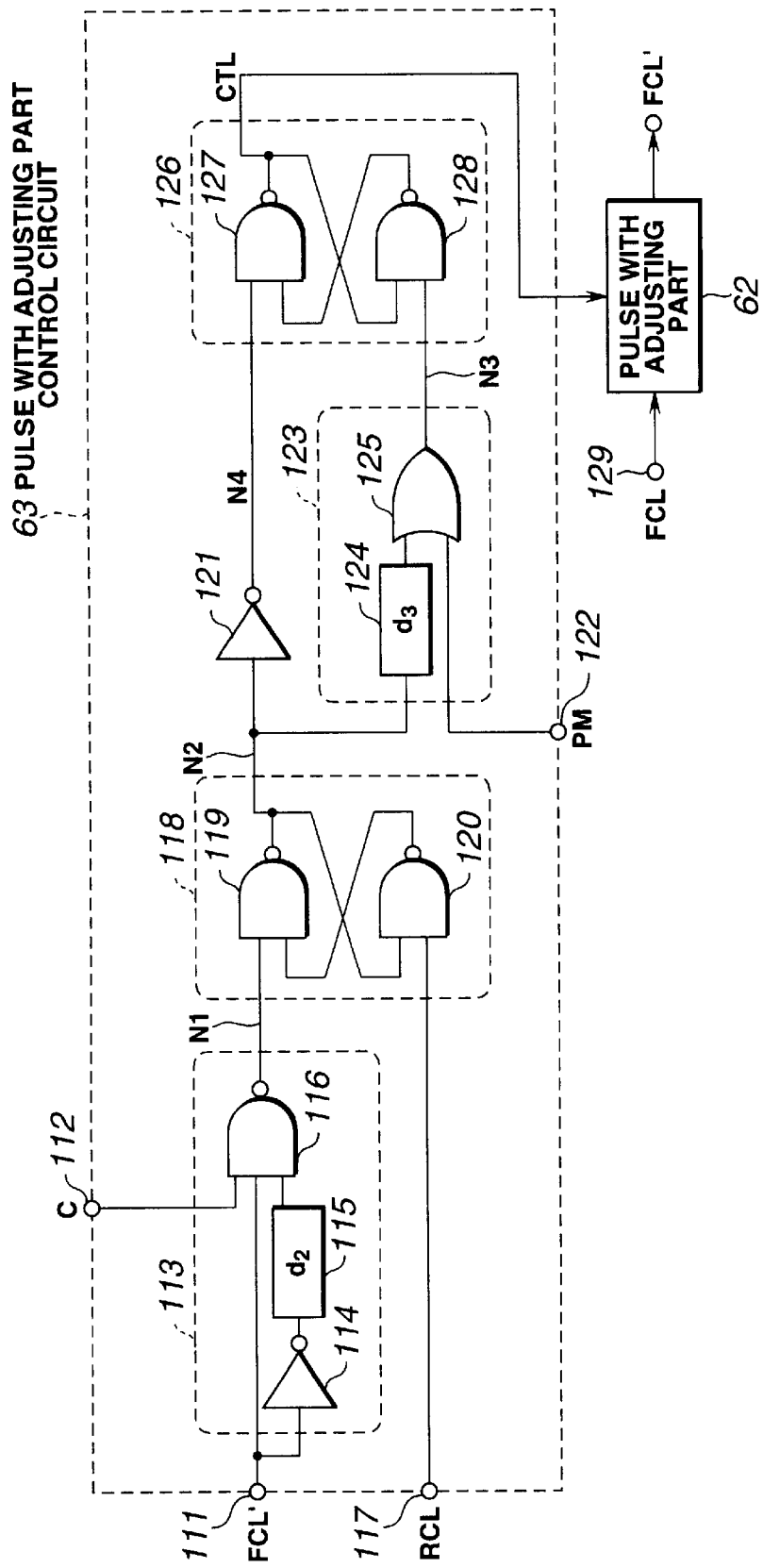
FIG. 27 is a circuit diagram showing a specific configuration of the forward-pulse adjusting circuit 61 shown in FIG. 25.

FIG. 27 is a circuit diagram showing an example of a specific configuration of the forward-pulse adjusting circuit 61 in FIG. 25.

The forward-pulse adjusting circuit 61 comprises a pulse width adjusting part control circuit 63 and a pulse width adjusting part 62. The pulse width adjusting part control circuit 63 examines the relation between the pulse C from the state-holding circuit control circuit 64 and the forward pulse FCL from the delay monitor 3 and determines whether the forward pulse FCL is to be supplied as it is as a forward pulse FCL' to the forward-pulse delay line 81 or the forward pulse FCL has to have its pulse width enlarged and to supply the corrected forward pulse FCL' supplied.

In FIG. 27, to an input terminal 111 of the pulse width adjusting part control circuit 63, the forward pulse FCL from the delay monitor 3 is inputted and to an input terminal 117, the rearward pulse RCL from the rearward-pulse delay line 83 is inputted. To input terminals 112 and 122, the pulse C and the pulse PM from the state-holding circuit control circuit 64 are inputted respectively.

The pulse width adjusting part control circuit 63 comprises pulse generating circuits 113 and 123, flip flops 118 and 126 and an inverter 121. The pulse generating circuit 113 is configured with an inverter 114 to invert the forward pulse FCL inputted from the terminal 111, a delay circuit 115 to delay the output of the inverter 114 by the time d2 and a NAND circuit 116 to perform NAND operation on pulse C, forward pulse FCL and the output of the delay circuit 115. The pulse generating circuit 113 outputs pulse N1, which falls at the rising of the forward pulse FCL and has a pulse width of d2, when both the pulse C and the forward pulse FCL become "H".

The flip flop 118 comprises a NAND circuit 119, to which the pulse N1 is inputted, and a NAND circuit 120 to which the rearward pulse RCL is inputted from the terminal 117. The flip flop 118 becomes "H" when the pulse N1 is "L" and the rearward pulse RCL is "H" it becomes "L" when the pulse N1 is "H" and the rearward pulse RCL is "L" and it outputs the output pulse N2, which does not change, when both the pulse N1 and the rearward pulse RCL are "H" The pulse N2 is supplied to the inverter 121 and the pulse generating circuit 123. The inverter 121 outputs a pulse N4, which is an inverted signal of the pulse N2, to the flip flop 126.

The pulse generating circuit 123 comprises a delay circuit 124 with the delay time d3 and an OR circuit 125. The pulse generating circuit 123 delays the pulse N2 by the time d3 using the delay circuit 124, performs OR operation on this delay signal and the pulse PM from the state-holding circuit control circuit 64 inputted via the terminal 122, and outputs a pulse N3 using an OR circuit 125. The pulse N3 is a pulse which rises being delayed by the time d3 from the rising of the pulse N2 and falls at the falling of the pulse PM.

A flip flop 126 comprises NAND circuits 127 and 128. To the NAND circuit 127, the pulse N4 is supplied, and to the NAND circuit 128, the pulse N3 is supplied. The flip flop 126 is designed to turn to "H" when the pulse N4 is "L" and the pulse N3 is "H", to turn to "L" when the pulse N4 is "H" and the pulse N3 is "L", and to output a pulse with no change as the control pulse CTL to the pulse width adjusting part 62 when both the pulses N4 and N3 are "H".

Figure 28:
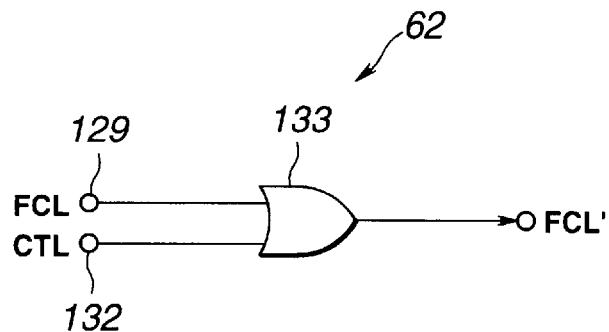
FIG. 28 is a circuit diagram showing a specific configuration of the pulse width adjusting part 62 shown in FIG. 25.

FIG. 28 is a circuit diagram showing a specific configuration of the pulse width adjusting part 62 in FIG. 25.

The pulse width adjusting part 62 may be configured with, for example, OR circuits 133. The OR circuit 133 is designed to perform OR operation on the forward pulse FCL from the delay monitor 3 inputted via a terminal 129 and the control pulse CTL from the pulse width adjusting part control circuit 63, and to supply the result of operation to the forward-pulse delay line 81 as the forward pulse FCL'. Other circuits may be used so long as they can perform OR operation. As the pulse width adjusting part 62 is added between the delay monitor 3 and the forward-pulse delay line 81, in order to meet the condition of A+ (delay time of the pulse width adjusting part)=D1+D2, a circuit having a delay time equal to that of the pulse width adjusting part 62 is added to the receiver 2 or the output buffer 8.

Figure 30:
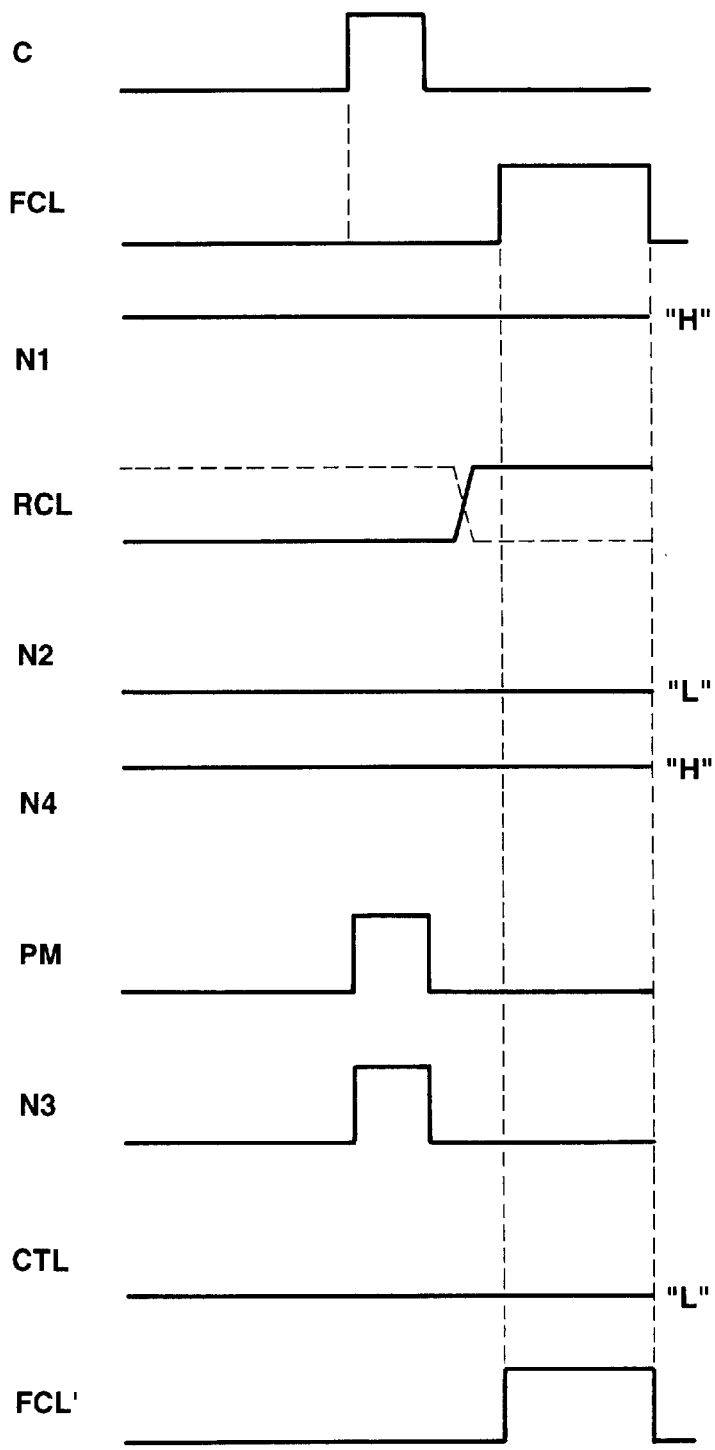
FIG. 30 is a waveform diagram illustrating the operation of the embodiment in FIG. 25.
Figure 31:
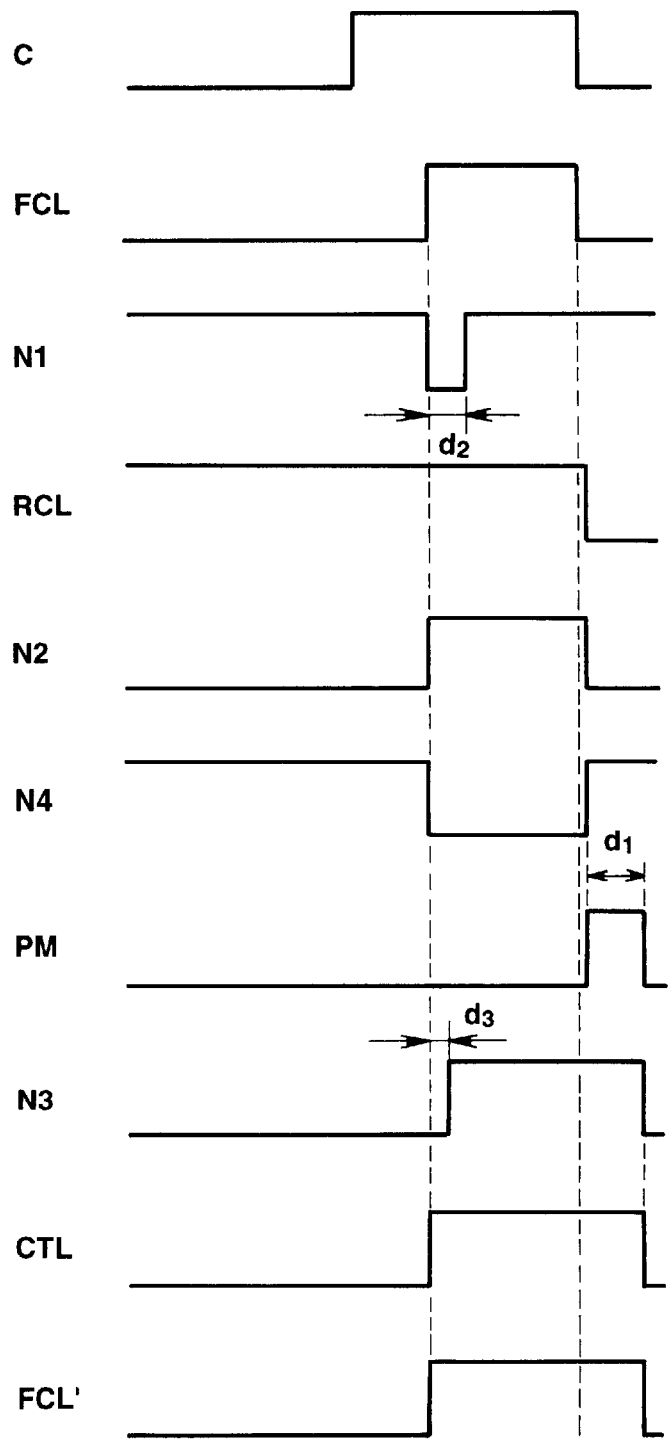
FIG. 31 is a waveform diagram illustrating the operation of the embodiment in FIG. 25.
Figure 32:
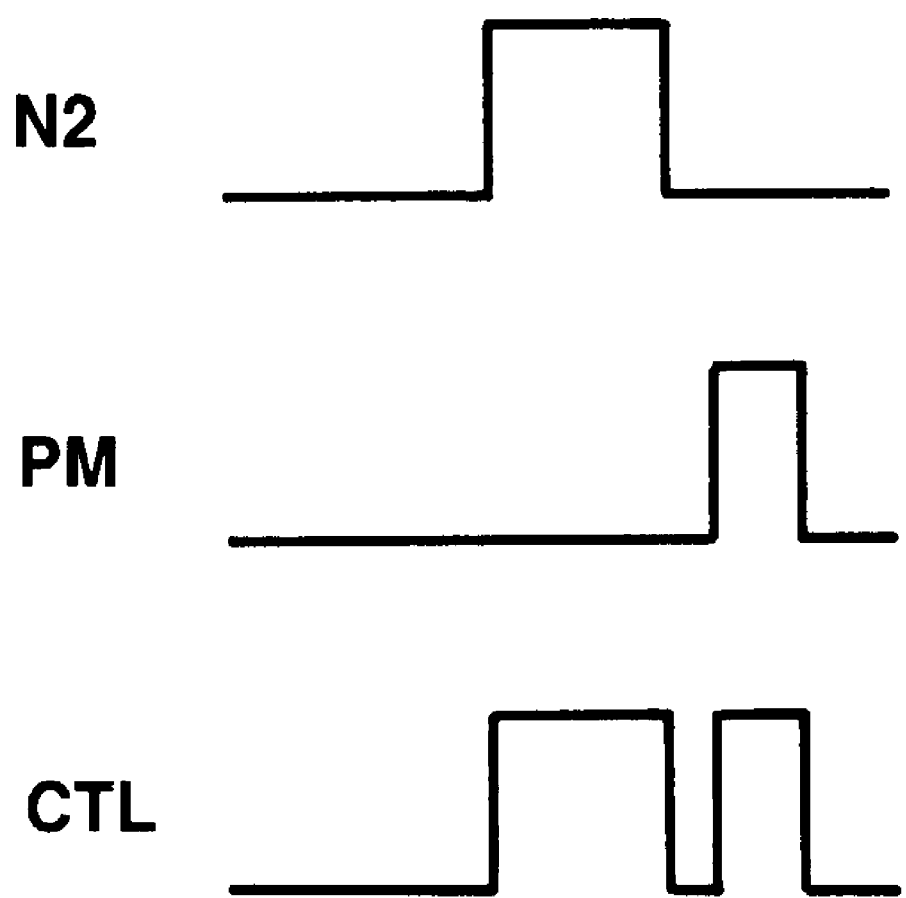
FIG. 32 is a waveform diagram illustrating the operation of the embodiment in FIG. 25.

Now, the operation according to an embodiment configured in such a manner will be described with reference to the flowchart in FIG. 29 and the waveform diagrams of FIGS. 30 to 36. FIGS. 30 to 32 illustrate the operation of the forward pulse adjusting circuit 61. FIGS. 30 to 32 show the pulse C, the forward pulse FCL from the delay monitor 3, the pulse N1 shown in FIG. 27, the rearward pulse RCL from the rearward-pulse delay line 83, the pulse N2 shown in FIG. 27, the pulse N4, the pulse PM, the pulse N3, the control pulse CTL and the corrected forward pulse FCL'.

This embodiment differs from that in FIG. 19A only in points that the pulse width of forward pulse to be supplied to the forward-pulse delay line 81 is adjusted. FIG. 29 shows the operation flow in this embodiment. The processes in steps S1 to S3 in FIG. 29 are performed by the state-holding circuit control circuit 64, and the ones in steps S4 to S6 are performed by the forward-pulse adjusting circuit 61.

The process performed by the state-holding circuit control circuit 64 is similar to that in FIG. 19A. Namely, in step S1, the state-holding circuit control circuit 64 examines whether rearward pulse RCL is "H" or not (namely, whether rearward pulse is being outputted or not) when the control pulse /P rose. When the rearward pulse RCL is "H" it shifts the process to step S2 and generates the control pulse BPM after rearward pulse RCL became "L". When the rearward pulse RCL is "L" it shifts the process to step S3 and generates the control pulse BPM which is synchronized to the control pulse /P.

Now, the operation of the forward pulse adjusting circuit 61 will be described with reference to FIGS. 30 to 32.

As the forward pulse adjusting circuit 61 is used in order to remove problems which newly arise from controlling by the state-holding circuit control circuit 64, when the control pulse BPM from the state-holding circuit control circuit 64 has been synchronized to the control pulse /P, as shown in step S 6 in FIG. 28, it is supplied as it is to the forward-pulse delay line 81 as the forward pulse FCL' without elongating the pulse width of the forward pulse FCL.

Even when the state-holding circuit control circuit 64 generates the control pulse BPM which is not synchronized to the control pulse /P, sometimes, the pulse width of the forward pulse FCL' need not be elongated. The pulse width adjusting part control circuit 63 of the forward-pulse adjusting circuit 61 determines whether a change is required or not in the pulse width of forward pulse FCL' by examining the relation between the output pulse C from the state-holding circuit control circuit 64 and the forward pulse FCL'. Now, the description will be given assuming that the rising timing and the falling timing of forward pulse mean timings at a point of time when forward pulse is outputted from the delay monitor 3 and when it is inputted to the forward-pulse delay line 81.

For the timing when the output pulse C of the state-holding circuit control circuit 64 is generated and the timing when the forward pulse FCL rises, two patterns shown in FIGS. 30 and 31 are possible. The pulse width adjusting part control circuit 63 examines whether rearward pulse RCL is "H" or not when forward pulse FCL rose in step S4 in FIG. 28.

(IV) A Case where Forward Pulse FCL' Rises After the Pulse C Fell

FIG. 30 shows an example of this case. In this case, as rearward pulse has been thoroughly outputted from rearward-pulse delay lines before the input of forward-pulse delay lines, FCL', rises, the control pulse CTL from the pulse width adjusting part control circuit 63, as shown in FIG. 30, is fixed at "L" As CTL="L" in the initial state, the output of the delay monitor 3, FCL, and OR at "L" are inputted to delay lines as FCL' (the rising of FCL and that of FCL' are synchronized).

That is, as shown in FIG. 30, when forward pulse FCL rises (namely, FCL' rises) after the pulse C fell, the output pulse N1 of the pulse generating circuit 113 is fixed at "H". If rearward pulse RCL changes from "H" to "L" or from "L" to "H" in this state, the pulse N2 outputted from the flip flop 118 is fixed at "L". As a result, the input pulse N4 of the flip flop 126 is fixed at "H". The pulse generating circuit 123 delays the pulse N2 by the time d3 using the delay circuit 124, performs OR operation with the output pulse PM of the state-holding circuit control circuit 64, and generates the pulse N3 (see FIG. 30). When this pulse N3 falls, the output control pulse CTL of the flip flop 126 is fixed at "L".

This output control pulse CTL is supplied to the pulse width adjusting part 62. As the pulse width adjusting part 62 is an OR circuit, the control pulse CTL is fixed at "L" in this case, the pulse width adjusting part 62 supplies forward pulse FCL as it is to the forward-pulse delay line 81 as forward pulse FCL' in step S6 in FIG. 28. Consequently, when forward pulse is inputted after rearward pulse was outputted out from the rearward-pulse delay lines, the pulse width of forward pulse is held as it (V) A Case where Forward Pulse FCL Rises While the Pulse C is "H"

FIG. 31 shows an example of this case. In this case, as rearward pulse is being outputted from rearward-pulse delay lines (RLC="H" when FCL', the input of forward-pulse delay lines, rises, the control pulse CTL from the pulse width adjusting part control circuit 63 becomes a pulse, as shown in FIG. 31, which rises synchronizing to the rising of the control pulse FCL and falls synchronizing to the output signal PM (PM is an inverted signal of BPM) of the state-holding circuit control circuit 64. As CTL="L" in the initial state, FCL, the output of the delay monitor 3, and OR at "L" are inputted to delay lines as FCL' (the rising of FCL and that of FCL' are synchronized).

That is, as shown in FIG. 31, when forward pulse FCL rises while the pulse C is "H" namely, when FCL' rises, the pulse generating circuit 113, as shown in FIG. 31, becomes "H" when the pulse C is "L" falls synchronizing to the rising of the forward pulse FCL when the pulse C is "H" and generates the pulse N1 having a pulse width of d2. The pulse N2, the output of the flip flop 118. rises synchronizing to the rising of the pulse N1, and falls synchronizing to the falling of the rearward pulse RCL. The pulse generating circuit 123 generates the pulse N3 through OR operation on the pulse PM, which rises synchronizing to the falling of the rearward pulse RCL, and a signal which is the pulse N2 delayed by the time d3. The flip flop 126 generates the control pulse CTL which rises synchronizing to the falling of the pulse N4, an inverted signal of the pulse N2, and falls synchronizing to the falling of the pulse N3.

In this case, the pulse width adjusting part 62 is designed to supply forward pulse FCL', which is the forward pulse FCL whose pulse width has been elongated corresponding to the control pulse CTL, to the forward-pulse delay line 81 in step S5 in FIG. 28 (see FIG. 31).

The delay time d3 in the pulse generating circuit 123 is to prevent irregular pulse from arising on the control pulse CTL. FIG. 32 shows an example of this case.

For example, when the pulse N2 is one as shown in FIG. 32 and the pulse PM is one as shown in FIG. 32, the control pulse CTL grows irregular pulse as shown in FIG. 32. In order to prevent it, the delay time d3 is added.

Figure 29:
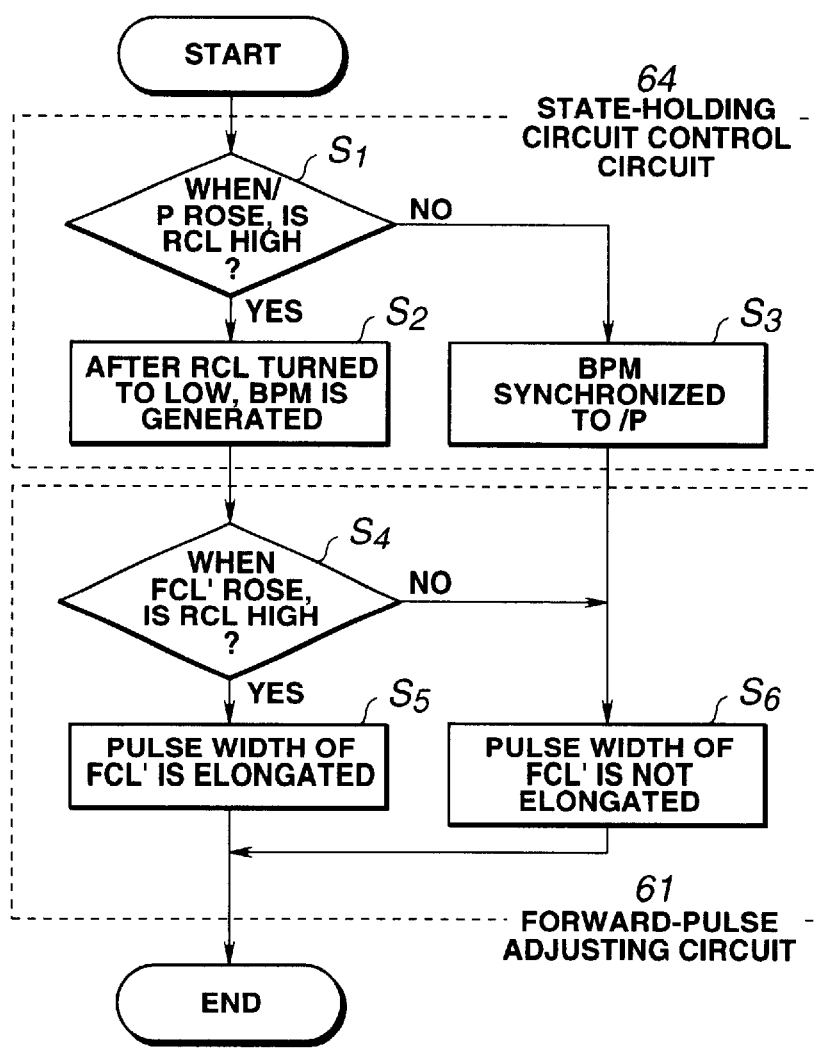
FIG. 29 is a flow chart illustrating the operation of the embodiment in FIG. 25.

As shown in the flow chart in FIG. 29, since the relation between the rearward pulse RCL and the control pulse /P is examined in step S1 before the relation between the forward pulse FCL' and the rearward pulse RCL is examined in step S4, the timing for the pulse C, which shows the relation between RCL and /P, to be generated always precedes the timing when the forward pulse FCL' rises. Accordingly, it never occurs that the pulse C rises after the rising of the forward pulse FCL', and consideration is unnecessary for such a case.

Thus, the forward pulse adjusting circuit 61 maintains forward pulse FCL' at "H", when the control pulse /P is generated while rearward pulse is being outputted from the rearward-pulse delay line 83 and when forward pulse is inputted to forward-pulse delay lines, the forward pulse FCL' is maintained at "H" until the control pulse BPM stops being generated so as to elongate the pulse width. In this way, in the forward pulse FCL', a delay unit 80, which remains without being turned to the set state due to the function of the control pulse BPM from the state-holding circuit initializing circuit 71, can be turned to the set state by the forward pulse FCL'. Consequently, the pulse width of the forward pulse F2 shown in FIG. 26A is increased (the rising timing of F2 does not change), the forward pulse becomes "H" in the x-th stage, too, and a state-holding circuit is turned back to the set state by the forward pulse F2 even when it turns to the reset state. In this manner, generation of rearward pulse is stopped in the x-th stage. As a result, it becomes possible to establish synchronization between an external clock signal and an internal clock signal.

At the forward-pulse adjusting circuit 61, whether forward pulse FCL' is to be maintained at "H" or not had been determined when forward pulse FCL' rose. Inherently, whether forward pulse FCL' is to be maintained at "H" or not should be determined when forward pulse FCL' fell. However, in a method of determining the level of the rearward pulse RCL when forward pulse FCL' fell, as the determination on whether forward pulse FCL' is to be maintained at "H" or not is done after forward pulse FCL' became "L" the control pulse CTL sometimes grows irregular pulse. On account of this, in the forward-pulse adjusting circuit 61, whether forward pulse FCL' is to be maintained at "H" or not is determined when forward pulse FCL' rose.

Now, the operation when the state-holding circuit control circuit 64 and the forward-pulse adjusting circuit 61 are used to an STBD, that is, the operation of the embodiment of FIG. 25 will be described with reference to FIGS. 33 to 36. FIGS. 33 to 36 show the clock signal CLK, the forward pulse FCL, the rearward pulse RCL, the control pulse /P, the pulse C, the control pulse BPM, the control pulse CTL and the forward pulse FCL.

First, a description will be given on a case where the width of forward pulse needs to be elongated by the state-holding circuit control circuit 64 and the forward-pulse adjusting circuit 61 are required.

To begin with, in the case (III) described above, namely, in a case where the control pulse /P falls while rearward pulse RCL is being outputted from the rearward-pulse delay line 83, suppose that rearward pulse is still being outputted from the rearward-pulse delay line 83 when forward pulse is inputted to the forward-pulse delay line 81.

Figure 33:
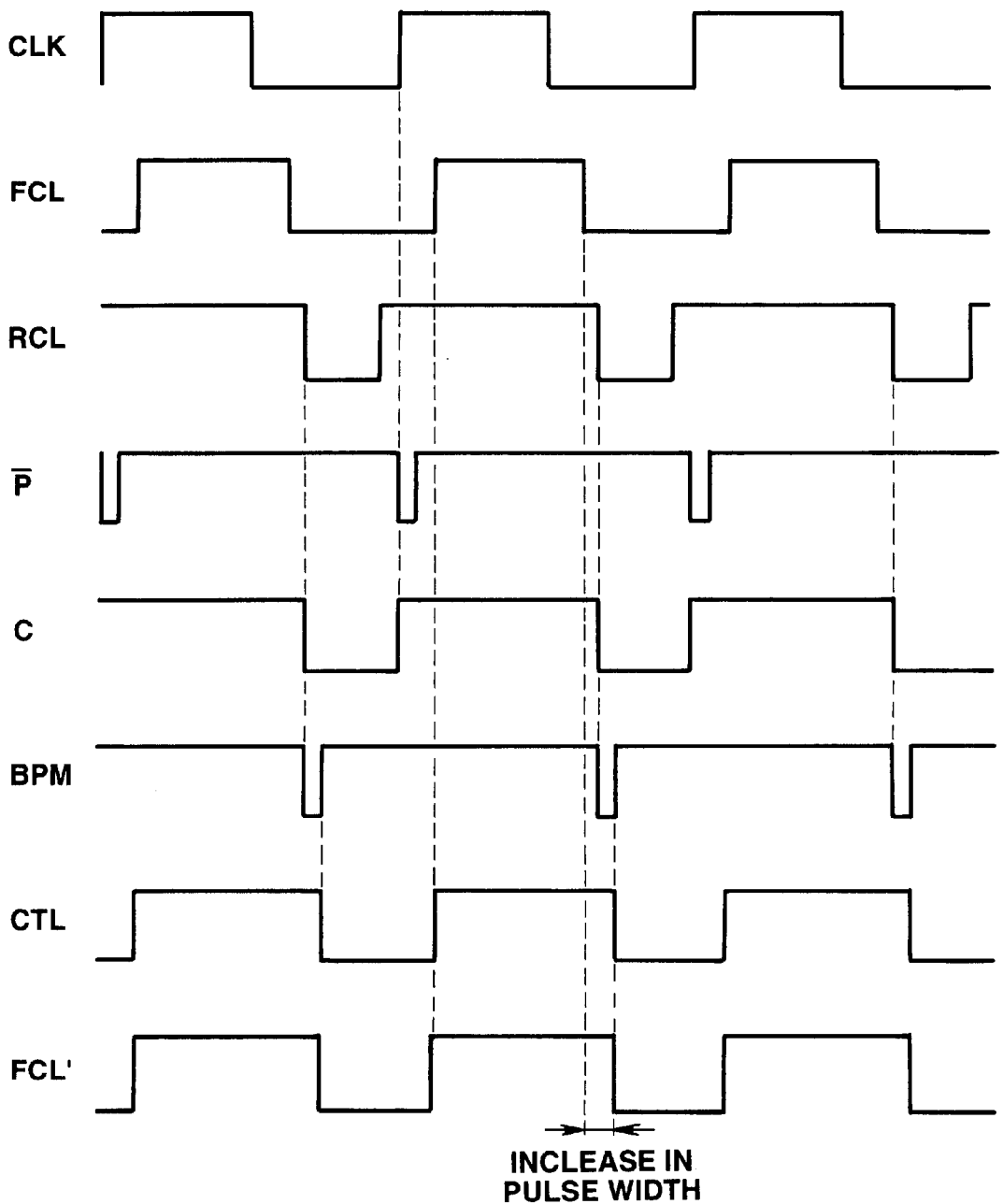
FIG. 33 is a waveform diagram illustrating the operation of the embodiment in FIG. 25.

FIG. 33 shows an example of this case. In such a state, the rearward pulse RCL is "H" when the control pulse /P fell, and the rearward pulse RCL stays at "H" even when the forward pulse FCL fell.

In this case, as shown in FIG. 23, the control pulse BPM at "L"(see FIG. 33) is outputted from the state-holding circuit control circuit 64 after the rearward pulse RCL from the rearward-pulse delay line 83 became "L" As shown in FIG. 33, the pulse C outputted from the state-holding circuit control circuit 64 maintains "H" until the control pulse /P falls and the rearward pulse RCL falls (see FIG. 23). As shown in FIG. 33, during the time between the forward pulse FCL's becoming "H" and the control pulse BPM's becoming "H"(pulse PM is "L", the control pulse CTL is "H"(see FIG. 31). Accordingly, the forward pulse FCL' from the pulse width adjusting part 62 is, as shown in FIG. 33, maintained at "H" for the time from the time when the forward pulse FCL becomes "H" to the time when the control pulse BPM becomes "H".

With this operation, while the control pulse BPM falls at the same time as rearward pulse RCL falls, the forward pulse FCL' outputted from the pulse width adjusting part 62 is maintained at "H" for the time from the rising of FCL outputted from the delay monitor 3 to the rising of the control pulse BPM so as to increase the pulse width. Consequently, when the state-holding circuit 82 is reset by the control pulse BPM, only one rearward pulse exists to be propagated by the rearward-pulse delay line 83, and the forward pulse FCL' maintains "H" until the control pulse BPM becomes "H" and resetting of the state-holding circuit 82 is finished. Thus, a case as in FIG. 26, where the x-th delay unit 80-x is reset by passing of rearward pulse after forward pulse passed, does not occur to the delay unit 80. As a result, synchronization can be established between the external clock signal CK and the internal clock signal CK'.

Figure 34:
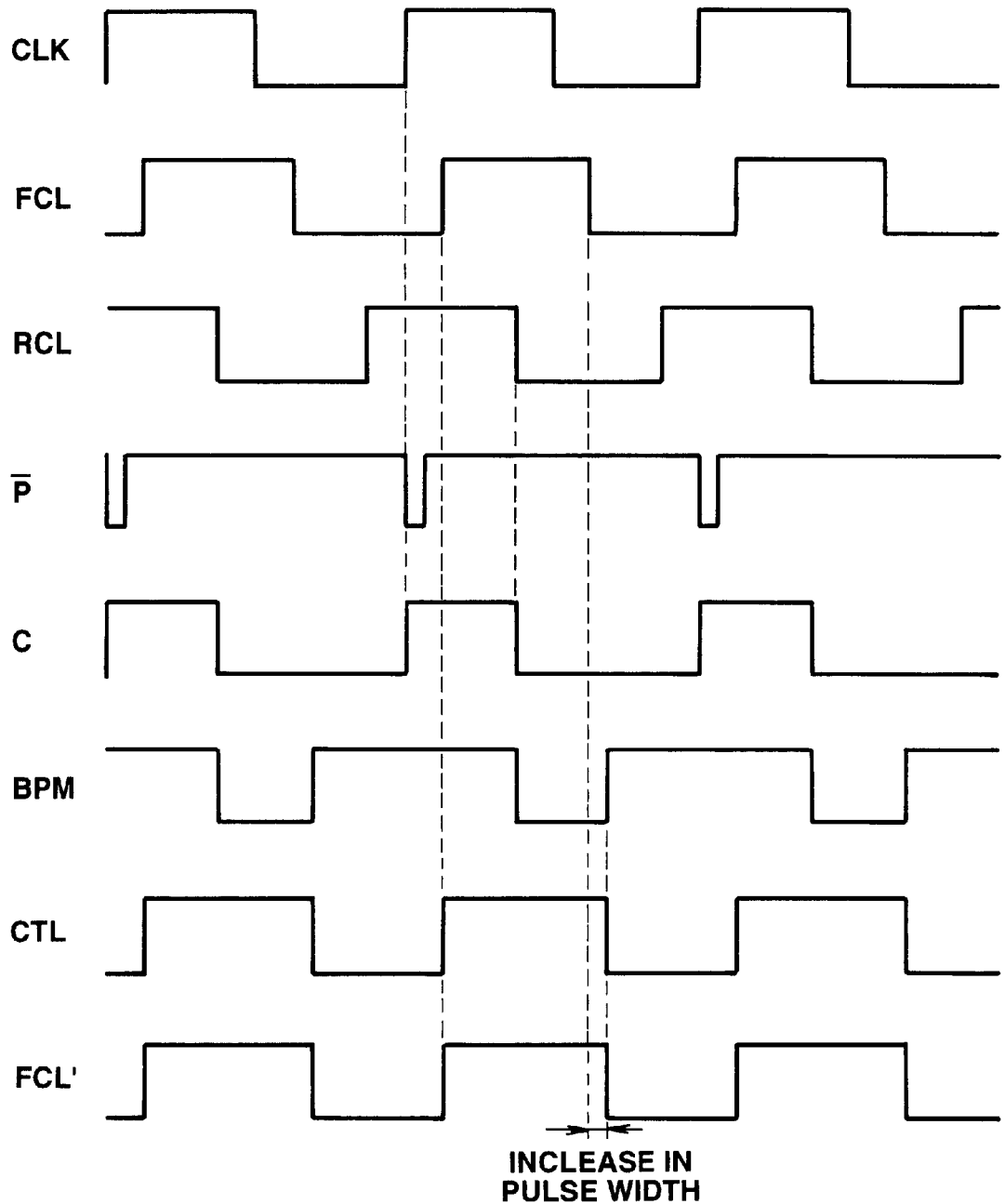
FIG. 34 is a waveform diagram illustrating the operation of the embodiment in FIG. 25.

FIG. 34 shows a state where the control pulse /P falls while the rearward pulse RCL is being outputted from the rearward-pulse delay line 83, and rearward pulse has been thoroughly outputted but the control pulse BPM becomes "L" when forward pulse is inputted to the forward-pulse delay line 81 (see FIG. 34). When the pulse width of the control pulse BPM is relatively large, forward pulse passes while the control pulse BPM is at "H". Further, when the control pulse BPM turned to "L" the delay unit 80 where rearward pulse is being propagated turns to the reset state, and the state shown in FIG. 26A arises. However, as the forward pulse FCL is fixed at "H" until BPM becomes "H" the problem shown in FIG. 26 can be evaded.

That is, as the control pulse /P falls when the rearward pulse RCL is "H" as shown in FIG. 23, the pulse C, which is the output of the state-holding circuit control circuit 64, turns to "H" from the falling of the control pulse /P to the falling of the rearward pulse RCL (see FIG. 34), and, as shown in FIG. 34, the control pulse BPM falls after the rearward pulse RCL fell (see FIG. 23). As the forward pulse FCL rises while the pulse C is "H" as shown in FIG. 34, the control pulse CTL is maintained at "H" from the rising of the forward pulse FCL until the control pulse BPM becomes "H"(see FIG. 31). FCL' is an OR of FCL and CTL. Consequently, the forward pulse FCL' maintains "H" from the rising of the forward pulse FCL until the control pulse BPM turns to "H".

The control pulse BPM falls after the rearward pulse RCL fell. Namely, BPM becomes "L" after output of rearward pulse from rearward-pulse delay lines is finished. When the forward pulse FCL fell, the rearward pulse RCL is "L". However, as the pulse width of the control pulse BPM is large and the control pulse BPM is "L" when forward pulse FCL fell, the forward pulse FCL' maintains "H" until the control pulse BPM becomes "H" as shown in FIG. 34.

On account of this, when the state-holding circuit 82 is reset, only one rearward pulse exists on the rearward-pulse delay line 83, and the forward pulse FCL' maintains "H" until the control pulse BPM becomes "H". Thus, the delay unit 80 no longer gets in a state where it is reset by rearward pulse after forward pulse passed and kept in the reset state as shown in FIG. 26A. With this operation, an external clock signal CK and the internal clock signal CK' are synchronized.

Figure 35:
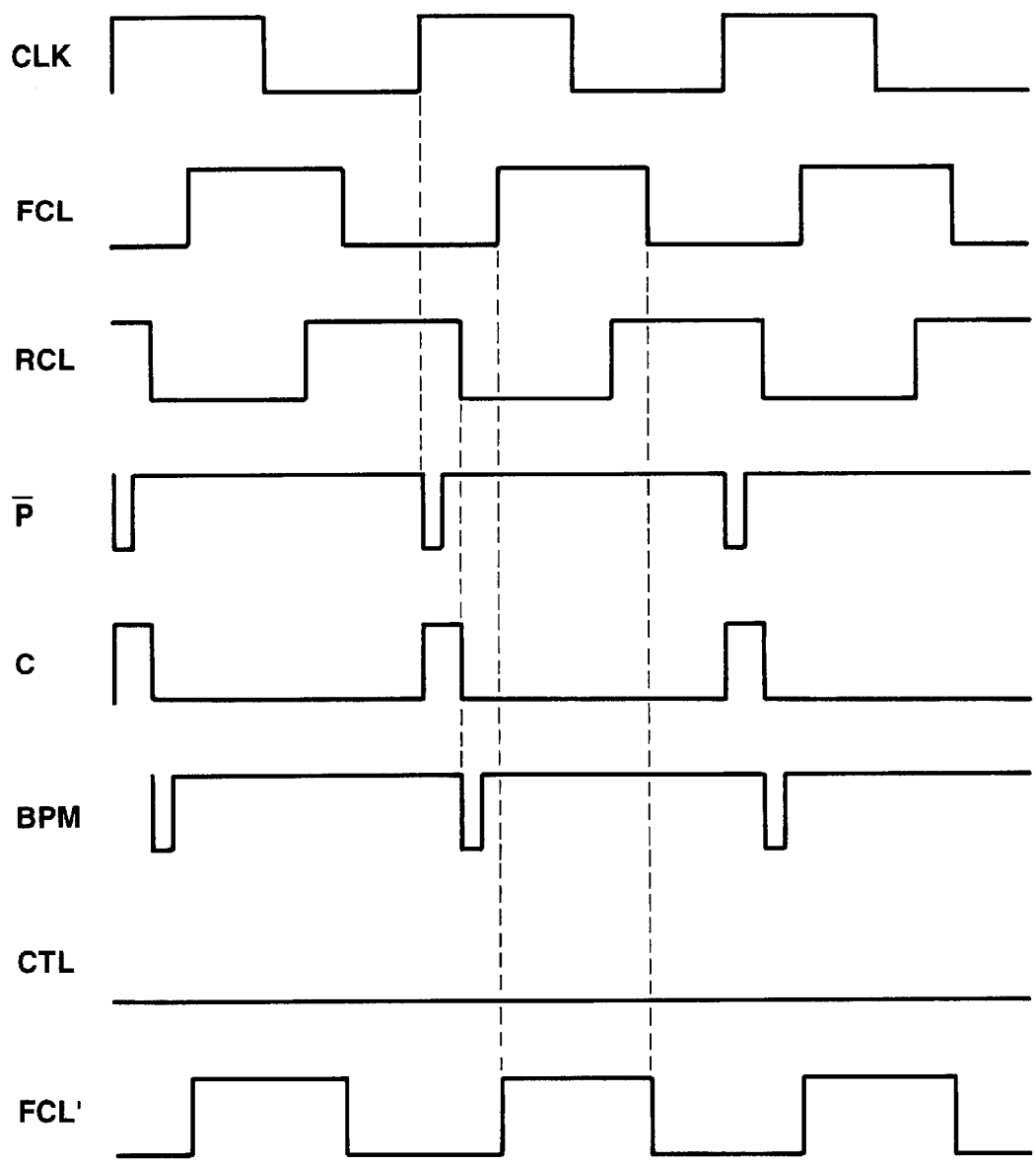
FIG. 35 is a waveform diagram illustrating the operation of the embodiment in FIG. 25.

FIG. 35 shows a state where the control pulse /P falls when rearward pulse is being outputted from the rearward-pulse delay line 83, and when forward pulse is inputted to the forward-pulse delay line 81, rearward pulse has been thoroughly outputted and BPM has turned to "H".

In such a state, when the control pulse /P fell, rearward pulse is "H" and when forward pulse rose, rearward pulse RCL is "L". As shown in FIG. 23, in this case, the control pulse BPM falls by the rearward pulse RCL's falling (see FIG. 35). As shown in FIG. 35, the pulse C, which is the output of the state-holding circuit control circuit 64, stays at "H" until the rearward pulse RCL falls after the control pulse /P fell (see FIG. 23). Meanwhile, as the control pulse CTL is fixed at "L" in this state (see FIG. 35), the pulse width adjusting part 62 outputs the forward pulse FCL as it is as the forward pulse FCL' (see FIG. 35).

Figure 8:
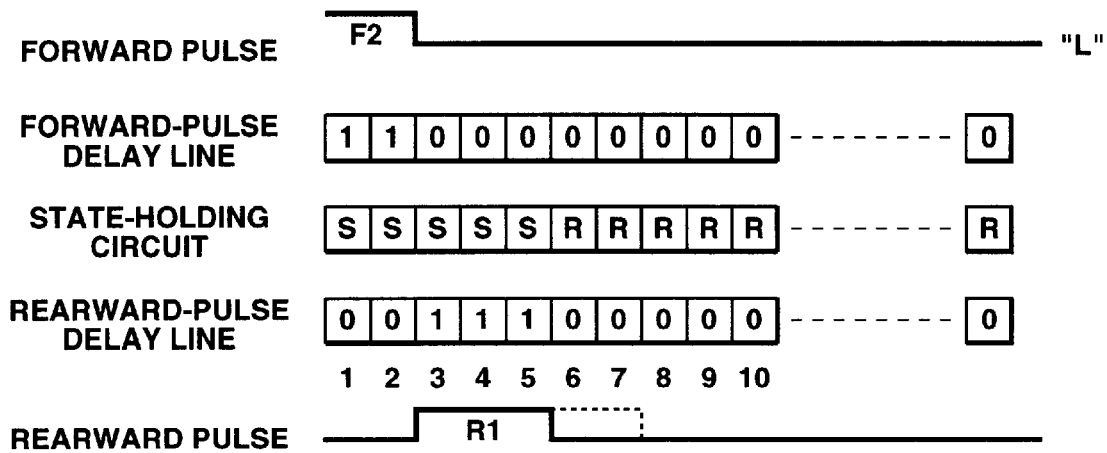
FIG. 8 is an explanatory view illustrating the operation according to a related art.

In this case, the control pulse BPM falls at the same time as the rearward pulse RCL falls, and the forward pulse FCL from the delay monitor 3 is supplied as it is to the forward-pulse delay line 81 as the forward pulse FCL'. As there is only one rearward pulse existing on the rearward-pulse delay line 83 to reset the state-holding circuit 82, the state shown in FIG. 8 does not occur. Besides, as rearward pulse has been thoroughly outputted and BPM has turned back to "H" when the forward pulse FCL' is inputted to delay lines, the problem as shown in FIG. 26A does not arise, allowing the forward pulse FCL to be inputted as it is to the forward-pulse delay line 81. As the circuits operate in such a manner, the external clock signal CK and the internal clock signal CK' are synchronized.

Now, it is verified whether addition of the state-holding circuit control circuit 64 and the forward-pulse adjusting circuit 61 causes a state where the operation which is normal in a related art on STBD becomes, contrarily, impossible to synchronize under the same condition. Particularly, cases where there is a high possibility that synchronization becomes impossible will be described.

Figure 36:
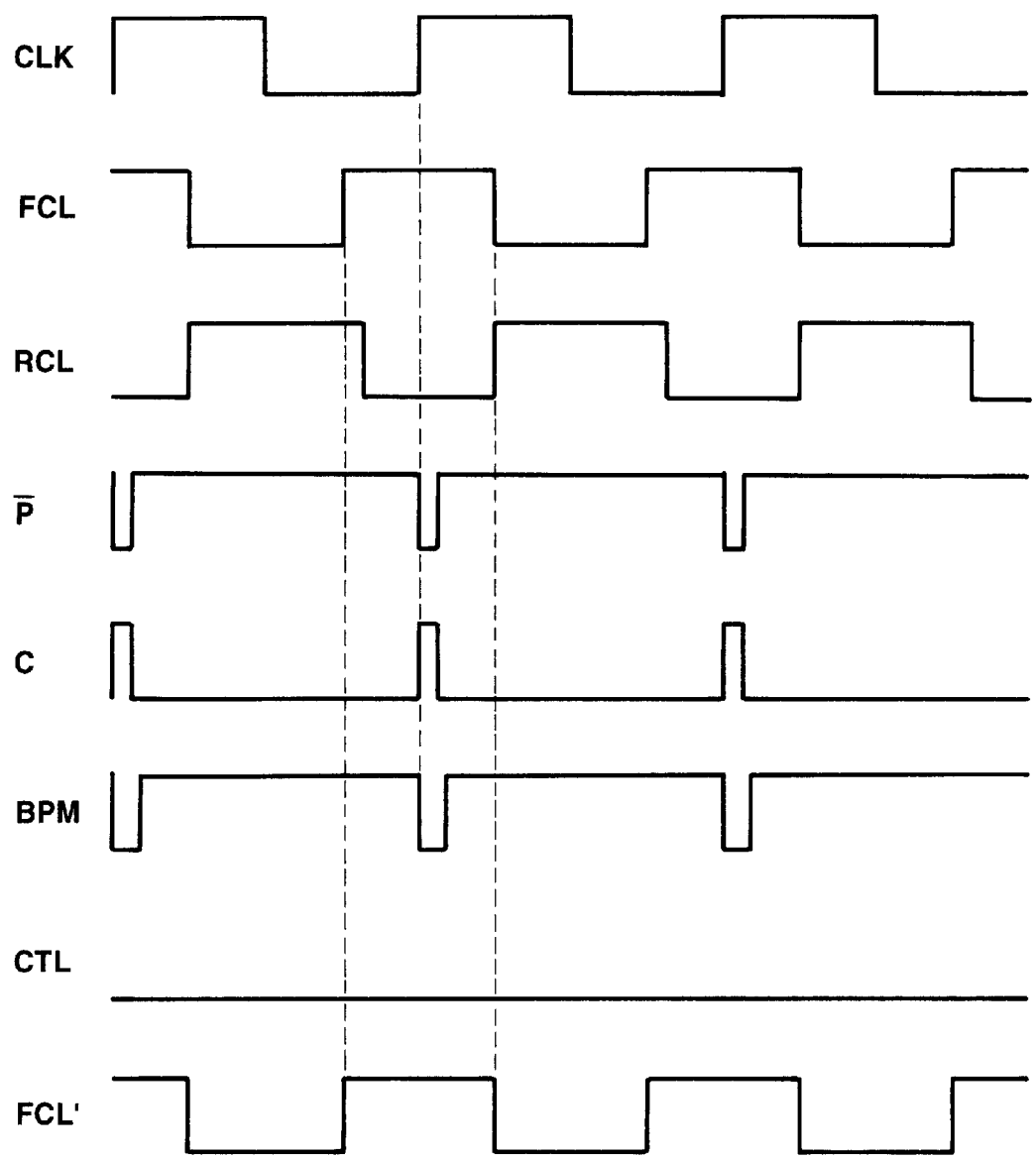
FIG. 36 is a waveform diagram illustrating the operation of the embodiment in FIG. 25.

FIG. 36 shows a state where the control pulse /P falls after the termination of output of rearward pulse from the rearward-pulse delay line 83, and the rearward pulse RCL is in the midst of being outputted (RCL is "L") when forward pulse is inputted to the forward-pulse delay line 81 (FCL' is "H").

In this case, as shown in FIG. 21, the control pulse BPM becomes a pulse which falls synchronizing to the falling of the control pulse /P, and the pulse C, which is the output of the state-holding circuit control circuit 64, becomes an inverted signal of the control pulse /P (see FIG. 36). As the forward pulse FCL becomes "H" when the pulse C is "L" as shown in FIG. 36, the control pulse CTL always becomes "L"(see FIG. 30). On account of this, the output of the delay monitor 3 is outputted as it is as the forward pulse FCL' from the pulse width adjusting part 62.

Consequently, in this case, although the control pulse BPM becomes a signal synchronized to the control pulse /P, as there is no rearward pulse on the rearward-pulse delay line 83, the state-holding circuit 82 can be turned to the reset state R. In addition, as the output of the delay monitor 3 is inputted as it is as the forward pulse FCL' to the forward-pulse delay line 81, the problem of disappearing pulse, which is to be described later, does not arise. Also, the external clock signal CK and the internal clock signal CK' are synchronized.

A state as shown in FIG. 36 arises when the delay time A of the delay monitor 3 is large against the period τ of the external clock signal. For example, such a state occurs when an external clock signal to be inputted is high frequency. In such a state, even though rearward pulse is being outputted from the rearward-pulse delay line 83 when forward pulse is inputted to the forward-pulse delay line 81, the pulse width of forward pulse should not be increased. If the width of pulse is enlarged when frequency of an external clock signal is high and the duty of forward pulse becomes heavy, there is a possibility that a pulse disappears. If whether the pulse width of forward pulse is to be enlarged or not is determined by judging only whether rearward pulse is being outputted at the point of time when forward pulse is inputted to the forward-pulse delay line 81, the pulse width of forward pulse may be enlarged even in the state shown in FIG. 36 and that may erase a pulse. However, as the forward-pulse adjusting circuit uses, in addition to said condition, the relation between RCL and /P as the condition to determine, this risk is avoided. Although such problem can be evaded if whether forward pulse FCL is to be maintained at "H" or not is determined by the falling of forward pulse, in this embodiment, determination on whether the pulse width of forward pulse needs enlargement or not must be done at the rising edge of forward pulse because, as described above, irregular pulse may grow on forward pulse.

In this embodiment, a case, where forward pulse FCL is "H" and rearward pulse RCL is "L" when the control pulse /P fell, has not been described yet. In this case, even with a circuit according to a related art, which does not have the state-holding circuit control circuit 64 and the forward-pulse adjusting circuit 61 shown in FIG. 1, synchronization between an external clock signal CK and an internal clock signal CK' can be established. In such a case, the state-holding circuit control circuit 64, as shown in FIG. 21, generates the control pulse BPM, which is synchronized to the control pulse /P, and the forward-pulse adjusting circuit 61, as shown in FIG. 36, as the control pulse CTL becomes "L" the pulse width adjusting part 62 supplies the output of the delay monitor 3 as it is as the forward pulse FCL' to the forward-pulse delay line 81. As the operation results in the same as that of a circuit according to a related art, an external clock signal and an internal clock signal can be synchronized.

Thus, in this embodiment, not only the same effect as that in the embodiment in FIG. 19A is available, but also forward pulse can be maintained at "H" until output of rearward pulse from the rearward-pulse delay line 83 is finished by using the forward-pulse adjusting circuit 61. Consequently, it can be prevented that the delay unit 80 is undesirably reset due to rearward pulse's being propagated after forward pulse is propagated. With this operation, even when the duty of an external clock signal is large, an external clock CK and an internal clock signal CK' are synchronize.

For the state-holding circuit control circuit 64 and the forward-pulse adjusting circuit 61, circuits other than those shown in FIG. 20 and FIG. 27 may be used so long as they realize the flow chart in FIG. 29. Note that the configuration of the pulse width adjusting part 62 is not limited to that shown in FIG. 28.

Figure 37:
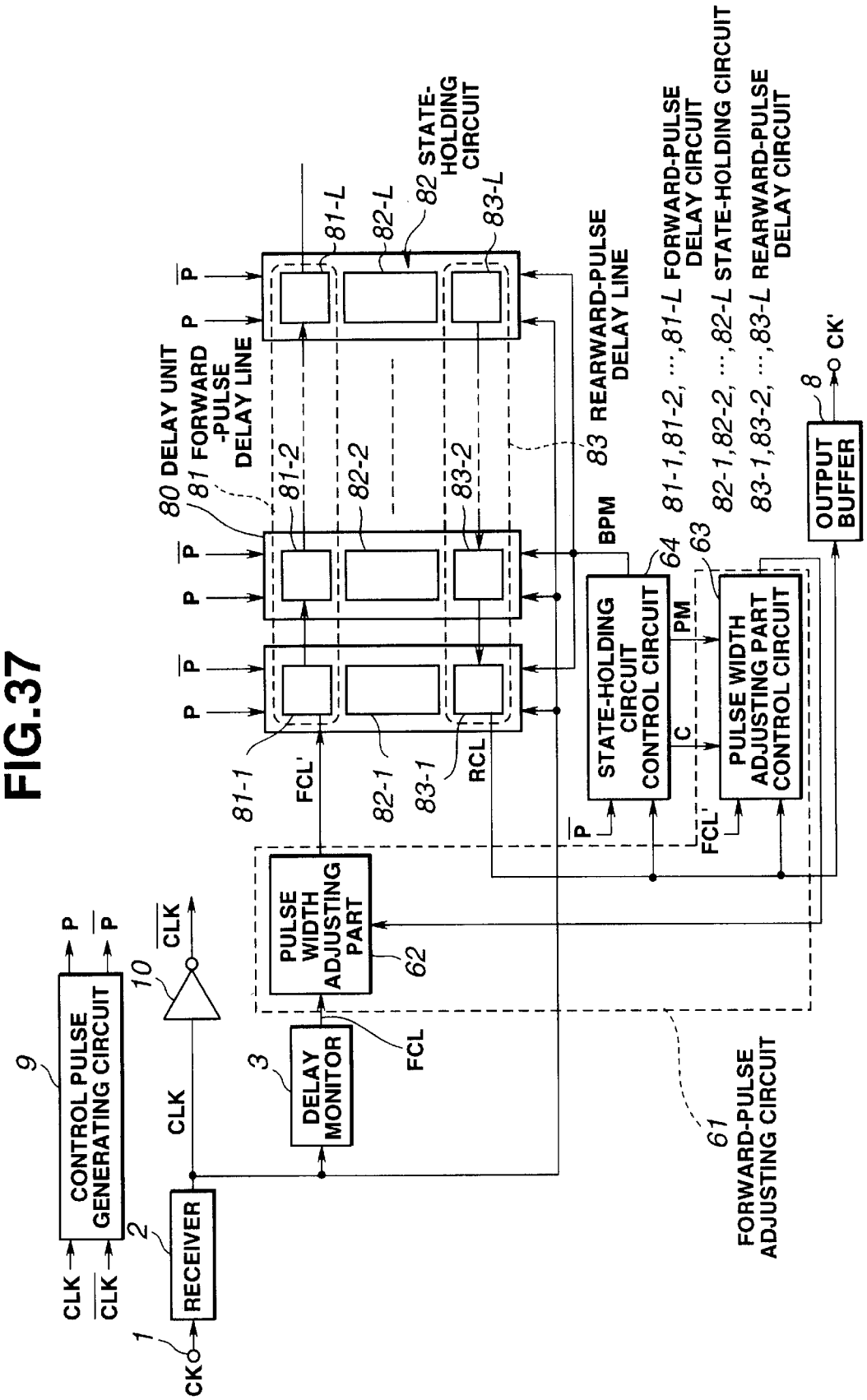
FIG. 37 is a block diagram showing another embodiment of the present invention.

FIG. 37 is a block diagram showing another embodiment of the present invention. The state-holding circuit initializing circuit 71 has no effect on the operation of the state-holding circuit control circuit 64 and the forward-pulse adjusting circuit 61. Accordingly, if the state-holding circuit initializing circuit 71 is eliminated from FIG. 25, the problem, which arises when the pulse widths of forward pulse and rearward pulse are larger than τ/2, can be solved. FIG. 37 shows an example of this case. FIG. 37 differs from the embodiment in FIG. 25 in points that the state-holding circuit initializing circuit 71 is eliminated.

Other configuration and operation are similar to those in the embodiment in FIG. 25.

Figure 38:
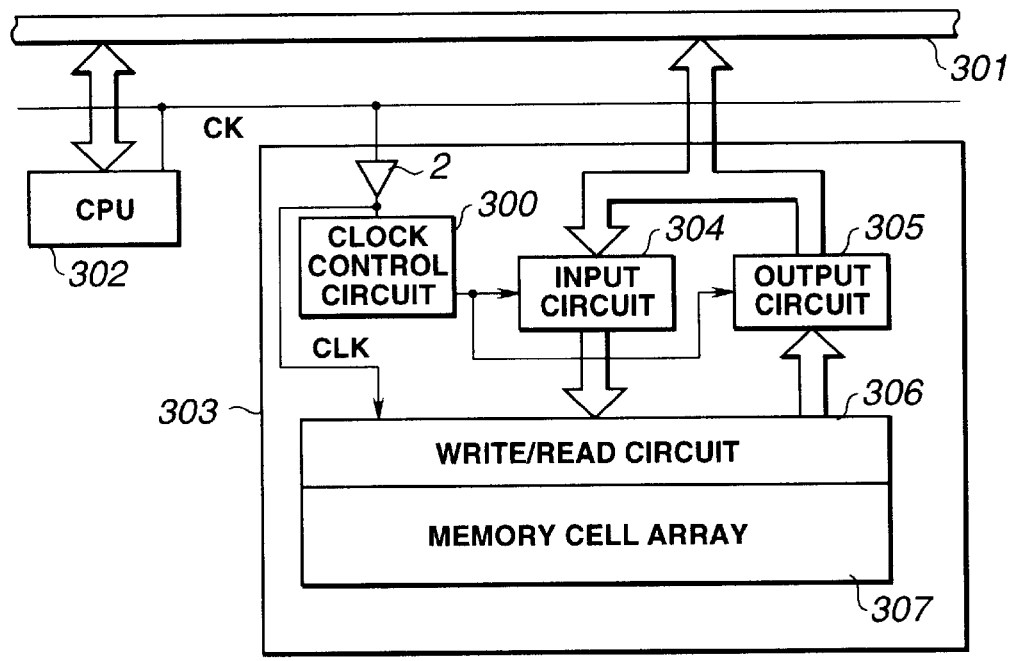
FIG. 38 is a block diagram showing another embodiment of the present invention.

FIG. 38 is a block diagram showing another embodiment of the present invention. In this embodiment, the present invention is applied to a system comprising a memory such as a synchronous DRAM. For a clock control circuit 300 used in this embodiment, any clock control circuit, which is adopted in any of the embodiments described above, may be used.

A CPU 302 connected onto a bus 301 executes predetermined instruction by being given an external clock signal CK. For example, the CPU 302 instructs writing and reading to a memory device 303.

The memory device 303 comprises the receiver 2, an input circuit 304, an output circuit 305, a write/read circuit 306, a memory cell array 307 and the clock control circuit 300. The input circuit 304 gives data transferred via the bus 301 to the write/read circuit 306 and writes them into the memory cell array 307. The output circuit 305 is designed to transfer data, which are read out from the memory cell array 307 using the write/read circuit 306, to the bus 301.

The clock control circuit 300 is designed to be given the clock signal CLK from the receiver 2, to generate an internal clock signal CK' synchronized to an external clock signal CK and to output it to the input circuit 304 and the output circuit 305.

In the embodiment configured in such a manner, to the memory device 303, the same external clock signal CK as that to be supplied to the CPU 302 is supplied. When the clock frequency is high, in order to obtain the stable system operation, the memory device 303 is required to output data which are synchronized to the external clock signal CK and held in the memory cell array 307, to the bus 301.

The external clock signal CK is taken in after being delayed by the time D1 by the receiver 2. The clock control circuit 300 is given the clock signal CLK from the receiver 2 and generates the internal clock signal CK' synchronized to the external clock signal CK. The input circuit 304 takes in the data from the bus 301 using the internal clock signal CK' and writes them into the memory cell array 307 via the write/read circuit 306. The write/read circuit 306 is operated with the clock signal CLK. Thus, at the time of writing of data, data are taken in from the bus 301 synchronizing to the external clock signal CK.

At the time of reading of data, the data in the memory cell array 307 are read out by the write/read circuit 306 and supplied to the output circuit 305. The output circuit 305 is driven by the internal clock signal CK', and transfers the read data to the bus 301 synchronizing to the external clock signal CK. In such a manner, at the time of reading of data, the transfer of data to the bus 301 is carried out synchronizing to the external clock signal CK.

Thus, in this embodiment, by using the clock control circuit according to each of said embodiments, writing and reading synchronized to the external clock signal is possible.

Figure 39:
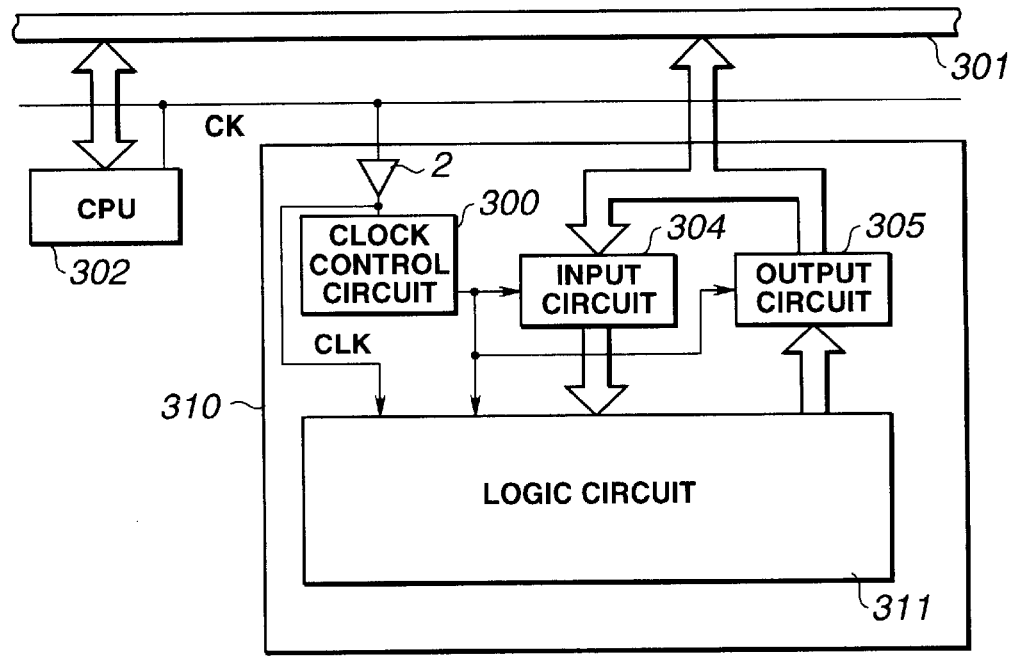
FIG. 39 is a block diagram showing another embodiment of the present invention.

FIG. 39 is a block diagram showing another embodiment of the present invention. In this embodiment, the present invention is applied to a system comprising a logic circuit. In FIG. 39, the same elements as those in FIG. 38 are given the same reference numerals and description about them is omitted.

In this embodiment, a logic device 310 is used instead of the memory device 303, and the logic device 310 differs from the memory device 303 in points that a logic circuit 311 is adopted in place of the write/read circuit 306 and the memory cell array 307.

The logic circuit 311 is designed to have data for operation supplied from the input circuit 304, to perform a predetermined operation, and to output the operated result to the bus 301 via the output circuit 305.

In the embodiment configured in such a manner, too, the input circuit 304 takes in data from the bus 301 using the internal clock signal CK' and supplies them to the logic circuit 311. The output circuit 305 is driven by the internal clock signal CK' and transfers the operated result of the logic circuit 311 to the bus 301 synchronizing to the external clock signal CK. Although the logic circuit 311 operates corresponding to the clock signal CLK, it is good enough if only the input and output of data to the bus 301 are synchronized to the external clock signal CK.

Thus, in this embodiment. using the clock control circuit according to each of said embodiments enables data to be taken in and transferred synchronizing to the external clock signal.

Figure 40:
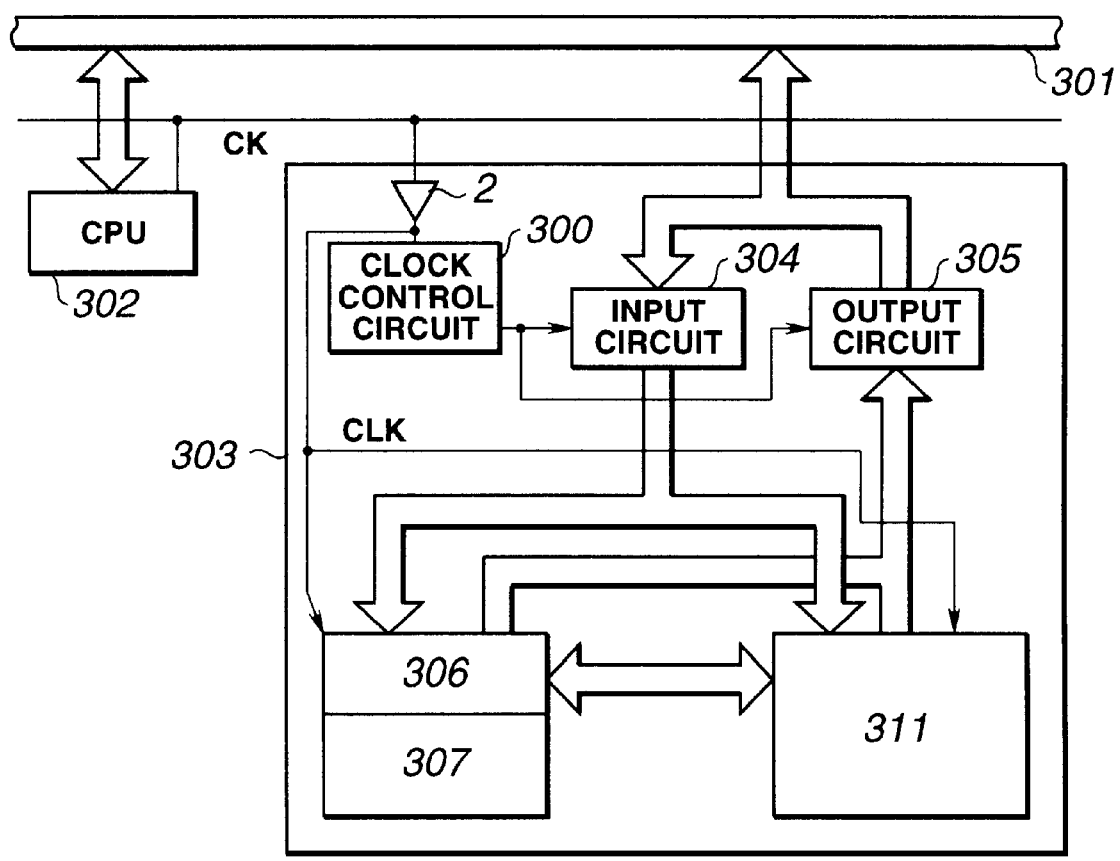
FIG. 40 is a block diagram showing another embodiment of the present invention.

FIG. 40 is a block diagram showing another embodiment of the present invention. In FIG. 40, the same elements as those in FIGS. 38 and 39 are given the same reference numerals and description about them is omitted. In this embodiment, the present invention is applied to a system comprising a logic circuit.

Points whereby this embodiment differs from that in FIG. 39 are that a logic circuit 311, a write/read circuit 306 and a memory cell array 307 are integrated on the same chip.

In the embodiment configured in such a manner, too, an input circuit 304 takes in data from a bus 301 using an internal clock signal CK', and supplies them to the logic circuit 304 or the write/read circuit 306. The output circuit 311 is driven by the internal clock signal CK' so as to send and receive data to and from the memory cell array or to transfer the operated result of the logic circuit 311 to the bus 301 synchronizing to an external clock signal CK.

In this manner, in this embodiment, taking in and transferring data, which are synchronized to the external clock signal, are possible by using the clock control circuit according to said embodiment.

In the embodiments in FIGS. 38–40, write and readout of data to the memory cell array 307 or operation processing in the logic circuit 311 are performed according to the clock signal CLK. However, it is obvious that these processes may be designed so as to be performed according to the internal clock signal CK'.

In the embodiments in FIGS. 38–40, in order to simplify the description, the clock control circuit 300 is described as a device to output the internal clock signal CK' synchronized to the external clock signal CK. Actually, however, considering the delay at the input circuit 304 and the output circuit 305, the data transfer synchronized to the external clock signal CK at the time of input and output of data to the bus 301 is made possible by including these delay times to the delay time of the output buffer in the clock control circuit 300.

It is obvious that the present invention is, without any departure from the spirit and scope of it, able to become the basis of configuration for different aspects of embodiments in a wide scope. The present invention should not be limited, except by the appended claims, only to these embodiments.

What is claimed is:

1. A clock control circuit, comprising:
    a forward-pulse delay line which is configured by cascading a plurality of stages of forward-pulse delay circuits to propagate an inputted signal with a first predetermined delay time so as to delay said inputted signal, and delays forward pulse corresponding to a second clock signal obtained by delaying a first clock signal, which is obtained by delaying an external clock signal by a first delay time, by a second delay time corresponding to the difference between the period of said first clock signal and said first delay time,
    a rearward-pulse delay line which is configured by cascading a plurality of stages of rearward-pulse delay circuits to propagate an inputted signal with a second predetermined delay time so as to delay said inputted signal, and, by being set to a reset state of a first rearward pulse generation stage that is a stage corresponding to a first forward-pulse arrival stage that is the stage of the forward-pulse delay line where said forward pulse is propagated after said second delay time from the start of propagation of said forward pulse by said forward-pulse delay line and also by being set to a set state of each of the first stage up to the preceding stage of said first rearward pulse generation stage, propagates rearward pulse, which is generated in said first rearward pulse generation stage in the reset state by taking in said first clock signal selectively, by each of said stages in the set state and outputs said rearward pulse from the first stage,
    a state-holding device which is configured with a number of stages corresponding to the number of stages of said forward-pulse delay line and rearward-pulse delay line, and, by turning a first state-holding stage that is a stage corresponding to a second forward-pulse arrival stage that is the stage of the forward-pulse delay line where said forward pulse is propagated during a one polarity pulse duration of said first clock signal to the set state and also by turning a plurality of second state-holding stages corresponding to a plurality of rearward-pulse propagation stages where said rearward pulse is propagated only for a predetermined time from the edge of said first clock signal to the reset state, controls propagation of said rearward pulse by said rearward-pulse delay line, and
    a state-holding circuit initializing device which initializes said state-holding device to the reset state when said state-holding circuit initializing device detects that said first clock signal is not generated.

2. A clock control circuit according to claim 1, wherein
said state-holding circuit initializing device detects that said first clock signal is not generated when said forward pulse is propagated to the last forward-pulse delay circuit of said forward-pulse delay line, and initializes said state-holding device to the reset state.

3. A clock control circuit according to claim 2, wherein
said state-holding circuit initializing device comprises
    a detecting circuit to detect that forward pulse is outputted from said last forward-pulse delay circuit, and
    an initializing circuit to initialize said state-holding device corresponding to the detected result of said detecting circuit.

4. A clock control circuit according to claim 3, wherein
said detecting circuit has a delay circuit having a delay time corresponding to a time required in order to initialize said state-holding device.

5. A clock control circuit, comprising:
    a forward-pulse delay line which is configured by cascading a plurality of stages of forward-pulse delay circuits to propagate an inputted signal with a first predetermined delay time so as to delay said inputted signal, and delays forward pulse corresponding to a second clock signal obtained by delaying a first clock signal, which is obtained by delaying an external clock signal by a first delay time, by a second delay time during a one polarity pulse duration of said first clock signal,
    a rearward-pulse delay line which is configured by cascading a plurality of stages of rearward-pulse delay circuits to propagate an inputted signal with a second predetermined delay time so as to delay said inputted signal, and, by being set to a reset state of a first rearward-pulse generation stage that is a stage corresponding to a first forward-pulse generation stage that is the stage where said forward pulse is propagated after said second delay time and also by being set to a set state of each of the first stage up to the preceding stage of said first rearward-pulse generation stage, propagates rearward pulse, which is generated in said first rearward-pulse generation stage in the reset state by taking in said first clock signal selectively, by each of said stages in the set state and outputs said rearward pulse from the first stage,
    a state-holding device which is configured with a number of stages corresponding to the number of stages of said forward-pulse delay line and rearward-pulse delay line, and, by turning a first state-holding stage that is a stage corresponding to a second forward-pulse arrival stage that is the stage where said forward pulse is propagated during the one polarity pulse duration of said first clock signal to the set state and also by turning a plurality of second state-holding stages corresponding to a plurality of rearward-pulse propagation stages where said rearward pulse is propagated only for a first time from the edge of said first clock signal to the reset state, controls propagation of said rearward pulse by said rearward-pulse delay line, and a state-holding circuit control device which generates control signals to set said first time corresponding to the rearward pulse outputted from said rearward-pulse delay line.

6. A clock control circuit according to claim 5, wherein said state-holding circuit control device outputs said control signals to said state-holding device in order to set said state-holding device to the reset state after the output of said rearward pulse from said rearward-pulse delay line is finished.

7. A clock control circuit according to claim 5, wherein said state-holding circuit control device, during a time which begins synchronizing to said, first clock signal and ends in a time width shorter than said first delay time, when said rearward pulse is outputted from said rearward-pulse delay line, outputs, to said state-holding device, said control signals to set said state-holding device to the reset state after output of said rearward pulse is finished, and in other cases, outputs to said state-holding device said control signals to set said state-holding device to the reset state synchronizing to said first clock signal.

8. A clock control circuit, comprising:

a forward-pulse delay line which is configured by cascading a plurality of stages of forward-pulse delay circuits to propagate an inputted signal with a first predetermined delay time so as to delay said inputted signal, and delays forward pulse corresponding to a second clock signal obtained by delaying a first clock signal, which is obtained by delaying an external clock signal by a first delay time, by a second delay time during a one polarity pulse duration of said first clock signal, a rearward-pulse delay line which is configured by cascading a plurality of stages of rearward-pulse delay circuits to propagate an inputted signal with a second predetermined delay time so as to delay said inputted signal, and, by being set to a reset state of a first rearward-pulse generation stage that is a stage corresponding to a first forward-pulse generation stage that is the stage where said forward pulse is propagated after said second delay time and also by being set to a set state of each of the first stage up to the preceding stage of said first rearward-pulse generation stage, propagates rearward pulse, which is generated in said first rearward-pulse generation stage in the reset state by taking in said first clock signal selectively, by each of said stages in the set state and outputs said rearward pulse from the first stage, a state-holding device which is configured with a number of stages corresponding to the number of stages of said forward-pulse delay line and rearward-pulse delay line, and, by turning a first state-holding stage that is a stage corresponding to a second forward-pulse arrival stage that is the stage where said forward pulse is propagated during the one polarity pulse duration of said first clock signal to the set state and also by turning a plurality of second state-holding stages corresponding to a plurality of rearward-pulse propagation stage where said rearward pulse is propagated only for a first time from the edge of said first clock signal to the reset state, controls propagation of said rearward pulse by said rearward-pulse delay line, a state-holding circuit control device which generates control signals to set said first time according to the rearward pulse outputted from said rearward-pulse delay line, and a forward-pulse adjusting device to adjust the pulse width of said forward pulse corresponding to the rearward pulse outputted from said rearward-pulse delay line and said forward pulse.

9. A clock control circuit according to claim 8, wherein said state-holding circuit control device outputs to said state-holding device control signals to set said state-holding device to the reset state after the output of said rearward pulse from said rearward-pulse delay line is finished, and said forward-pulse adjusting device elongates the pulse width of said forward pulse until the reset operation by said control signal ends.

10. A clock control circuit according to claim 9, wherein said forward-pulse adjusting device elongates the pulse width of said forward pulse when said rearward pulse is being outputted from said rearward-pulse delay line at the rising of said first clock signal, and when said forward pulse is being inputted to said forward-pulse delay line while said rearward pulse is being outputted from said rearward-pulse delay line.

11. An apparatus including a device which uses an internal clock signal synchronized to an external clock signal, comprising:

a first device which operates corresponding to said external clock signal, a transmission line to transmit data, a clock control circuit having a forward-pulse delay line which is configured by cascading a plurality of stages of forward-pulse delay circuits to propagate an inputted signal with a first predetermined delay time so as to delay said inputted signal, and delays forward pulse corresponding to a second clock signal obtained by delaying by a first delay time a first clock signal, which is obtained by delaying said external clock signal, by a second delay time corresponding to the difference between the period of said first clock signal and said first delay time, a rearward-pulse delay line configured by cascading a plurality of stages of rearward-pulse delay circuit to propagate said inputted signal with a second predetermined delay time so as to delay said inputted signal, and, by being set to a reset state of a first rearward-pulse generation stage that is a stage corresponding to a first forward-pulse arrival stage that is the stage where said forward pulse is propagated after said second delay time from the start of propagation of said forward pulse by said forward-pulse delay line and also by being set to a set state of each of the first stage up to the preceding stage of said first rearward-pulse generation stage, propagates rearward pulse, which is generated in said first rearward-pulse generation stage in the reset state by taking in said first clock signal selectively, by each of said stages in the set state and outputs said rearward pulse from the first stage, a state-holding device which is configured with a number of stages corresponding to the number of stages of said forward-pulse delay line and rearward-pulse delay line, and, by turning a first state-holding stage that is a stage corresponding to a second forward-pulse arrival stage that is the stage where said forward pulse is propagated during a one polarity pulse duration of said first clock signal to the set state and also by turning a plurality of second state-holding stages corresponding to a plurality of rearward-pulse propagation stages where said rearward pulse is propagated only for a predetermined time from the edge of said first clock signal to the reset state, controls propagation of said rearward pulse by said rearward-pulse delay line, a state-holding circuit initializing device to initialize said state-holding device to the reset state when said state-holding circuit initializing device detects that said first clock signal is not generated, and an output device to output said internal clock signal obtained by delaying said rearward pulse by a third delay time, and a second device to perform predetermined processes using said internal clock signal and to transmit the processed result to said transmission line.

12. An apparatus according to claim 11, wherein said second device is a synchronous type memory.

13. An apparatus according to claim 11, wherein said second device is a logic circuit to perform a predetermined operation.

14. An apparatus including a device which uses an internal clock signal synchronized to an external clock signal, comprising:

a first device which operates corresponding to said external clock signal, a transmission line to transmit data, a clock control circuit having a forward-pulse delay line which is configured by cascading a plurality of stages of forward-pulse delay circuits to propagate an inputted signal with a first predetermined delay time so as to delay said inputted signal, and delays forward pulse corresponding to a second clock signal obtained by delaying by a first delay time a first clock signal, which is obtained by delaying said external clock signal, by a second delay time during a one polarity pulse duration of said first clock signal, a rearward-pulse delay line configured by cascading a plurality of stages of rearward-pulse delay circuit to propagate inputted signal with a second predetermined delay time so as to delay said inputted signal, and, by being set to a reset state of a first rearward-pulse generation stage that is a stage corresponding to a first forward-pulse arrival stage that is the stage where said forward pulse is propagated after said second delay time and also by being set a set state of each of the first stage up to the preceding stage of said first rearward-pulse generation stage, propagates rearward pulse, which is generated in said first rearward-pulse generation stage in the reset state by taking in said first clock signal selectively, by each of said stages in the set state and outputs said rearward pulse from the first stage, a state-holding device which is configured with a number of stages corresponding to the number of stages of said forward-pulse delay line and rearward-pulse delay line, and, by turning a first state-holding stage that is a stage corresponding to a second forward-pulse arrival stage that is the stage where said forward pulse is propagated during the one polarity pulse duration of said first clock signal to the set state and also by turning a plurality of second state-holding stages corresponding to a plurality of rearward-pulse propagation stages where said rearward pulse is propagated only for a predetermined time from the edge of said first clock signal to the reset state, controls propagation of said rearward pulse by said rearward-pulse delay line, a state-holding circuit control device to generate control signals to set said first time corresponding to rearward pulse outputting from said rearward-pulse delay line, and an output device to output said internal clock signal obtained by delaying said rearward pulse by a third delay time, and a second device to perform predetermined processes using said internal clock signal and to transmit the processed result to said transmission line.

15. An apparatus according to claim 14, wherein said second device is a synchronous type memory.

16. An apparatus according to claim 14, wherein said second device is a logic circuit to perform a predetermined operation.

17. An apparatus including a device which uses an internal clock signal synchronized to an external clock signal, comprising:

a first device which operates corresponding to said external clock signal, a transmission line to transmit data, a clock control circuit having a forward-pulse delay line which is configured by cascading a plurality of stages of forward-pulse delay circuits to propagate an inputted signal with a first predetermined delay time so as to delay said inputted signal, and delays forward pulse corresponding to a second clock signal obtained by delaying by a first delay time a first clock signal, which is obtained by delaying said external clock signal, by a second delay time during a one polarity pulse duration of said first clock signal, a rearward-pulse delay line configured by cascading a plurality of stages of rearward-pulse delay circuit to propagate inputted signal with a second predetermined delay time so as to delay said inputted signal, and, by being set to a reset state of a first rearward-pulse generation stage that is a stage corresponding to a first forward-pulse arrival stage that is the stage where said forward pulse is propagated after said second delay time and also by being set to a set state of each of the first stage up to the preceding stage of said first rearward-pulse generation stage, propagates rearward pulse, which is generated in said first rearward-pulse generation stage in the reset state by taking in said first clock signal selectively, by each of said stages in the set state and outputs said rearward pulse from the first stage, a state-holding device which is configured with a number of stages corresponding to the number of stages of said forward-pulse delay line and rearward-pulse delay line, and, by turning a first state-holding stage that is a stage corresponding to a second forward-pulse arrival stage that is the stage where said forward pulse is propagated during the one polarity pulse duration of said first clock signal to the set state and also by turning a plurality of second state-holding stages corresponding to a plurality of rearward-pulse propagation stages where said rearward pulse is propagated only for a predetermined time from the edge of said first clock signal to the reset state, controls propagation of said rearward pulse by said rearward-pulse delay line, a state-holding control device to generate control signals to set said first time corresponding to rearward pulse outputting from said rearward-pulse delay line, a forward-pulse adjusting device to adjust the width of said forward pulse corresponding to the rearward pulse generated from said rearward-pulse delay line and said forward pulse, and an output device to output said internal clock signal obtained by delaying said rearward pulse by a third delay time, and a second device to perform predetermined processes using said internal clock signal and to transmit the processed result to said transmission line.

18. An apparatus according to claim 17, wherein said second device is a synchronous type memory.

19. An apparatus according to claim 17, wherein said second device is a logic circuit to perform a predetermined operation.

20. A clock control circuit, comprising:
- a forward-pulse delay line, which is configured by cascading a plurality of stages of forward-pulse delay circuits to propagate an inputted signal with a predetermined first delay time so as to delay said inputted signal, to propagate a forward pulse generated in correspondence with a first clock signal which is obtained by delaying an external clock signal so as to delay said forward pulse,
- a rearward-pulse delay line, which is configured by cascading a plurality of stages of rearward-pulse delay circuits to propagate an inputted signal with a predetermined second delay time so as to delay said inputted signal, to propagate a rearward pulse so as to delay said rearward pulse,
- a state-holding device to propagate said rearward pulse in said rearward-pulse delay line by stages corresponding to stages by which said forward pulse has propagated in said forward-pulse delay line, and
- a state-holding circuit initializing device which initializes said state-holding device to a reset state when said state-holding circuit initializing device detects that said first clock signal is not generated.

21. A clock control circuit, comprising:
- a forward-pulse delay line, which is configured by cascading a plurality of forward-pulse delay circuits, controlled by a first control signal, to propagate a forward pulse generated in correspondence with a first clock signal,
- a rearward-pulse delay line, which is configured by cascading a plurality of rearward-pulse delay circuits provided in correspondence with said plurality of forward-pulse delay circuits of said forward-pulse delay line, to propagate a rearward pulse in said rearward-pulse delay line by stages corresponding to stages by which said forward pulse has propagated in said forward-pulse delay line to be outputted,
- a state-holding device connected to said forward-pulse delay line and said rearward-pulse delay line, controlled by said first control signal, to turn stages of said state-holding device corresponding to stages by which said forward pulse has propagated to a set state, and also turn stages of said state-holding device corresponding to stages by which said rearward pulse has propagated to a reset state, and
- a state-holding circuit initializing device which initializes said state-holding device to the reset state,
- wherein a rearward-pulse delay circuit which is nearest the output side among the rearward-pulse delay circuits connected to the state-holding device which has been turned to the reset state generates said rearward pulse in correspondence with said first clock.

22. A clock control circuit according to claim 21, wherein said state-holding circuit initializing device initializes said state-holding device to the reset state when said state-holding circuit initializing device detects that said first clock is not generated.

23. A clock control circuit, comprising:
- a forward-pulse delay line, which is configured by cascading a plurality of forward-pulse delay circuits, controlled by a first control signal, to propagate a forward pulse generated in correspondence with a first clock signal,
- a rearward-pulse delay line, which is configured by cascading a plurality of rearward-pulse delay circuits provided in correspondence with said plurality of forward-pulse delay circuits of said forward-pulse delay line, to propagate a rearward pulse in said rearward-pulse delay line by stages corresponding to stages by which said forward pulse has propagated in said forward-pulse delay line to be outputted,
- a state-holding device connected to said forward-pulse delay line and said rearward-pulse delay line, controlled by a second control signal which is generated in correspondence with said first control signal, to turn stages of said state-holding device corresponding to stages by which said forward pulse has propagated to the set state, and also turn stages of said state-holding device corresponding to stages by which said rearward pulse has propagated to the reset state, and
- a state-holding circuit control device which generates control signals to set a first time corresponding to the rearward pulse outputted from said rearward-pulse delay line,
- wherein a rearward-pulse delay circuit which is nearest the output side among the rearward-pulse delay circuits connected to the state-holding device which have been turned to the reset state generates said rearward pulse in correspondence with said first clock.

24. A clock control circuit, comprising:
- a forward-pulse delay line, which is configured by cascading a plurality of forward-pulse delay circuits, controlled by a first control signal, to propagate a forward pulse generated in correspondence with a first clock signal,
- a rearward-pulse delay line, which is configured by cascading a plurality of rearward-pulse delay circuits provided in correspondence with said plurality of forward-pulse delay circuits of said forward-pulse delay line, to propagate a rearward pulse in said rearward-pulse delay line by stages corresponding to stages by which said forward pulse has propagated in said forward-pulse delay line to be outputted,
- a state-holding device connected to said forward-pulse delay line and said rearward-pulse delay line, controlled by a second control signal which is generated in correspondence with said first control signal, to turn stages of said state-holding device corresponding to stages by which said forward pulse has propagated to the a state, and also turn stages of said state-holding device corresponding to stages by which said rearward pulse has propagated to a reset state,
- a state-holding circuit control device which generates control signals to set a first time corresponding to the rearward pulse outputted from said rearward-pulse delay line, and
- a forward-pulse adjusting device to adjust the pulse width of said forward pulse corresponding to the rearward pulse outputted from said rearward-pulse delay line and said forward pulse,
- wherein a rearward-pulse delay circuit which is nearest the output side among the rearward-pulse delay circuits connected to the state-holding device which have been turned to the reset state generates said rearward pulse in correspondence with said first clock.

* * * * *